US010540017B2

(12) United States Patent
Goto et al.

(10) Patent No.: US 10,540,017 B2
(45) Date of Patent: Jan. 21, 2020

(54) METHOD AND APPARATUS FOR CONTROLLING AN INPUT DEVICE

(71) Applicant: Sony Corporation, Tokyo (JP)

(72) Inventors: Tetsuro Goto, Tokyo (JP); Hiroto Kawaguchi, Kanagawa (JP); Takashi Itaya, Kanagawa (JP); Toshio Kano, Kanagawa (JP); Akira Ebisui, Kanagawa (JP)

(73) Assignee: Sony Corporation, Tokyo (JP)

( * ) Notice: Subject to any disclaimer, the term of this patent is extended or adjusted under 35 U.S.C. 154(b) by 603 days.

(21) Appl. No.: 14/640,165

(22) Filed: Mar. 6, 2015

(65) Prior Publication Data
US 2015/0261309 A1 Sep. 17, 2015

(30) Foreign Application Priority Data
Mar. 14, 2014 (JP) ................... 2014-052615

(51) Int. Cl.
G06F 3/023 (2006.01)
G06F 3/044 (2006.01)

(52) U.S. Cl.
CPC .............. *G06F 3/023* (2013.01); *G06F 3/044* (2013.01)

(58) Field of Classification Search
None
See application file for complete search history.

(56) References Cited

U.S. PATENT DOCUMENTS

| 5,936,537 | A | * | 8/1999 | Burns | G01R 21/01 324/627 |
| 6,970,034 | B1 | * | 11/2005 | Harris | H03K 19/0016 327/534 |
| 8,040,142 | B1 | * | 10/2011 | Bokma | H03K 17/955 324/658 |
| 9,851,834 | B2 | * | 12/2017 | Caldwell | G06F 3/0416 |
| 2004/0008129 | A1 | * | 1/2004 | Philipp | G06F 3/0237 341/22 |

(Continued)

FOREIGN PATENT DOCUMENTS

JP 59-119621 A 7/1984
JP 2009-141819 A 6/2009
(Continued)

*Primary Examiner* — Dorothy Harris
(74) *Attorney, Agent, or Firm* — Wolf, Greenfield & Sacks, P.C.

(57) ABSTRACT

There is provided an information processing device including a capacitance variation detection unit configured to detect an operation input to each of a plurality of key regions as a capacitance variation amount of a capacitive element, the key region being provided on a sheet-like operation member, the capacitive element being provided in association with each of the key regions, the capacitance variation amount being dependent on a change in a distance between the key region and the capacitive element, and an input state determination unit configured to determine whether an input state of the key region is an ON state based on the detected capacitance variation amount, the ON state being a state in which the operation input to the key region is decided to be valid. The input state determination unit determines an end of the ON state based on a differential value of the capacitance variation amount.

5 Claims, 29 Drawing Sheets

(56) References Cited

U.S. PATENT DOCUMENTS

| | | | |
|---|---|---|---|
| 2007/0019898 A1* | 1/2007 | Chimenti | G01L 1/246 385/12 |
| 2009/0128374 A1* | 5/2009 | Reynolds | G06F 3/0202 341/33 |
| 2009/0140985 A1* | 6/2009 | Liu | G06F 3/011 345/168 |
| 2011/0157069 A1* | 6/2011 | Zhuang | G06F 3/044 345/174 |
| 2011/0227872 A1* | 9/2011 | Huska | G06F 3/016 345/174 |
| 2012/0056848 A1 | 3/2012 | Yamano et al. | |
| 2012/0068760 A1* | 3/2012 | Caldwell | G06F 3/0418 327/517 |
| 2012/0228111 A1* | 9/2012 | Peterson | H03K 17/962 200/600 |
| 2013/0228023 A1* | 9/2013 | Drasnin | G06F 1/1618 73/862.541 |
| 2013/0249849 A1* | 9/2013 | Wong | G06F 1/3231 345/174 |
| 2014/0253454 A1* | 9/2014 | Caldwell | G06F 3/0219 345/168 |
| 2016/0041648 A1* | 2/2016 | Richards | G01L 25/00 345/174 |

FOREIGN PATENT DOCUMENTS

| | | |
|---|---|---|
| JP | 2010-152685 A | 7/2010 |
| JP | 2011-154564 A | 8/2011 |
| JP | 2011-154645 A | 8/2011 |
| JP | 2012-053754 A | 3/2012 |
| JP | 2012-098827 A | 5/2012 |

* cited by examiner

METHOD AND APPARATUS FOR CONTROLLING AN INPUT DEVICE

CROSS REFERENCE TO RELATED APPLICATIONS

This application claims the benefit of Japanese Priority Patent Application JP 2014-052615 filed Mar. 14, 2014, the entire contents of which are incorporated herein by reference.

BACKGROUND

The present disclosure relates to an information processing device, an input device, an information processing method, and a program.

A keyboard is commonly used as an input device for an information processing device, such as personal computers (PCs). Nowadays a touch panel that is used as a thin keyboard is spreading widely. In the keyboard that employs a touch panel, a GUI component corresponding to each key arranged on the keyboard is displayed on a display surface of the touch panel on which the user can select one or more displayed keys, and thus information associated with the selected key is inputted to the information processing device.

In the keyboard using a touch panel, a key is inputted by touching the touch panel with an operating object such as the user's finger, and thus unintended contact of the operating object with the touch panel will be detected and an erroneous key input may be occurred. To prevent such an erroneous input (erroneous detection) to the touch panel, the user is typically necessary to keep the finger away from the touch panel as long as there is no key input, resulting in a cause of low degree of usability. A large number of techniques have been developed to prevent an erroneous input (erroneous detection) to a touch panel.

For example, JP 2009-141819A discloses a technique that detects an operation input when a voltage value is more than or equal to a predetermined threshold and a differential value is limited within a predetermined range over a predetermined time of period in an electrostatic capacitive touch sensor device provided in in-vehicle equipment. The voltage value represents the presence or absence of an operation (contact) on a touch sensor. The differential value indicates a time variation of the voltage value. JP 2011-154645A and JP 2011-154564A disclose a technique for using a keyboard using an electrostatic capacitive touch panel, which is provided with a load sensor for detecting a load imposed on an electrostatic capacitive touch panel to determine the presence or absence of an operation input. The determination is performed depending on the magnitude of the load, the position at which the load is detected, and the time at which the load more than or equal to a predetermined threshold is detected, which are detected by the load sensor. According to the techniques disclosed in JP 2009-141819A, JP 2011-154645A, and JP 2011-154564A, the operation input is detected only when the physical quantity representing the intensity of the contact of an operation object on the touch panel (touch sensor) satisfies a predetermined condition, and thus erroneous detection of unintended operation input may be prevented.

SUMMARY

The technique disclosed in JP 2009-141819A provides a touch sensor device installed in in-vehicle equipment, thus it does not consider the use that necessitates continuous and quick selection of a plurality of keys, like a keyboard. If the technique disclosed in JP 2009-141819A is applied to a keyboard without any modification, an erroneous detection of key input may not be prevented. The techniques disclosed in JP 2011-154645A and JP 2011-154564A are necessary to provide a load sensor, which leads to an increase in structure size, and thus it is difficult to make a keyboard further thinner.

In view of the above circumstances, it is desirable to provide a keyboard capable of obtaining a high degree of usability with a more simple structure. Therefore, according to an embodiment of the present disclosure, there is provided a novel and improved information processing device, input device, information processing method, and program, capable of achieving a high degree of usability.

According to an embodiment of the present disclosure, there is provided an information processing device including a capacitance variation detection unit configured to detect an operation input to each of a plurality of key regions as a capacitance variation amount of a capacitive element, the key region being provided on a sheet-like operation member, the capacitive element being provided in association with each of the key regions, the capacitance variation amount being dependent on a change in a distance between the key region and the capacitive element, and an input state determination unit configured to determine whether an input state of the key region is an ON state based on the detected capacitance variation amount, the ON state being a state in which the operation input to the key region is decided to be valid. The input state determination unit determines an end of the ON state based on a differential value of the capacitance variation amount.

According to another embodiment of the present disclosure, there is provided an information processing device including a capacitance variation detection unit configured to detect an operation input to each of a plurality of key regions as a capacitance variation amount of a capacitive element, the key region being provided on a sheet-like operation member, the capacitive element being provided in association with each of the key regions, the capacitance variation amount being dependent on a change in a distance between the key region and the capacitive element, and an input state determination unit configured to determine whether an input state of the key region is an ON state based on the detected capacitance variation amount, the ON state being a state in which the operation input to the key region is decided to be valid. The input state determination unit determines that the input state of the key region is the ON state when a differential value of the capacitance variation amount is more than or equal to a first threshold or when the differential value is greater than the first threshold regardless of a magnitude of the capacitance variation amount.

According to still another embodiment of the present disclosure, there is provided an information processing device including a capacitance variation detection unit configured to detect an operation input to each of a plurality of key regions as a capacitance variation amount of a capacitive element, the key region being provided on a sheet-like operation member, the capacitive element being provided in association with each of the key regions, the capacitance variation amount being dependent on a change in a distance between the key region and the capacitive element, and an input state determination unit configured to determine whether an input state of the key region is an ON state based on the detected capacitance variation amount, the ON state being a state in which the operation input to the key region is decided to be valid. The input state determination unit determines the input state of the key region provided with a plurality of the capacitive elements by comparing a normalized capacitance variation amount obtained by normalizing the capacitance variation amount of each of the plurality of capacitive elements provided in the key region with a first threshold.

According to yet another embodiment of the present disclosure, there is provided an information processing device including a capacitance variation detection unit configured to detect an operation input to each of a plurality of key regions as a capacitance variation amount of a capacitive element, the key region being provided on a sheet-like operation member, the capacitive element being provided in association with each of the key regions, the capacitance variation amount being dependent on a change in a distance between the key region and the capacitive element, and an input state determination unit configured to determine whether an input state of the key region is an ON state based on the detected capacitance variation amount, the ON state being a state in which the operation input to the key region is decided to be valid. The input state determination unit changes a condition for determining the input state depending on the operation input to the key region.

According to a further embodiment of the present disclosure, there is provided an input device including a sheet-like operation member that includes a plurality of key regions and is deformable depending on an operation input to the key region, an electrode board that includes at least one capacitive element at a position corresponding to each of the key regions and is capable of detecting an amount of change in a distance between the key region and the capacitive element as a capacitance variance amount of the capacitive element, the amount of change being dependent on the operation input, and a controller configured to determine whether an input state of the key region is an ON state based on the detected capacitance variation amount, the ON state being a state in which the operation input to the key region is decided to be valid. The controller determines an end of the ON state based on a differential value of the capacitance variation amount.

According to a still further embodiment of the present disclosure, there is provided an information processing method including detecting, by a processor, an operation input to each of a plurality of key regions as a capacitance variation amount of a capacitive element, the key region being provided on a sheet-like operation member, the capacitive element being provided in association with each of the key regions, the capacitance variation amount being dependent on a change in a distance between the key region and the capacitive element, and determining, by a processor, whether an input state of the key region is an ON state based on the detected capacitance variation amount, the ON state being a state in which the operation input to the key region is decided to be valid. An end of the ON state is determined based on a differential value of the capacitance variation amount.

According to a yet further embodiment of the present disclosure, there is provided a program for causing a processor of a computer to execute the functions of detecting an operation input to each of a plurality of key regions as a capacitance variation amount of a capacitive element, the key region being provided on a sheet-like operation member, the capacitive element being provided in association with each of the key regions, the capacitance variation amount being dependent on a change in a distance between the key region and the capacitive element, and determining whether an input state of the key region is an ON state based on the detected capacitance variation amount, the ON state being a state in which the operation input to the key region is decided to be valid. An end of the ON state is determined based on a differential value of the capacitance variation amount.

According to one or more embodiments of the present disclosure, the end of the ON state is determined based on the differential value of the capacitance variation amount, and thus it is possible to determine the input state of a key in accordance with the user's actual operation, thereby improving the usability.

As described above, according to one or more embodiments of the present disclosure, it is possible to achieve a high degree of usability. Note that the advantages described above are not necessarily intended to be restrictive, and any other advantages described herein and other advantages that will be understood from the present disclosure may be achievable, in addition to or as an alternative to the advantages described above.

DETAILED DESCRIPTION OF THE EMBODIMENT(S)

Figure 1:
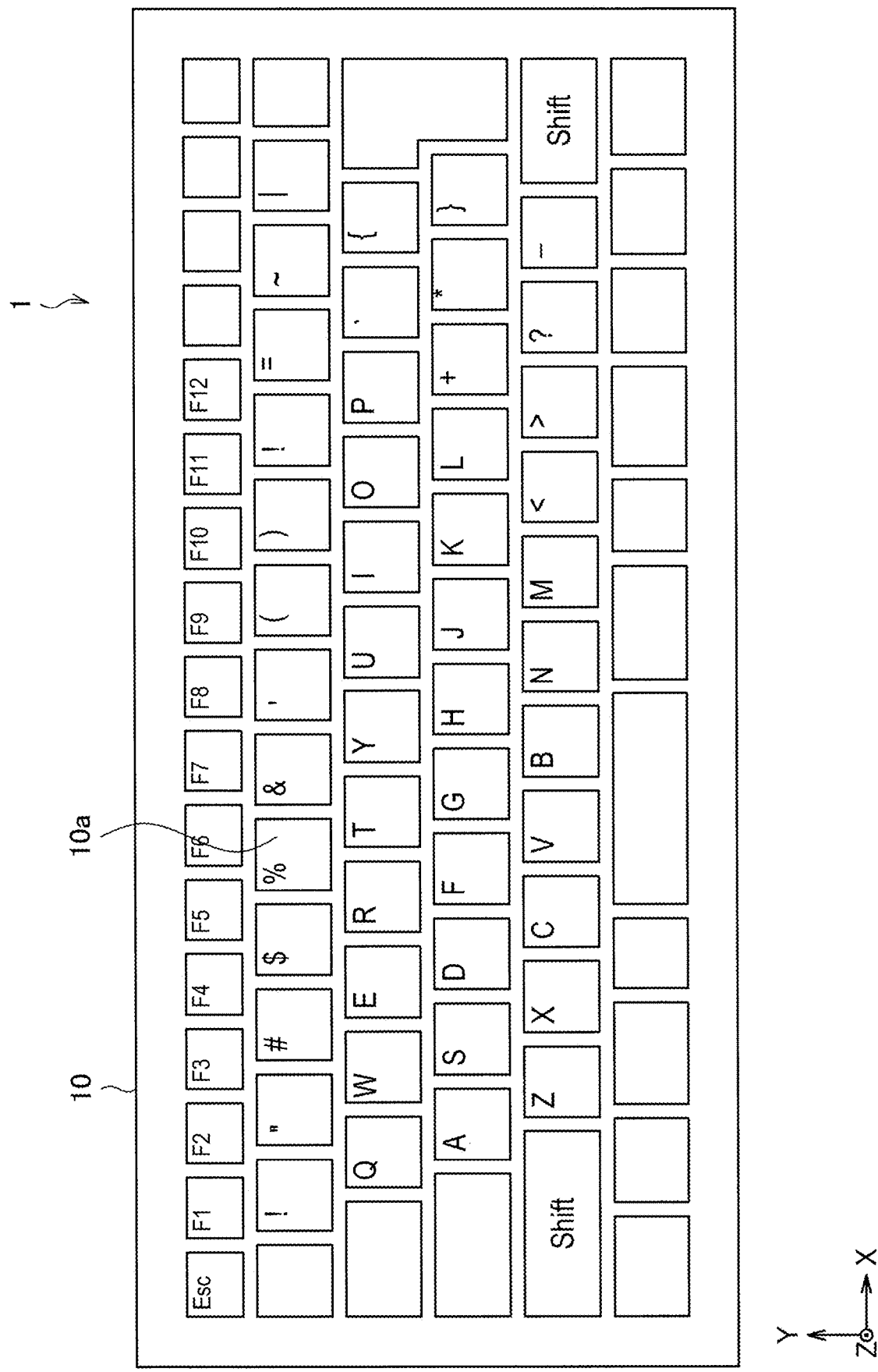
FIG. 1 is a top view illustrating a schematic configuration of an input device according to an embodiment of the present disclosure.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

The description will be given in the order of following items.

1. Configuration of Input Device
2. Configuration of Input Detection System
2-1. Hardware Configuration
2-2. Functional Configuration
3. Information Processing Method (Input Detection Method)
4. First Embodiment (KEY OFF Detection Process)
4-1. Background leading to First Embodiment
4-2. Detailed Description of KEY OFF Detection Process
4-3. Reduction in Chattering
5. Second Embodiment (KEY ON Detection Process)
5-1. Background leading to Second Embodiment
5-2. Detailed Description of KEY ON Detection Process
5-3. Combination of KEY OFF Detection Process and KEY ON Detection Process
6. Third Embodiment (Normalized Delta Value Determination Process)
6-1. Background leading to Third Embodiment
6-2. Detailed Description of Normalized Delta Value Determination Process (NOM-SUM Determination Process)
7. Fourth Embodiment (Erroneous Detection Prevention Process)
7-1. First Push Protect
7-2. Pre Sense Protect
8. Supplement In one preferred embodiment of the present disclosure, an electrostatic capacitive keyboard is used as an input device. The electrostatic capacitive keyboard detects an operation input (that is, an amount of pressing force to an operation object such as fingers) to each of a plurality of key regions provided on a sheet-like operation member by the capacitance variation amount of capacitive elements that are arranged in association with respective key regions. In item 1 "Configuration of Input Device", a description will be given of the configuration of an input device according to one preferred embodiment of the present disclosure. Then, in item 2 "Configuration of Input Detection System", a description will be given of the configuration of an input detection system for detection of a key input in the input device according to an embodiment of the present disclosure. Next, in item 3 "Information Processing Method" (Input Detection Method), a description will be given of the information processing method to detect an input key by the input detection system. In the input detection system, it is determined whether a key is inputted by determining an input state (two states, one is a state in which an operation input is determined to be valid [KEY ON state] and another is a state in which an operation input is determined to be invalid [KEY OFF state]) for each key. Information associated with the key determined to be in the KEY ON state is transmitted to the information processing device to which the input device is connected (hereinafter, this information processing device is also referred to as "host device"), and the information is inputted to the host device.

An embodiment of the present disclosure is characterized by the process of detecting an input state (input state determination process), which is preferably performed in a process of detecting a key input. In item 4 "First Embodiment" (KEY OFF detection process) and item 6 "Fourth Embodiment" (Erroneous Detection Prevention Process), several embodiments related to the input state determination process in the input detection system according to an embodiment of the present disclosure will be described. In an embodiment of the present disclosure, the input state determination process according to these embodiments is performed independently or in combination with each other, and thus the accuracy of key input detection is improved, resulting in the achievement of a high degree of usability.

More specifically, in item 4 "First Embodiment" (KEY OFF Detection Process), a description will be given of the process of detecting the above-mentioned KEY OFF state (hereinafter, referred also to as "KEY OFF detection process"). In item 5 "Second Embodiment" (KEY ON Detection Process), a description will be given of the process of detecting the above-mentioned KEY ON state (hereinafter, referred also to as "KEY ON detection process"). In item 6 "Third Embodiment" (Normalized Delta Value Determination Process), a description will be given of an example of a process to improve the accuracy of key input detection in a case where a plurality of capacitive elements are provided in a single key region. In item 7 "Fourth Embodiment" (Erroneous Detection Prevention Process), a description will be given of a process to prevent erroneous detection of a key input (hereinafter, referred also to as "erroneous detection prevention process) corresponding to a particular situation that can be assumed when the input device is used. The process, which will be described in the first, second, third, and fourth embodiments, may be performed independently or may be performed in any combination of them within an allowable range.

1. Configuration of Input Device

Figure 2:
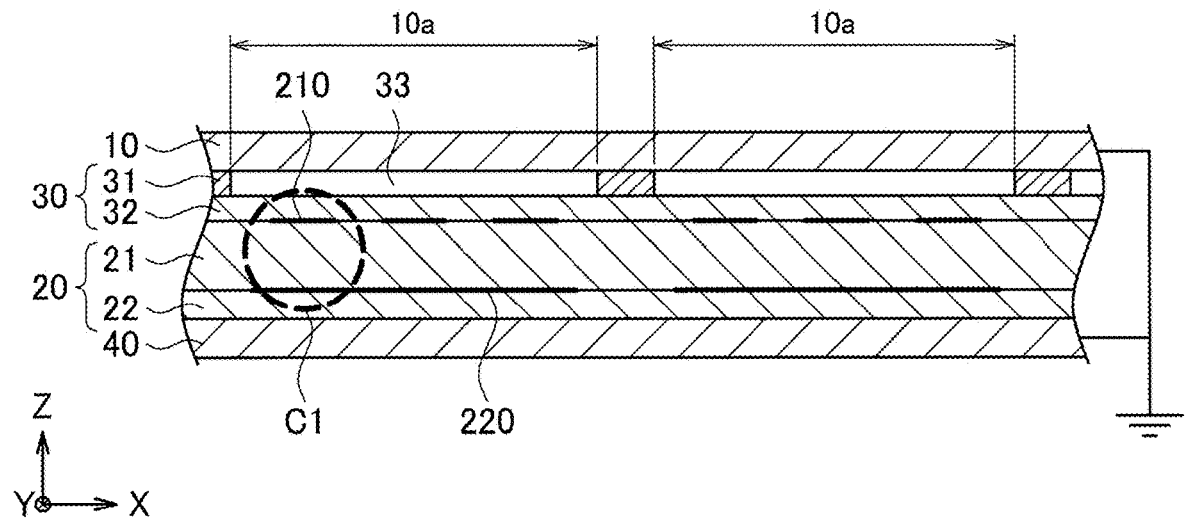
FIG. 2 is a schematic cross-sectional view of the input device shown in FIG. 1.
Figure 3:
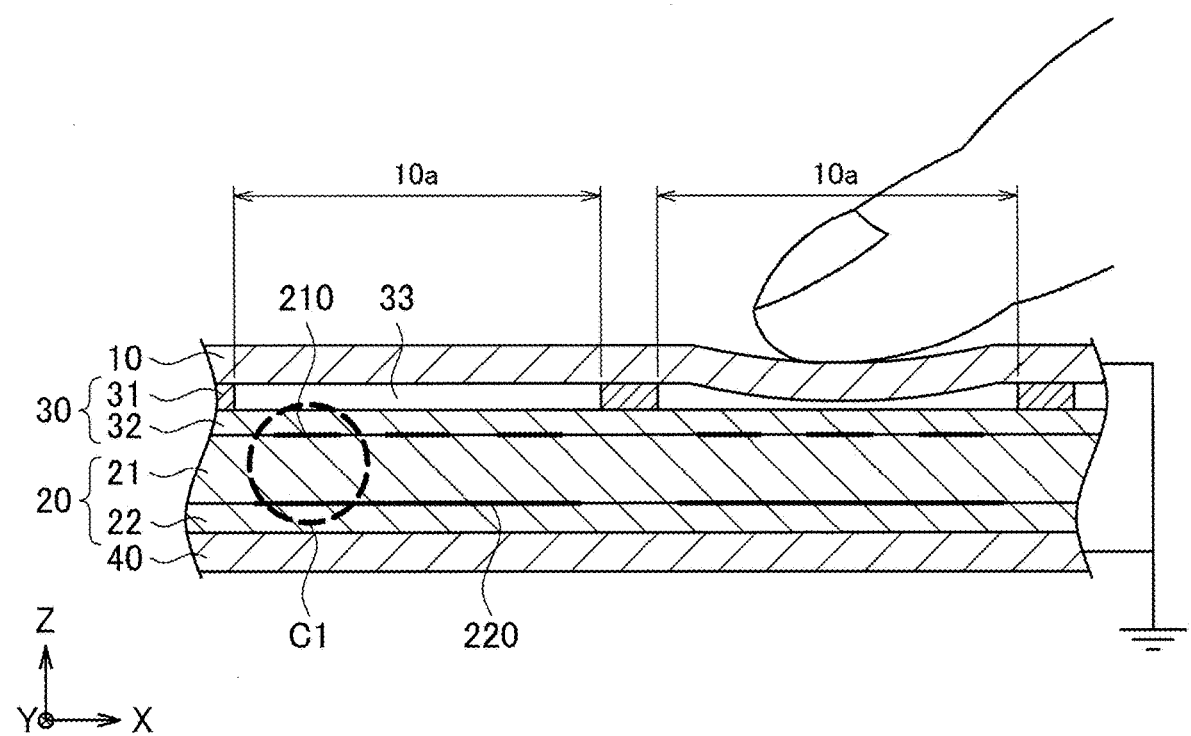
FIG. 3 is an explanatory diagram illustrated to describe the operation when a key is inputted to the input device according to an embodiment of the present disclosure.

The configuration of an input device according to one preferred embodiment of the present disclosure will be described with reference to FIGS. 1 to 3. FIG. 1 is a top view illustrating a schematic configuration of an input device according to an embodiment of the present disclosure. FIG. 2 is a schematic cross-sectional view of the input device shown in FIG. 1. FIG. 3 is an explanatory diagram illustrated to describe the operation when a key is inputted to the input device according to an embodiment of the present disclosure.

Referring to FIGS. 1 and 2, the input device 1 according to an embodiment of the present disclosure is configured to include a shield layer 40, an electrode board 20, a support 30, and an operation member 10, which are stacked on one another in this order. The input device 1 is used, for example, as a keyboard of a host device such as PCs. In the following, there will be described a case of the selection of a key with the finger that is an example of an operation object, which can be most commonly used as an operation input to a keyboard. However, the selection of a key may be performed using other parts of the user's body or tools such as a stylus.

In the following description, two directions perpendicular to each other in a plane of the input device 1 are defined as the X-axis direction and Y-axis direction. The direction in which the components in the input device 1 are stacked (depthwise direction) is defined as the Z-axis direction. The positive direction of the Z-axis (direction in which the operation member 10 is disposed) is also referred to as upward or surface direction, and the negative direction of the Z-axis is also referred to as downward or back direction. FIGS. 2 and 3 correspond to cross-sectional views taken along the X-Z plane in the input device 1.

Operation Member

The operation member 10 is a sheet-like member that is disposed on the front surface (upper surface) of the input device 1. The operation member 10 includes a plurality of key regions 10a formed thereon. The key region corresponds to individual keys in the keyboard. The operation member 10 is made of conductive metal materials such as copper (Cu) and aluminum (Al), and is connected to the ground potential. Materials of the operation member 10 are not limited to such examples, and any other conductive materials may be used as a material for the operation member 10.

The operation member 10 has a thickness of, for example, several tens to several hundreds of micrometers. The operation member 10 is configured to be deformable toward the electrode board 20 by the operation input to the key region 10a (that is, the pressing to the key region 10a with the user's finger) as shown in FIG. 3. The thickness of the operation member 10 is not limited to such examples, and may be appropriately set in consideration of the user's feeling when pressing the key region 10a (feeling through a keystroke), the accuracy of key input detection, or other considerations.

The key region 10a corresponds to a key that is pressed (stroked) by the user and the key region 10a has a shape and size depending to the type of keys. The key region 10a may have individual key marks in an appropriate manner. The key marks may indicate a type of keys, a position (contour) of each key, or a combination of two. The key may be marked using a suitable printing method, such as screen, flexographic, and gravure printings. In the following description, when it is intended to represent a case in which an operation input is performed on the key region 10a, the key region 10a is often referred to as simply "key". For example, the phrase "pressing a key" in the input device 1 as used herein may indicate that the "key region 10a is pressed".

The operation member 10 may be configured to further include a flexible insulating plastic sheet that is stacked on the conductive layer made of conductive materials described above. An example of the flexible insulting plastic sheet includes PET (polyethylene terephthalate), PEN (polyethylene naphthalate), PMMA (polymethyl methacrylate), PC (polycarbonate), and PI (polyimide). In this case, the key mark corresponding to each key is printed on the surface of the plastic sheet. When the plastic sheet is stacked on the conductive layer, the conductive layer and the plastic sheet may compose a composite sheet obtained by previously bonding a film of the conductive layer to a surface of a resin sheet. The operation member 10 may be configured by forming the conductive layer formed on the surface of the plastic sheet by vapor deposition or sputtering, or it may be configured by printing a coating film, such as conductive paste, on the surface of the plastic sheet.

Shield Layer

The shield layer 40 is a sheet-like member that is disposed on the back surface of the input device 1. In the input device 1, the electrode board 20 and the support 30 are held between the shield layer 40 and the operation member 10. The shield layer 40 is made of conductive metal materials such as copper and aluminum, and is connected to the ground potential, which is similar to the operation member 10. Materials of the shield layer 40 are not limited to such examples, and any other conductive materials may be used as a material for the shield layer 40. The shield layer 40 is used to shield electromagnetic noise coming from the outside of the input device 1. The shield layer 40 has a thickness of, but not particularly limited to, several tens to several hundreds of micrometers. The shield layer 40 may be configured to further include an insulating plastic sheet stacked thereon.

Support

The support 30 is disposed between the operation member 10 and the electrode board 20. The support 30 is configured to include a plurality of structures 31 and a substrate 32 so that the structures 31 are formed on the substrate 32.

The substrate 32 is formed of an insulating plastic sheet that is made of PET, PEN, PC and other polymer films. The substrate 32 is stacked on the electrode board 20. The substrate 32 has a thickness of, but not particularly limited to, several micrometers to several hundreds of micrometers.

The structures 31 have the same height (for example, several micrometers to several hundreds of micrometers). The structures 31 are formed on the substrate 32 to divide the key regions 10a of the operation member 10 into their particular parts. The structures 31 allow the substrate 32 to be connected to the operation member 10. The region in which the structures 31 are not formed (that is, a region corresponding to the key region 10a) defines a void space 33. With such arrangement configuration, the operation input to the key region 10a changes the distance between the operation member 10 and the electrode board 20 in at least a portion corresponding to the key region 10a being pressed (see FIG. 3).

The structures 31 are made of a material having relatively high rigidity in view of the achievement of high degree of usability (click feeling or stroke feeling) and the improvement of detection accuracy in the key region 10a, but the structures 31 may be made of a resilient material. The structures 31 are made of an electrically insulating resin material such as ultraviolet curable resin and are formed on the surface of the substrate 32 using an appropriate technique including the transfer process.

Electrode Board

The electrode board 20 has a layered structure in which a first wiring board 21 is stacked on a second wiring board 22. The first wiring board 21 has an electrode wire 210 (pulse electrode) that extends in the Y-axis direction on the surface thereof. The second wiring board 22 has an electrode wire 220 (sensing electrode) that extends in the X-axis direction on the surface thereof.

The first and second wiring boards 21 and 22 are formed of a plastic sheet made of an insulating material. For example, the first and second wiring boards 21 and 22 are formed of a plastic sheet, a glass substrate, or a glass epoxy substrate, which is made of PET, PEN, PC, PMMA or like material. The first and second wiring boards 21 and 22 have a thickness of, but not particularly limited to, several tens to several hundreds of micrometers.

The first and second electrode wires 210 and 220 are formed on the first and second wiring boards 21 and 22, respectively, by etching techniques using Al, Cu, or any other conductive metals, the printing of a metal paste such as silver (Ag), or any other forming method.

The first and second wiring boards 21 and 22 are stacked via an insulating bonding layer (not shown) such as an adhesive, an adhesive tape, or other bonding agent so that the first and second electrode wires 210 and 220 face to each other. The first and second electrode wires 210 and 220 face to each other with a layer of insulator material interposed therebetween, and thus a capacitive element is formed in an intersection region between the electrode wires 210 and 220 (hereinafter, this region is also referred to as "node"). The electrode wires 210 and 220 are substantially perpendicular to each other in their extending directions, and thus a plurality of nodes may be formed in the crossing of a single electrode wire 210 and a plurality of electrode wires 220.

Figure 4:
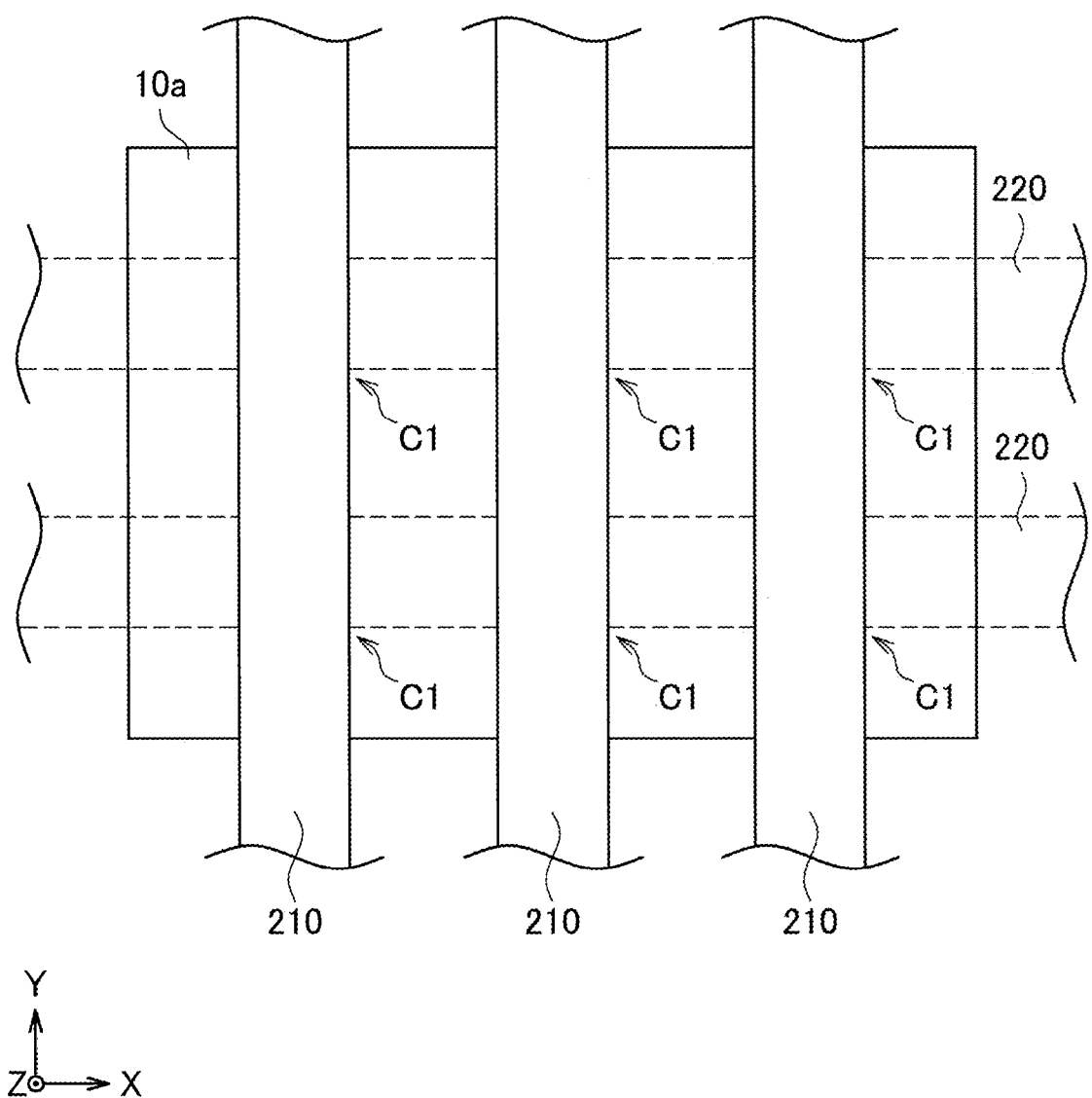
FIG. 4 is an explanatory diagram illustrated to describe a capacitive element in the input device according to an embodiment of the present disclosure.

FIG. 4 schematically illustrates how a capacitive element is formed by an overlap between the electrode wires 210 and 220. FIG. 4 is an explanatory diagram illustrated to describe a capacitive element in the input device 1 according to an embodiment of the present disclosure. FIG. 4 schematically illustrates a cross-sectional view taken along a plane corresponding to the surface of the electrode board 20 in a key region 10a.

As shown in FIG. 4, a capacitive element C1 is formed at an overlap portion between the electrode wire 220 that extends in the X-axis direction and the electrode wire 210 that extends in the Y-axis direction. In this exemplary embodiment, the electrode wires 210 and 220 are formed so that at least one capacitive element C1 may be formed in a key region 10a.

Referring to FIG. 3, a description will be given of how to detect a key input to the input device 1 according to an embodiment of the present disclosure. As shown in FIG. 3, when a key operation input is performed, a key region 10a corresponding to the key is pressed by the finger in the Z-axis direction. When the key region 10a is pressed, the distance between the operation member 10 (specifically, the conductive layer thereof) and the capacitive element C1 varies, and thus capacitance of the capacitive element C1 varies. The capacitance variation amount of the capacitive element C1 (hereinafter, also referred to as "delta value") represents the amount of change in the distance between the key region 10a and the capacitive element C1 depending on an operation input to the key region 10a. In the exemplary embodiment, the input of a key corresponding to a target node is detected based on a delta value detected at each node. The detection of a key input based on a delta value will be described in detail in item 2 "Configuration of Input Detection System", which will be described later.

In this way, in the exemplary embodiment, the key input is detected based on the capacitance variation amount of the capacitive element C1, and thus the capacitance of the capacitive element C1 in the absence of an operation input is adjusted to a predetermined value. Accordingly, the shape of the electrode wires 210 and 220 (specifically, shape of a portion [electrode portion] that may be an electrode of the capacitive element C1), and the thickness and material of the insulator located between the electrode wires 210 and 220 are set appropriately so that the capacitance of the capacitive element C1 may be a predetermined value.

In the following, the description will be given on the assumption that a delta value is a positive value, for convenience of description and better understanding of comparison between a delta value and a threshold. As described above, a delta value is a variation in capacitance of the capacitive element C1. Thus, a delta value may be calculated by subtracting the capacitance of the capacitive element C1 in the absence of an operation input (a state shown in FIG. 2) from the capacitance of the capacitive element C1 in the presence of an operation input (a state shown in FIG. 3). On the other hand, in the state shown in FIG. 3, as the distance between the key region 10a and the capacitive element C1 becomes smaller, the capacitance of the capacitive element C1 becomes smaller than the state shown in FIG. 2. In this way, a delta value obtained only from the difference between capacitance values can be a negative value. Meanwhile, in the exemplary embodiment, a delta value is set to be a positive value by appropriately changing a sign thereof. Even when a delta value is set to be a negative value, an inversion of the sign of a value, such as a threshold, to be compared with a delta value makes it possible to perform a similar process to a detection process of a key input, which will be described below.

In the example shown in FIG. 4, there are provided six capacitive elements C1 in one key region 10a (that is, there are six nodes), but an embodiment of the present disclosure is not limited to this example. Any number of nodes may be provided in one key region 10a. As described above, in an embodiment of the present disclosure, detection of a key input is performed based on the capacitance variation amount of the capacitive element C1. Thus, a plurality of capacitive elements C1 are disposed in one key region 10a, and statistics such as the sum or average value of the capacitance variation amounts of these capacitive elements C1 are used, thereby improving the accuracy of key input detection. In an embodiment of the present disclosure, the number of nodes provided in one key region 10a may be set appropriately in view of the type or arrangement of keys. For example, for a key having higher input frequency or a key that is likely to have low detection accuracy because of the position to be arranged (for example, a key located at nearly the end of the plane as compared with other keys), more nodes are provided, and thus the accuracy of key input detection can be improved.

In the example shown in FIG. 4, for simplicity purposes, the electrode wires 210 and 220 are substantially linear in shape, and a portion corresponding to an electrode constituting the capacitive element C1 is substantially rectangular in shape, but the present embodiment is not limited to this example. For example, the electrode wires 210 and 220 may include an electrode portion having a predetermined area and shape, such as annular shape or a diamond shape, in a region to be provided with the capacitive element C1. The electrode portions may be connected in series in the X-axis or Y-axis direction. The shape of the electrode wires 210 and 220 is appropriately set and the shape of the electrode portion is adjusted, and thus the accuracy of delta value detection can be improved.

Figure 5:
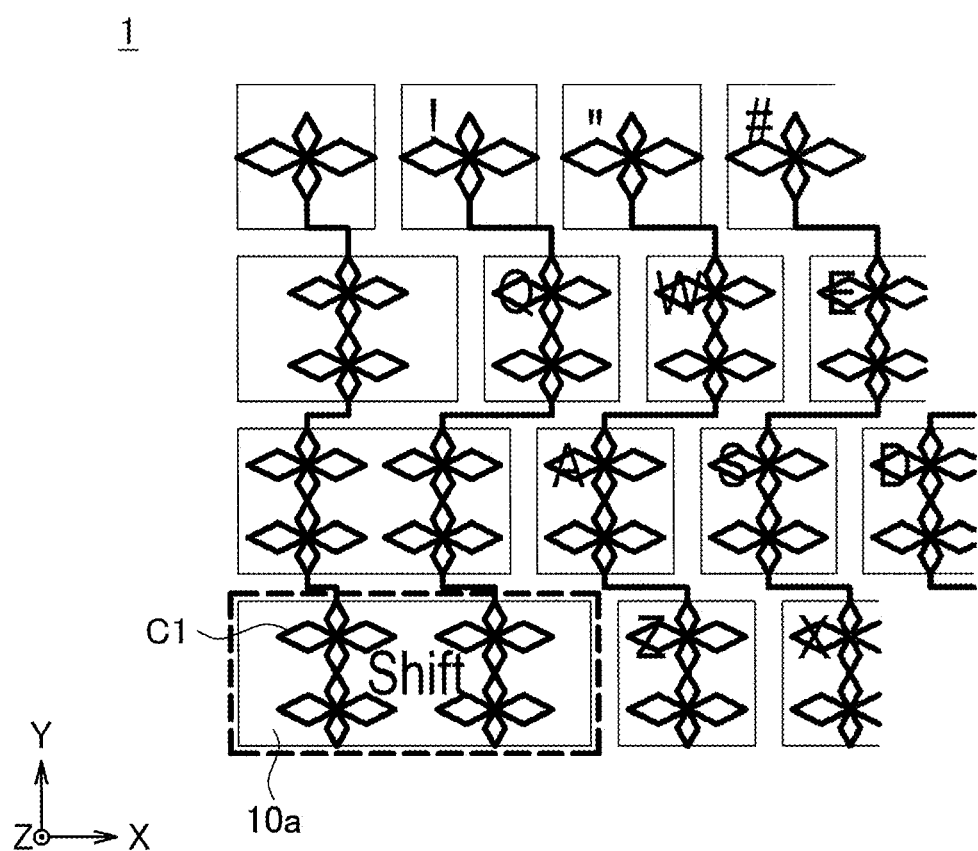
FIG. 5 is a schematic view illustrating a positional relationship between key arrangement and capacitive elements in the input device.

FIG. 5 illustrates a positional relationship between the key arrangement and the capacitive element C1 in the input device 1. FIG. 5 is a schematic view illustrating a positional relationship between the key arrangement and the capacitive element C1 in the input device 1. In FIG. 5, the capacitive elements C1 are overlapped on each other, as shown in a portion of the top view of the input device 1.

In the example shown in FIG. 5, the capacitive element C1 includes an electrode portion having a radially expanded wiring shape, which is not a simple shape as illustrated in FIG. 4. For example, four capacitive elements C1 are provided in the key region 10a that is encircled by broken lines in the figure. In other words, the key region 10a encircled by broken lines includes four nodes, and thus four delta values corresponding to the respective nodes are detected from the key region.

The configuration of the input device 1 according to an embodiment of the present disclosure has been described roughly. As described above, the input device 1 is configured to include the shield layer 40, the electrode board 20, the support 30, and the operation member 10, which are stacked on one another. The detection of a key input may be performed using the capacitance variation amount of the capacitive element C1 that includes two layers of wiring boards formed in the electrode board 20. In this way, the input device 1 can detect a key input with a relatively simple structure, without providing the structure of a load sensor like a keyboard disclosed in the above-mentioned JP 2011-154645A and JP 2011-154564A. Thus, thinning and weight reduction of the input device 1 can be achieved.

The keyboards having an electrostatic capacitive touch panel are typically provided with capacitive elements arranged to be uniformly distributed in the plane of the touch panel, as well known in the art. Thus, the arrangement of keys is not necessarily corresponded to the arrangement of capacitive elements. On the other hand, in the input device 1, the shape of the electrode wires 210 and 220 can be set appropriately, and the number and arrangement of capacitive elements can be adjusted depending on the arrangement of keys. For example, as described in the following item 6 "Third Embodiment" (Normalized Delta Value Determination Process), the input device 1 is able to perform the input state determination process in different ways depending on the number of capacitive elements provided in the key region 10a. In this way, the input device 1 can set the optimal key arrangement configuration and signal processing for enhancing the key input detection accuracy for each key. In addition, in the input device 1, only the necessary number of capacitive elements may be formed, thereby reducing the number of electrodes, as compared with the keyboards having a touch panel provided with capacitive elements arranged to be uniformly distributed in the plane of the touch panel as well known in the art. As a result, it is possible to reduce the load imposed on the signal processing when a key input is detected, and thus it is possible to use a more inexpensive processor (controller IC 110 or main MCU 120 described later) to perform the signal processing.

For the input device 1 according to an embodiment of the present disclosure, for example, it is possible to refer to WO13/132736 filed by the same applicant as the present application.

2. Configuration of Input Detection System

The configuration of the input detection system according to an embodiment of the present disclosure will be described. In the input detection system according to an embodiment of the present disclosure, a key corresponding to a target node is specified based on a delta value that is detected at each node of the input device 1, and the input state determination process corresponding to the key is performed. Then, information corresponding to the key may be inputted to a host device connected to the input device 1, based on the results obtained by determining the input state of the key.

2-1. Hardware Configuration

Figure 6:
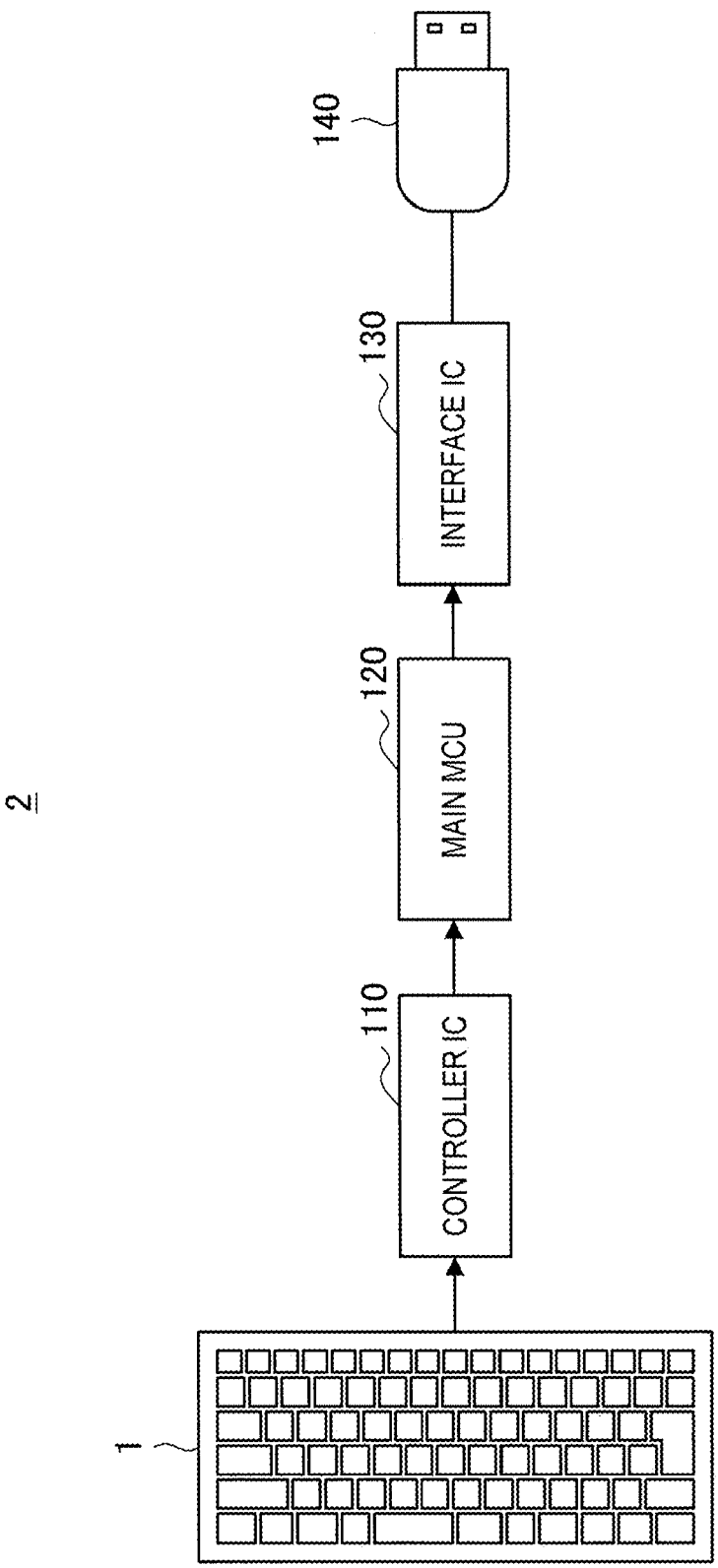
FIG. 6 is a block diagram illustrating an example of the functional configuration of an input detection system according to an embodiment of the present disclosure.

The hardware configuration of the input detection system according to an embodiment of the present disclosure will be described with reference to FIG. 6. FIG. 6 is a block diagram illustrating an example of the hardware configuration of the input detection system according to an embodiment of the present disclosure.

Referring to FIG. 6, the input detection system 2 according to an embodiment of the present disclosure is configured to include the input device 1, a controller integrated circuit (IC) 110, a main microcontroller (MCU) 110, an interface IC 130, and a connector 140. The configuration of the input device 1 is described in the above item 1 "Configuration of Input Device", and thus detailed description thereof is omitted.

The controller IC 110 is a processor that detects a delta value at each node in the input device 1. The controller IC 110 performs a process that corresponds to a process performed by a delta value detection unit 111 shown in FIG. 7, which will be described later. The node is formed in the intersection region between a plurality of electrode wires 220 that extend in the X-axis direction and a plurality of electrode wires 210 that extend in the Y-axis direction, and thus the node may be represented by addresses of X and Y. The controller IC 110 can detect a delta value at each node in association with the address of a target node. The controller IC 110 associates information regarding a delta value detected at each node with information regarding an address of a target node (address information) and transmits the associated information to the main MCU 120 in a subsequent stage. The processing in the controller IC 110 may be performed by allowing the controller IC 110 (that is, processor) to be executed in accordance with a predetermined program.

Figure 7:
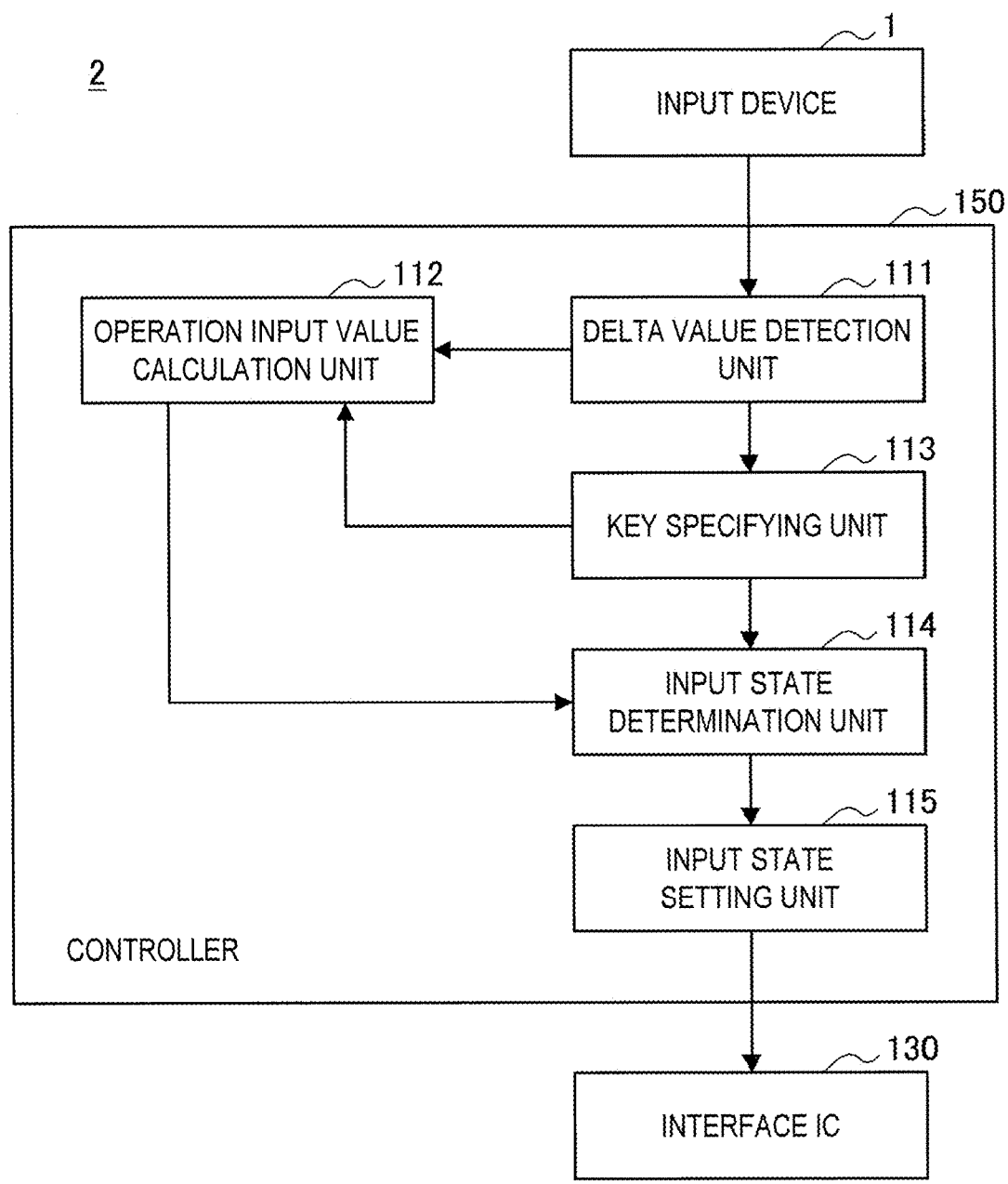
FIG. 7 is a functional block diagram illustrating an example of the functional configuration of the input detection system according to an embodiment of the present disclosure.

The main MCU 120 performs a process of determining a key input based on a delta value detected at each node. The process performed by the main MCU 120 includes a process of specifying a key from which a delta value is detected (hereinafter, also referred to as "key specifying process") and a process of determining a key input state based on a delta value. The process performed by the main MCU 120 corresponds to the process performed by an operation input value calculation unit 112, a key specifying unit 113, an input state determination unit 114, and an input state setting unit 115, which are shown in FIG. 7 described later. The process in the main MCU 120 may be performed by allowing a processor provided in the main MCU 120 to be executed in accordance with a predetermined program.

The key specifying process specifies a key corresponding to a node at which a delta value is detected, based on address information associated with the node. For example, a positional relationship between an address of a node and key arrangement in the input device 1 is stored in a storage device provided in the main MCU 120, such as a memory or a storage device (not shown), separately provided from the main MCU 120. Then, the main MCU 120 can specify a key corresponding to the node from which a delta value is detected, based on a positional relationship between an address of a target node and key arrangement.

On the other hand, in the input state determination process, the main MCU 120 determines an input state of a key corresponding to a target node from which a delta value is detected, based on the delta value. In the input state determination process, the key input state may be determined based on a delta value and/or other physical quantities calculated based on the delta value. For example, in the input state determination process, a differential delta value and/or a normalized delta value may be used in addition to a delta value. The differential delta value is a differential value of a delta value. The normalized delta value is a value obtained by normalizing a delta value. The differential delta value may be a value obtained by differentiating a detected delta value (that is, raw data or a value obtained by amplifying it) or may be a value obtained by differentiating a normalized delta value. In the following description, the term "differential delta value" may refer to a differential value of a delta value or a differential value of a normalized delta value. In addition, in a case where a plurality of nodes are provided for a single key, the input state determination process may be performed based on statistics, for example, the sum or average value of delta values, differential delta values, and/or normalized delta values. These delta values, differential delta values, and/or normalized delta values, or statistics thereof may be a value representing a key operation input (hereinafter, also referred to as "operation input value"). In this way, in an embodiment of the present disclosure, an input state for each key is determined based on an operation input value at each node.

The input state determination process determines whether an operation input value satisfies a predetermined condition (or input state determination condition). If it is determined that an operation input value satisfies the input state determination condition, the input state of a key corresponding to a node from which the operation input value is detected (calculated) is determined to be a KEY ON state (hereinafter, it is also simply referred to as "ON state"). The KEY ON state indicates a state in which a key operation input is determined to be valid. On the other hand, if it is not determined that an operation input value satisfies the input state determination condition, the input state of a key corresponding to a node from which the operation input value is detected (calculated) is determined to be in a KEY OFF state (hereinafter, it is also simply referred to as "OFF state"). The KEY OFF state indicates a state in which a key operation input is determined to be invalid. The input state determination condition may be set for each key. The main MCU 120 can perform the input state determination process using an input state determination condition that is set for a specified key, based on the results obtained by performing the key determination process.

The main MCU 120 performs the input state determination process and the key determination process for each node included in the input device 1 in a sequential manner, and thus it can determine an input state for each key. The main MCU 120 transmits information that indicates the content associated with a key determined to be in the KEY ON state to the interface IC 130 in a subsequent stage. In this way, in the KEY ON state, information associated with a key may be transmitted. However, the main MCU 120 may transmit the results obtained by performing the input state determination process of all the keys to the interface IC 130 in the subsequent stage, and then only information associated with a key determined to be in the KEY ON state may be extracted from among the transmitted results by any configuration succeeding to the interface IC 130.

The interface IC 130 is a processor that serves as an interface between the input device 1 and a host device connected to the input device 1. For example, the interface IC 130 is connected to the connector 140 that is used to connect the input device 1 to a host device. The interface IC 130 performs a signal conversion in a way suitable for the type of the connector 140 depending on the type of the connector 140 and transmits information associated with a key determined to be in the KEY ON state to a host device. Then, for example, the information processing device (or host device) allows a display unit to display characters or symbols corresponding to the key. The process performed by the interface IC 130 may be appropriately set depending on the type of the connector 140. The connector 140 may be universal serial bus (USB) connectors.

The hardware configuration of the input detection system 2 according to an embodiment of the present disclosure has been described with reference to FIG. 6. The functional configuration corresponding to the input detection system 2 shown in FIG. 6 will be described.

2-2. Functional Configuration

The functional configuration of the input detection system according to an embodiment of the present disclosure will be described with reference to FIG. 7. FIG. 7 is a functional block diagram illustrating an example of the functional configuration of the input detection system according to an embodiment of the present disclosure. The functional configuration shown in FIG. 7 corresponds to the hardware configuration of the input detection system 2 shown in FIG. 6. In an embodiment of the present disclosure, any type of device known in the art, which is typically used to connect a keyboard to the information processing device, may be used as the interface IC 130 and the connector 140. Thus, FIG. 7 mainly illustrates the function performed by the controller IC 110 and the main MCU 120 among the components shown in FIG. 6.

Referring to FIG. 7, the input detection system 2 according to an embodiment of the present disclosure is configured to include a delta value detection unit 111, an operation input value calculation unit 112, a key specifying unit 113, an input state determination unit 114, and an input state setting unit 115, as functional blocks. FIG. 7 illustrates functions performed in a controller 150 (corresponding to the information processing device according to an embodiment of the present disclosure) for simplicity purposes, but in practical, the controller 150 may be configured as a processor corresponding to the controller IC 110 and the main MCU 120. In other words, the functions performed by the controller 150 in FIG. 7 may be implemented by enabling the processor corresponding to the controller IC 110 and the main MCU 120 to execute in accordance with a predetermined program. For example, the function corresponding to the delta value detection unit 111 is executed by the controller IC 110, and other functions (operation input value calculation unit 112, key specifying unit 113, input state determination unit 114, and input state setting unit 115) may be executed by the processor provided in the main MCU 120. The present disclosure is not limited to this example. The functions shown in FIG. 7 may be executed by any processor of the controller IC 110 and the main MCU 120, or may be executed by other processing circuitry (information processing device) which is not shown in the figure.

The delta value detection unit (capacitance variance amount detection unit) 111 detects the capacitance variation amount of a capacitive element at each node of the input device 1. For example, the delta value detection unit 111 detects a delta value at each node at a predetermined sampling rate in a sequential manner (a delta value detected by the delta value detection unit 111 may be a substantially zero value [there is substantially no variation in capacitance of a capacitive element]). In addition, the delta value detection unit 111 can detect a delta value at each node in association with an address of a target node. The delta value detection unit 111 supplies the detected delta value and address information of a node corresponding to the delta value to the operation input value calculation unit 112, the key specifying unit 113, and the input state determination unit 114.

The key specifying unit 113 specifies a key corresponding to a node at which a delta value is detected, based on the node address information. The process performed by the key specifying unit 113 corresponds to the key specifying process described above. For example, in the input detection system 2 according to an embodiment of the present disclosure, a storage device (not shown) capable of storing various types of information may be provided, and a positional relationship between an address of a node and key arrangement in the input device 1 is stored in a storage device. The key specifying unit 113 refers to the storage device and can specify a key corresponding to the node at which a delta value is detected, based on the positional relationship between an address of the node and key arrangement. The storage device may be a memory provided in the main MCU 120 or may be provided as a separate configuration from the main MCU 120. The storage device is not particularly limited, and examples thereof include a magnetic storage device such as hard disk drive (HDD), a semiconductor storage device, an optical storage device, and a magneto-optical storage device. The key specifying unit 113 supplies information regarding the specified key to the input state determination unit 114. The key specifying unit 113 may be configured to supply information regarding the specified key to the operation input value calculation unit 112.

The operation input value calculation unit 112 calculates an operation input value used in the determination of input state at each node based on the supplied delta value. For example, the operation input value calculation unit 112 calculates a differential delta value and/or normalized delta value, based on the delta value. The differential delta value is the difference between sampling points (between frames) of a delta value that is detected at a predetermined sampling rate and represents temporal variation of the delta value. The normalized delta value is a value that is obtained by normalizing a delta value based on a predetermined reference value.

The operation input value calculation unit 112 acquires information regarding an input state determination condition that is set for each key based on information regarding a key specified by the key specifying unit 113 and then may calculate only a physical quantity used to perform the input state determination process based on the input state determination condition. For example, the operation input value calculation unit 112 may refer to the storage device described above to obtain information regarding the input state determination condition. When a physical quantity used to perform the input state determination process of each key is pre-identified, for example, when the same input state determination condition is set for all the keys, the operation input value calculation unit 112 may not acquire information regarding the specified key and information regarding the input state determination condition, but may calculate the physical quantity for all the detected nodes. For example, when an input state determination condition that is set to a key is determined using only a delta value, the operation input value calculation unit 112 may not perform a calculation process of an operation input value. The operation input value calculation unit 112 supplies the calculated operation input value to the input state determination unit 114.

The input state determination unit 114 determines an input state of a key corresponding to a target node based on the delta value that is detected at each node. The determination of an input state may be performed by determining whether an input state for each key is the KEY ON state based on the detected delta value. The process performed by the input state determination unit 114 corresponds to the input state determination process described above. Specifically, the input state determination unit 114 determines whether an operation input value at each node satisfies an input state determination condition that is set for the key supplied from the key specifying unit 113, based on information regarding the key. For example, the input state determination unit 114 refers to the above-described storage device in which the input state determination condition that is set for each key is stored, and thus the input state determination unit 114 can acquire information regarding the input state determination condition that is set for each key and perform the input state determination process.

For example, the input state determination unit 114 compares the operation input value with a predetermined threshold to determine an input state. Specifically, if the operation input value is greater than the predetermined threshold, the input state determination unit 114 determines that the input state of the key corresponding to a target node is the KEY ON state. On the other hand, if the operation input value is less than or equal to the predetermined threshold, the input state determination unit 114 determines that the input state of the key corresponding to a target node is in the KEY OFF state. Alternatively, if the operation input value satisfies a predetermined input state determination condition, the input state determination unit 114 may determine that an input state of a key is in a "KEY OFF WAIT state", which will be described in item 4 "First Embodiment" (KEY OFF Detection Process). The "KEY OFF WAIT state" will be described in detail in relevant part herein.

The threshold used to determine whether it is in the KEY ON state and the threshold used to determine whether it is in the KEY OFF state may be the same value or different one. When the threshold used to determine whether it is in the KEY ON state is different from the threshold used to determine whether it is in the KEY OFF state, it is possible to prevent so-called chattering, thereby improving the usability. The process of preventing chattering using such a dual threshold will be described later in detail with reference to item 4-3 "Reduction in Chattering", which will be described later.

The input state determination unit 114 determines an input state for each key. However, for example, when a plurality of nodes are associated with a single key, the input state may be determined if an operation input value at any one node included in the key satisfies an input state determination condition (that is, determination by an "OR" operation). Further, the input state may be determined if an operation input value at all the node included in the key satisfies an input state determination condition (that is, determination by an "AND" operation). The input state determination condition may be set for each key in an optional way as necessary. For example, an input state for a certain key may be determined by determination of an "OR" operation, an input state for other keys may be determined by determination of an "AND" operation. The threshold to be compared with the operation input value may be a different value for each key. The input state determination condition for each key may be set appropriately in consideration of the frequency the use of a key or the detection accuracy based on the position in which the key is arranged.

The term "less than or equal to" and "more than" are used herein to describe the magnitude relation between an operation input value and a threshold, these terms are intended to be illustrative and are not restrictive of the boundary condition when comparing an operation input value and a threshold. In an embodiment of the present disclosure, when an operation input value is equal to the threshold, the method of how to determine the magnitude relations may be set in an optional way. The term "less than or equal to" used herein can be substantially the same meaning as the term "less than", and the term "greater than" can be substantially the same meaning as the term "greater than or equal to" as used herein.

The input state determination unit 114 supplies information regarding a results obtained by determination of an input state for each key to the input state setting unit 115.

The input state setting unit 115 sets an input state for each key based on the determination results of an input state obtained by the input state determination unit 114. The input state setting unit 115 sets an input state for each key as one of KEY ON state, KEY OFF state, and KEY OFF WAIT state, depending on the determination results of the input state. The input state setting unit 115 transmits information indicating the content of a key to a host device via the interface IC 140. The content is associated with the key that is set as the KEY ON state. The host device regards the received information relevant to the key as an input value. The input state setting unit 115 may transmit the results obtained by performing the input state determination process of all the keys to the interface IC 130 in the subsequent stage, and then only information associated with a key determined to be in the KEY ON state may be extracted from among the transmitted results by any configuration (for example, a host device) succeeding to the interface IC 130.

The functional configuration of the input detection system according to an embodiment of the present disclosure has been described with reference to FIG. 7. It is possible to install a computer program, which is prepared for implementing the functions of the input detection system 2 according to an embodiment of the present disclosure as described above, on a personal computer. It is possible to provide a computer-readable recording medium to store such a computer program. A recording medium includes, for example, a magnetic disk, an optical disk, a magneto-optical disk, and a flash memory. A computer program may be downloaded via a network, without using a recording medium.

3. Information Processing Method (Input Detection Method)

Figure 8:
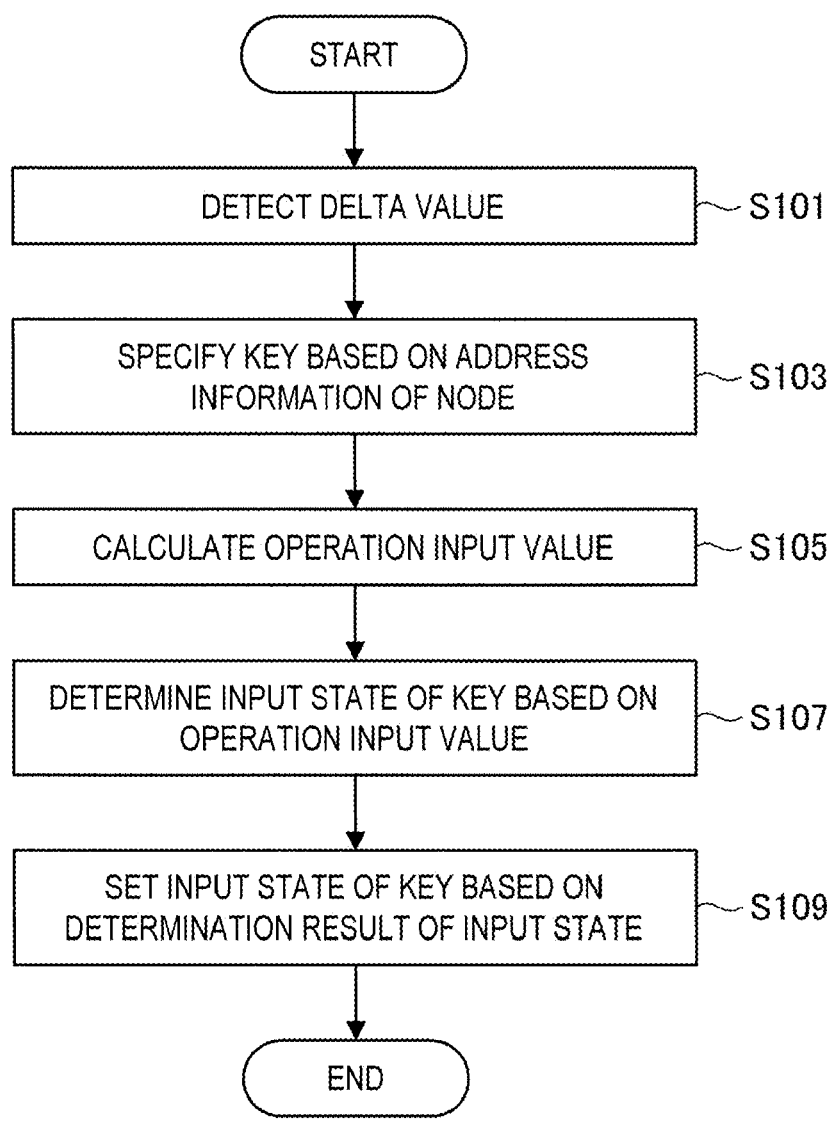
FIG. 8 is a flowchart illustrating an example of the processing steps of an input detection method according to an embodiment of the present disclosure.

The processing steps of an information processing method (input detection method) performed in the input detection system according to an embodiment of the present disclosure will be described with reference to FIG. 8. FIG. 8 is a flowchart illustrating an example of the processing steps of an input detection method according to an embodiment of the present disclosure. The processing steps shown in the flowchart of FIG. 8 are executed by the individual processing functions of the input detection system 2 shown in FIG. 7.

Referring to FIG. 8, in the input detection method according to an embodiment of the present disclosure, a delta value at each node of the input device 1 is detected (step S101). The process in step S101 may be performed, for example, by the delta value detection unit 111 described above with reference to FIG. 7. In step S101, a delta value is detected in association with address information of the node at which the delta value is detected.

A key corresponding to the node at which the delta value is detected is specified based on the address information of the node at which the delta value is detected in step S101 (step S103). The process in step S103 may be performed, for example, by the key specifying unit 113 described above with reference to FIG. 7. In step S103, a key corresponding to the node is specified based on the address information of the node, and such key specification is performed, for example, based on a preset positional relationship between an address of the node and key arrangement in the input device 1.

An operation input value to be used in the process of determination of an input state is calculated, based on the delta value detected in step S101 (step S105). The process in step S105 may be performed, for example, by the operation input value calculation unit 112 described above with reference to FIG. 7. In step S105, information regarding an input state determination condition that is set for each key is obtained, for example, based on information regarding the key specified in step S103, and calculates a physical quantity used in the input state determination process, based on the input state determination condition. Alternatively, when a physical quantity used to perform the input state determination process for each key is pre-identified, for example, when the same input state determination condition is set for all the keys, a physical quantity may be calculated for all the detected nodes in step S105 without using information regarding the detected key and information regarding the input state determination condition. Furthermore, when an input state determination condition that is set for a given key is determined using only a delta value, the process in step S105 may not be performed.

An input state of a key corresponding to the node is determined based on the operation input value at each node that is detected in step S101 and/or calculated in step S105 (step S107). The process in step S107 corresponds to, for example, the input state determination process performed by the input state determination unit 114 described above with reference to FIG. 7. In step S107, it is determined whether an operation input value of a node corresponding to the key satisfies the input state determination condition, based on the input state determination condition that is set in advance for each key.

An input state of the key is set based on the determination results of an input state for each key determined in step S107 (step S109). The process in step S109 may be performed, for example, by the input state setting unit 115 described above with reference to FIG. 7. For example, in step S109, the KEY ON state, KEY OFF state, and KEY OFF WAIT state are set for each key based on the determination results of an input state. Information indicating the content associated with the key set to be in the KEY ON state in step S109 is transmitted to a host device connected to the input device 1, and the host device receives the information.

The processing steps of the input detection method performed in the input detection system according to an embodiment of the present disclosure have been described with reference to FIG. 8. A specific example of the input state determination process performed in step S107 will be described with reference to FIGS. 9 to 12. For example, in the input state determination process, an input state may be detected by comparing a delta value or a differential delta value with a predetermined threshold. In the following, such a determination process of an input state based on the comparison between a delta value and a predetermined threshold is also referred to as a "delta value determination process". The determination process of an input state based on the comparison between a differential delta value and a predetermined threshold is also referred to as a "differential delta value determination process".

Figure 9:
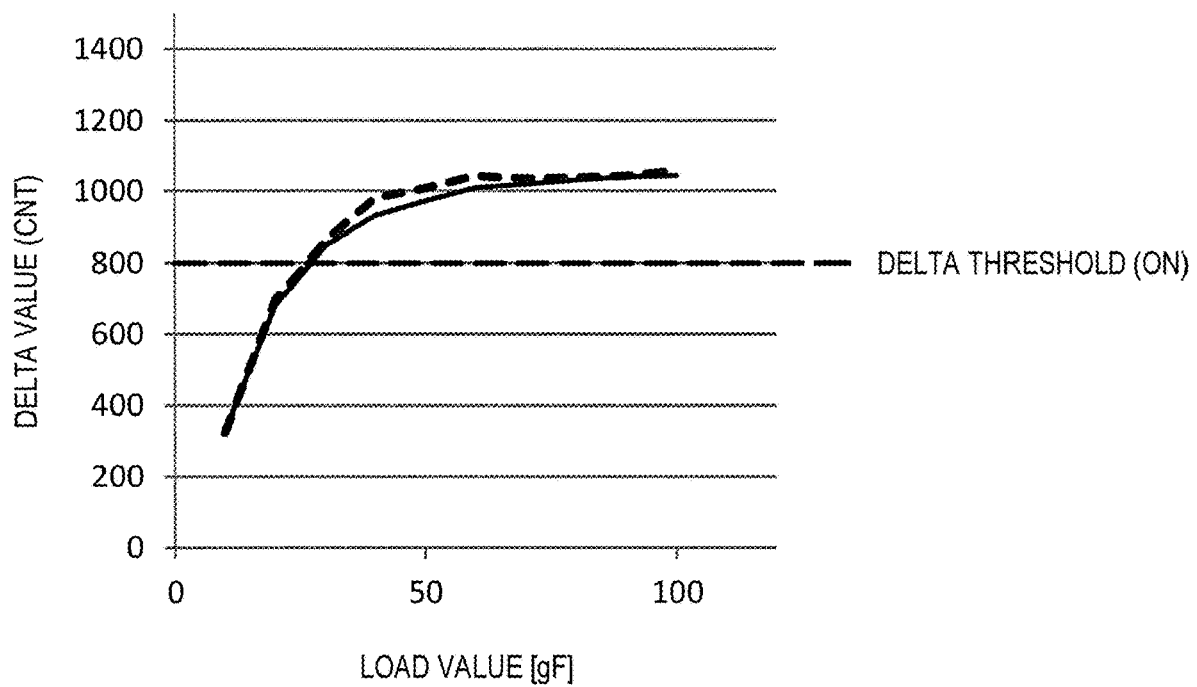
FIG. 9 is a graph showing an example of a delta value detected at a node of the input device.
Figure 10:
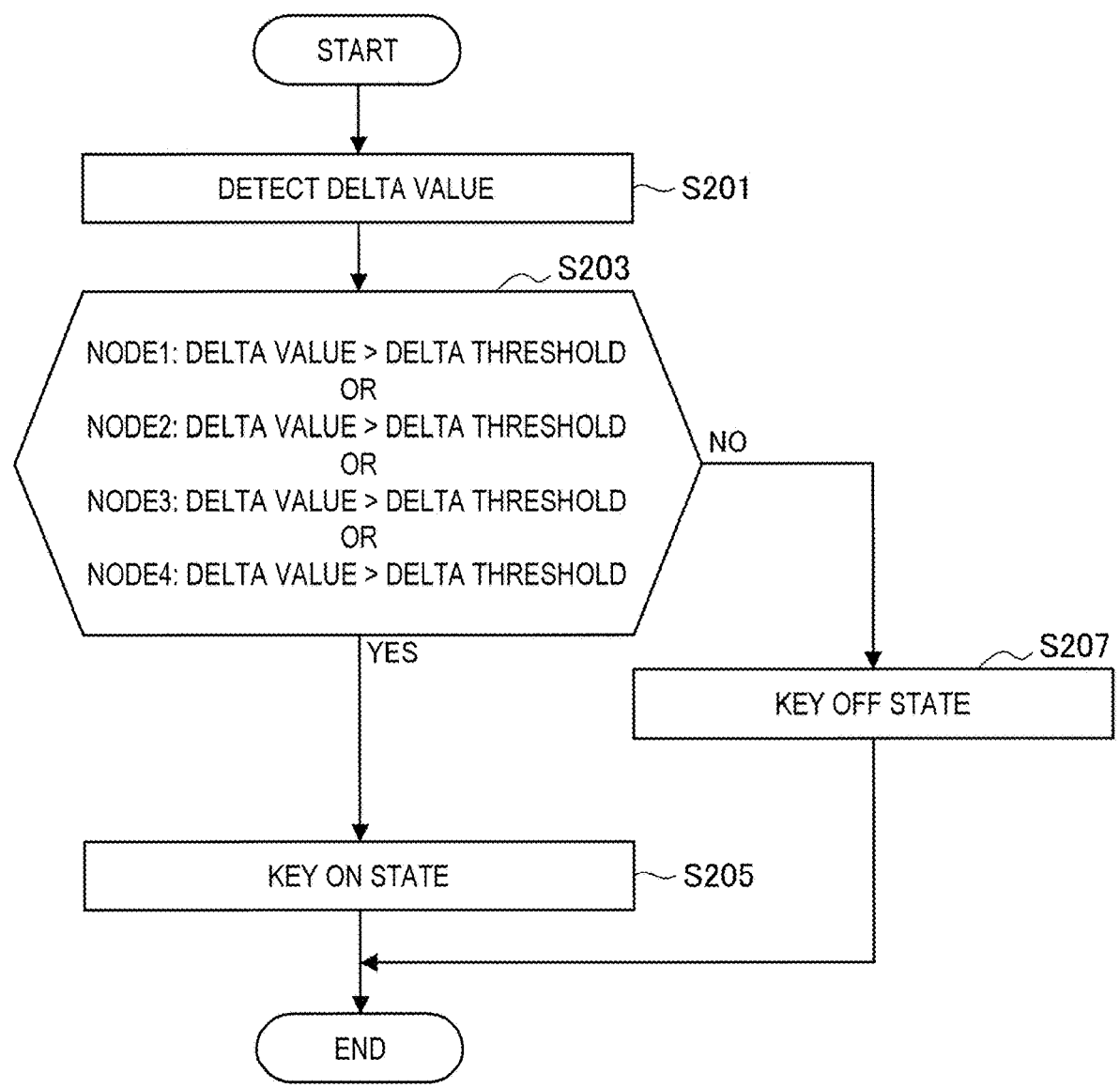
FIG. 10 is a flowchart illustrating the processing steps in a delta value determination process.

The delta value determination process will be described with reference to FIGS. 9 and 10. FIG. 9 is a graph showing an example of a delta value detected at a node of the input device 1. FIG. 10 is a flowchart illustrating the processing steps in the delta value determination process.

In FIG. 9, the horizontal axis represents a load value [gF] for a given key of the input device 1, and the vertical axis represents a delta value at a node provided in the given key. The graph of FIG. 9 is obtained by plotting the relationship between the two. In FIG. 9, as an example, delta values of two nodes included in the key "J" are plotted. In the graphs of FIG. 9 and the subsequent figures, there are illustrated an operation input value such as delta value, differential delta value, and normalized delta value is converted into a count value (CNT) in the controller IC 110 shown in FIG. 6.

Referring to FIG. 9, the relationship between a delta value and a load imposed when the user presses a key is a function of monotonous increase which is saturated at a predetermined value. In the delta value determination process, an appropriate threshold (delta threshold) is set for a delta value, and it may be determined whether the delta value is greater than the delta threshold. In the example shown in FIG. 9, the delta threshold is set to approximately 800 (CNT), but the embodiment of the present disclosure is not limited to this example. The delta threshold may be set appropriately depending on the configuration of the input device 1, in consideration of a load that may be imposed upon every keystroke.

In FIG. 10, as an example, the processing steps of the delta value determination process for a key provided with four nodes are illustrated. Referring to FIG. 10, in the delta value determination process, a delta value at each node included in a key is detected (step S210). The comparison between a delta value at each detected node and a delta threshold is performed (step S203). In the example shown in FIG. 10, if a delta value at any one of nodes 1 to 4 is greater than the delta threshold, then it is determined that an input state of the key is the KEY ON state, and the KEY ON state is set as the input state of the key (step S205). On the other hand, if none of delta values at nodes 1 to 4 is greater than the delta threshold, then it is determined that an input state of the key is in the KEY OFF state, and the KEY OFF state is set as the input state of the key (step S207).

In the example shown in FIG. 10, in step S203, the determination using the "OR" operation is performed for the delta value at each node. The determination using the "OR" operation may allow an operation input to the key region 10a to be detected with higher sensitivity, for example, even when a region located at nearly the end of the key region 10a is pressed. However, the embodiment of the present disclosure is not limited to this example. For example, in step S203, the determination using the "AND" operation may be performed for the delta value at each node (that is, if all the delta values at the nodes 1 to 4 are greater than the delta threshold, the input state of the key may be determined to be the KEY ON state). If the delta values at any two or three nodes of the nodes 1 to 4 are greater than the delta threshold, the input state of the key may be determined to be the KEY ON state. When a delta value at a particular node of the nodes 1 to 4 is greater than the delta threshold, the input state of the key may be determined to be the KEY ON state, for example, in consideration of the arrangement of the nodes 1 to 4 in the key region 10a. A specific condition of the determination in the delta value determination process may be set as appropriate depending on the position and the number of nodes arranged in a key and the desired detection accuracy.

The processing steps listed in the flowcharts shown in FIG. 10 and subsequent FIGS. 12, 15, 21, 22, 23, 25, 28, and 30 may be performed by the individual functions of the input detection system 2 shown in FIG. 7. For example, in the process shown in these figures, the process of detecting a delta value, the process of calculating an operation input value, the process of determining an input state, and the process of setting an input state may be performed by the delta value detection unit 111, the operation input value calculation unit 112, the input state determination unit 114, and the input state setting unit 115, respectively. The processing steps listed in the flowcharts shown in FIG. 10 and subsequent FIGS. 12, 15, 21, 22, 23, and 25 correspond to a series of processes performed for a target key included in the input device 1. Although it is not shown in the individual flowcharts, in fact, the process is performed to specify a key corresponding to the node at which a delta value is detected, for example, by the key specifying unit 113 shown in FIG. 7. The series of processing steps shown in these figures may be performed similarly for other keys of the input device 1.

Figure 11:
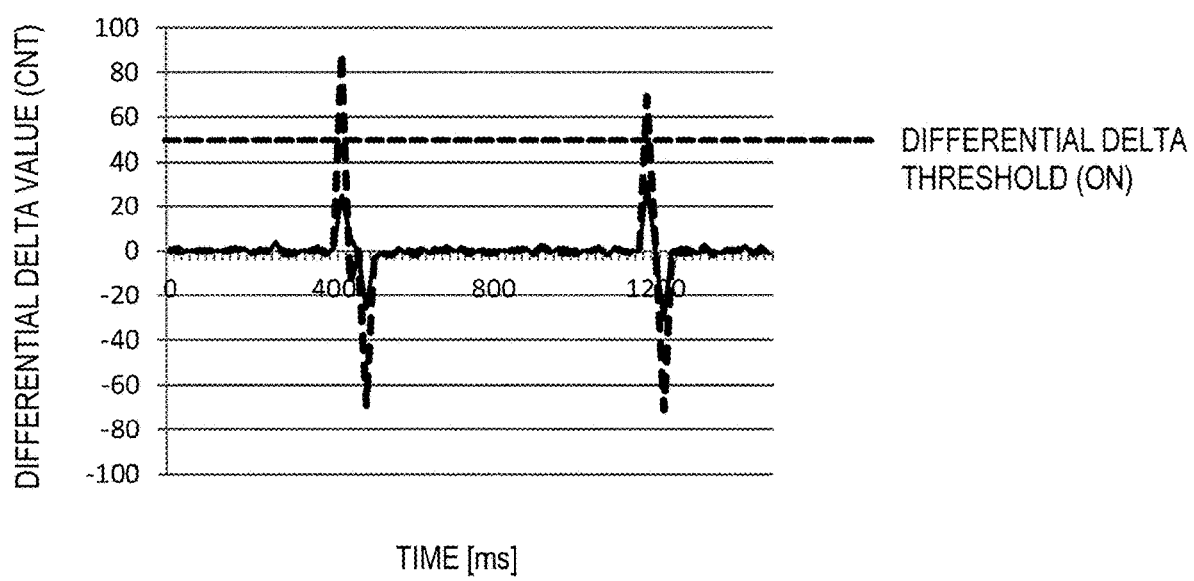
FIG. 11 is a graph showing an example of a differential delta value detected at a node of the input device.
Figure 12:
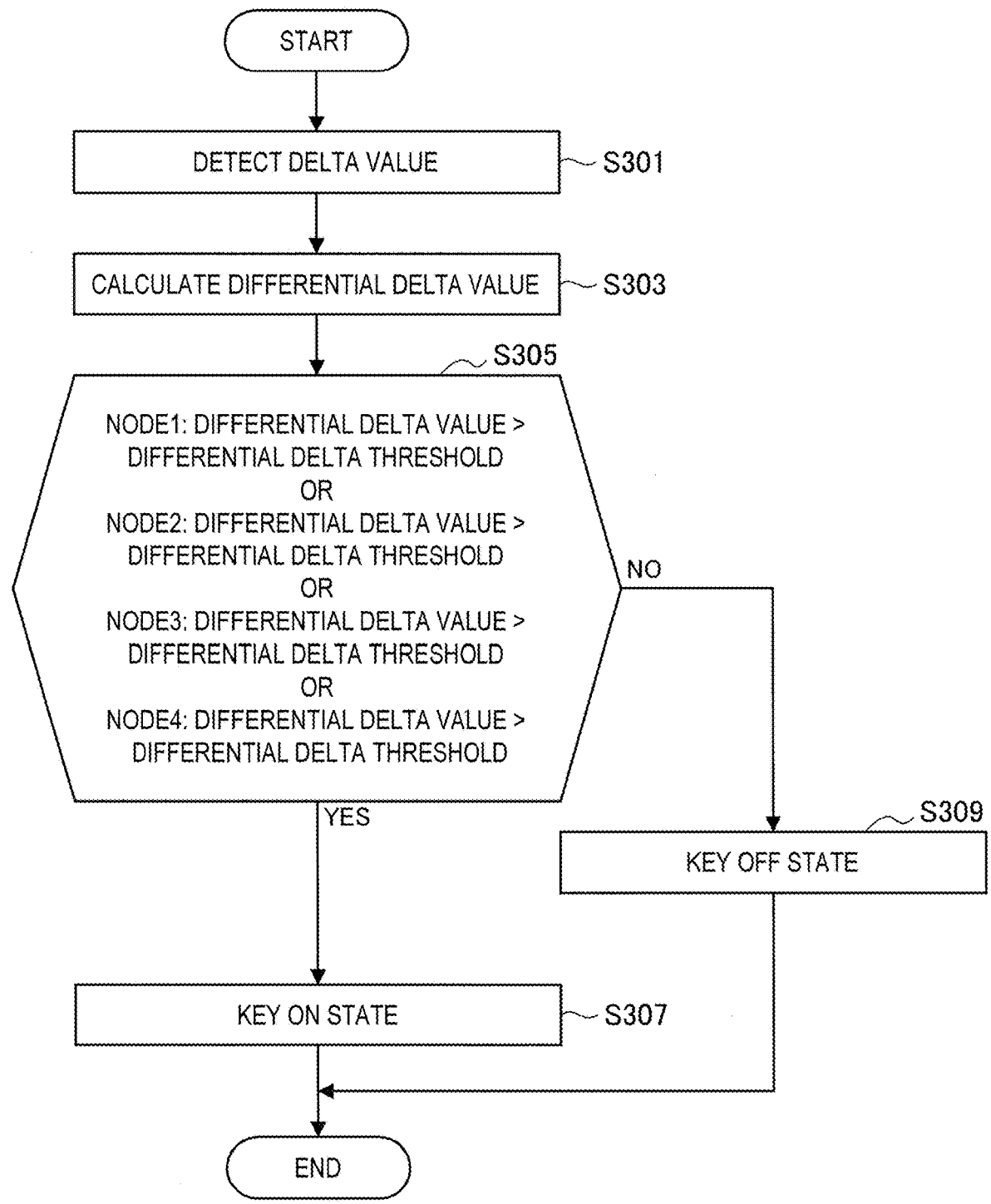
FIG. 12 is a flowchart illustrating the processing steps in a differential delta value determination process.

The differential delta value determination process will be described with reference to FIGS. 11 and 12. FIG. 11 is a graph showing an example of a differential delta value detected at a given node of the input device 1. FIG. 12 is a flowchart illustrating the processing steps in a differential delta value determination process.

In FIG. 11, the horizontal axis represents time [ms], and the vertical axis represents a differential delta value at a given node of the input device 1. The graph of FIG. 11 is obtained by plotting the relationship between the time and the differential delta value when an operation input is performed for the key corresponding to the node. In FIG. 11, as an example, the differential delta values of two nodes included in the key "J" are plotted. Referring to FIG. 11, the differential delta value is detected in a manner such that it is at first in a state of being maintained at a substantially zero value, increases instantaneously at a certain time, decreases instantaneously at the next time, and becomes a negative value, and then it finally returns to the substantially zero value. The moment at which the differential delta value increases corresponds to the time when the user presses the key with the finger, and the moment at which the differential delta value decreases corresponds to the time when the finger is removed from the key. As shown in FIG. 11, in the embodiment of the present disclosure, while the user is pressing the key with the finger (that is, during a period in which the key region 10a shown in FIG. 2 approaches the capacitive element C1), a positive differential delta value is obtained. While the finger is being removed from the key (that is, during a period in which the key region 10a shown in FIG. 2 moves away from the capacitive element C1), a negative differential delta value is obtained.

In the embodiment of the present disclosure, an appropriate threshold (differential delta threshold) is set for the differential delta value, and it may be determined whether the differential delta value is greater than the differential delta threshold. In the example shown in FIG. 11, the differential delta threshold is set to approximately 50 (CNT), but the embodiment of the present disclosure is not limited to this example. The differential delta threshold may be set as appropriate in consideration of the load that may be imposed upon every keystroke, depending on the configuration or other characteristics of the input device 1.

FIG. 12 illustrates, as an example, the processing steps of the differential delta value determination process performed on a key to which four nodes are assigned. Referring to FIG. 12, in the differential delta value determination process, a delta value at each node included in a key is detected (step S301). A differential delta value is calculated based on the detected delta value (step S303). The comparison between a differential delta value at each calculated node and a differential delta threshold is performed (step S305). In the example shown in FIG. 12, if a differential delta value at any one of nodes 1 to 4 is greater than the differential delta threshold, then it is determined that an input state of the key is the KEY ON state, and the KEY ON state is set as the input state of the key (step S307). On the other hand, if none of delta values at nodes 1 to 4 is greater than the delta threshold, then it is determined that an input state of the key is in the KEY OFF state, and the KEY OFF state is set as the input state of the key (step S309).

In the example shown in FIG. 12, in step S305, the determination using the "OR" operation is performed for a differential delta value at each node. The determination using the "OR" operation may allow an operation input to the key region 10a to be detected with higher sensitivity, for example, even when a region located at nearly the end of the key region 10a is pressed. However, the embodiment of the present disclosure is not limited to this example. For example, even in the differential delta value determination process, similarly to the delta value determination process, a specific criterion of the determination in step S305 may be set optionally. A specific condition of the determination in the differential delta value determination process may be set as appropriate depending on the position and the number of nodes arranged in a key and the desired detection accuracy.

The specific example of the input state determination process performed in step S107 has been described with reference to FIGS. 9 to 12. The delta value determination process and the differential delta value determination process as described above are examples of a basic determination process in the input state determination process according to an embodiment of the present disclosure. In the embodiment of the present disclosure, for example, the input state determination process may be performed using only a basic determination process, such as the delta value determination process and the differential delta value determination process. Alternatively, the input state determination process may be performed using a combination of a plurality of basic determination processes. For example, when both the delta value determination process and the differential delta value determination process are performed for a given key, that is, "the result obtained by the delta value determination process is in the KEY ON state and the result obtained by the differential delta value determination process is in the KEY ON state", the input state of the key may be determined to be the KEY ON state, or alternatively, when "the result obtained by the delta value determination process is in the KEY ON state or the result obtained by the differential delta value determination process is in the KEY ON state", the input state of the key may be determined to be the KEY ON state.

In the embodiment of the present disclosure, the input state determination process can be performed using a combination of a plurality of different determination processes, and thus it is possible to adjust the accuracy of the key input detection, resulting in the achievement of usability suitable for the user's desire. There will be described some embodiments of the input state determination process which is implemented by combining basic determination processes as appropriate and is able to achieve higher degree of usability.

4. First Embodiment (KEY OFF Detection Process)

A preferred embodiment of the KEY OFF detection process at the time of detection of KEY OFF state in the input state determination process will be described as a first embodiment of the present disclosure.

4-1. Background leading to First Embodiment

A background that leads to the input state determination process according to the first embodiment made by the inventors of the present disclosure will be described, and then the first embodiment will be described. In the first embodiment, the input state determination process is performed for the input device 1 described in the item 1 "Configuration of Input Device" described above. In the input device 1, the pressing amount of the operation member 10 to the key region 10a is detected as the capacitance variation amount of the capacitive element C1. For example, even after the finger is removed from the key region 10a, a predetermined magnitude of the non-zero delta value is detected continuously while the operation member 10 is being deformed (that is, during a period in which the distance between the operation member 10 and the electrode board 20 is being reduced).

On the other hand, various types of operating systems (OS) commonly used in a host device, such as PCs, connected to the input device 1 are often provided with a function (so-called, repeat key function) of performing a continuous input of information corresponding to a key pressed continuously in a keyboard. In the repeat key function, an input operation of a given key is performed continuously when an input state of the key is the KEY ON state for a predetermined period of time. The duration of the KEY ON state in which it is determined that the repeat key function is executed may vary depending on the type of OS, and for example, the duration of a given OS is set to 33 milliseconds.

As described above, in the input device 1, a predetermined magnitude of the delta value is detected continuously while the operation member 10 is being deformed even after the finger is removed from the key region 10a. In this case, if the KEY OFF state is detected in the delta value determination process, for example, when the operation member 10 takes a relatively long time to return to its original shape, the repeat key function will be executed, and thus the same key is likely to be repeatedly inputted against the user's intention. The inventors of the present disclosure have conducted the experiment to investigate whether an erroneous detection based on such repeat key function occurs in the input device 1.

Figure 13:
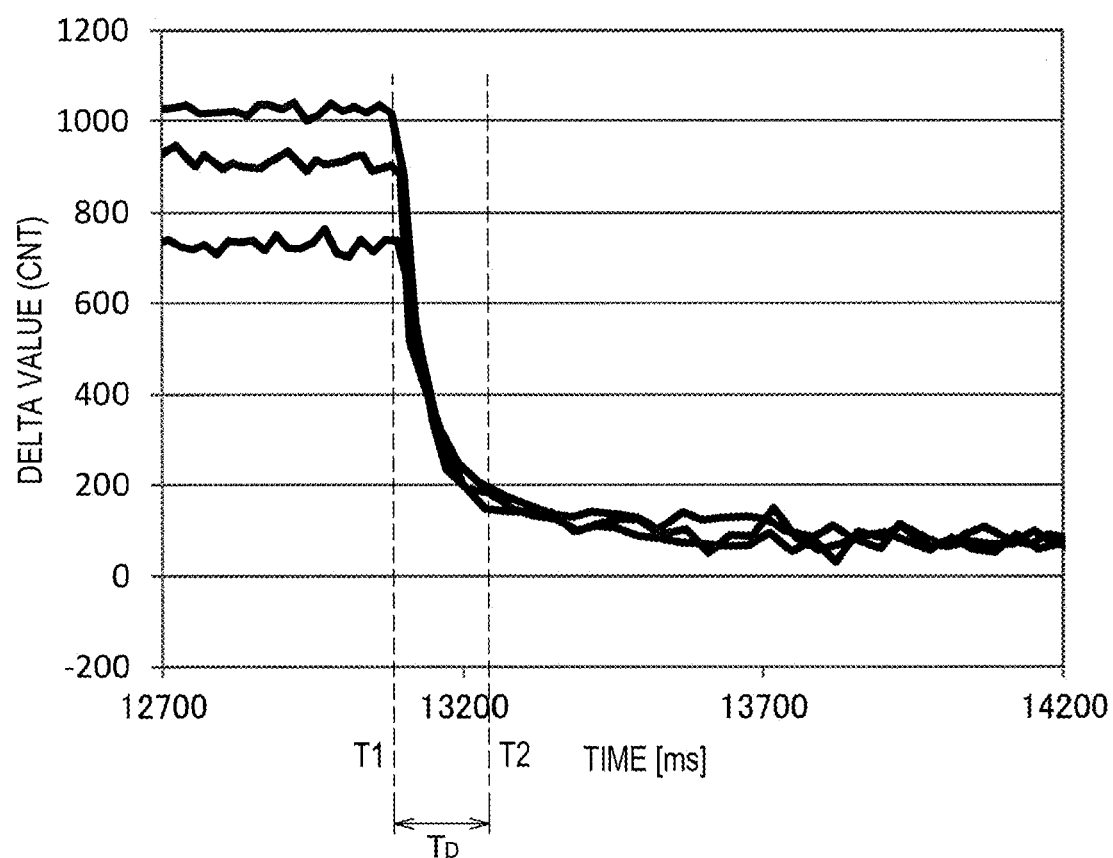
FIG. 13 is a graph showing the time variation of a delta value in the case of releasing from a state in which a key region is pressed in the input device.

The experiment began by assuming an operation input to a key region 10a with the finger. Then, the key region 10a was pressed with a predetermined load using a finger-like tool. Then, an operation of releasing the tool from the key region 10a was performed at time T1, and during this operation, a delta value at a node corresponding to the pressed key region 10a was detected. To investigate the load dependence when the key region 10a is pressed, a delta value when the key region 10a is pressed with a plurality of different values of load (30 [gF], 100 [gF], and 500 [gF]) was detected, and time variations of the delta value were compared. The results obtained by the experiment are illustrated in FIG. 13. FIG. 13 is a graph showing time variations of the delta value when the key region 10a is released from the pressing state in the input device 1. In FIG. 13, the horizontal axis represents time [ms], the vertical axis represents a delta value at a node in the input device 1, and the relationship between the two is plotted. In FIG. 13, as an example, the experimental results for the key "K" are illustrated.

With reference to FIG. 13, it can be found that the delta value decreases sharply from when the tool is removed from the key region 10a at time T1. In the input device 1 used in the experiment by the inventors of the present disclosure, the minimum value of the delta threshold that is necessary to determine that the input state is in the KEY OFF state may be set to approximately 200 (CNT) in consideration of the specifications of the input device 1. Thus, if it is intended to detect the KEY OFF state using the delta value determination process, when the delta value at a node becomes 200 (CNT) or less, the input state of a key corresponding to the node may be determined to be in the KEY OFF state. The experimental results shown in FIG. 13 typically illustrate, in the input device 1 used in the experiment, only a case where a period of time $T_D$, which ranges from the time T1 at which the tool is removed from the key region 10a to the time at which the delta value of the node becomes 200 (CNT) or less, was approximately 110 [ms] (in FIG. 13, $T_D$=110 [ms]) when the imposed load is 500 [gF] before time T1 (during the period from time T1 to T2). The reduction in the imposed load (this corresponds to the stroke of a key with smaller force) allows the time $T_D$ to be shortened, but when the minimum load used in the experiment was 30 [gF], the time $T_D$ was approximately 62 [ms].

As described above, for example, in a given OS, the duration of the KEY ON state in which the execution of the repeat key function is determined is set to 33 [ms]. Thus, from the above-mentioned results, it can be found that, when the input state determination process is performed using such a simple delta value determination process in the input device 1 used in the experiment, an erroneous detection of a key against the user's intention is less likely to be prevented based on the repeat key function.

In view of the above experimental results, in the input device 1, there is a demand for technology that prevents an erroneous detection against the user's intention based on the repeat key function even when it takes a time for the operation member 10 to return to its original shape after pressing, thereby improving the usability. The inventors of the present disclosure have studied the configuration capable of preventing an erroneous detection and improving the usability, with respect to the KEY OFF detection process performed in the input device 1, and then the first embodiment described below was developed. The first embodiment will be described in detail.

4-2. Detailed Description of KEY OFF Detection Process

Figure 14:
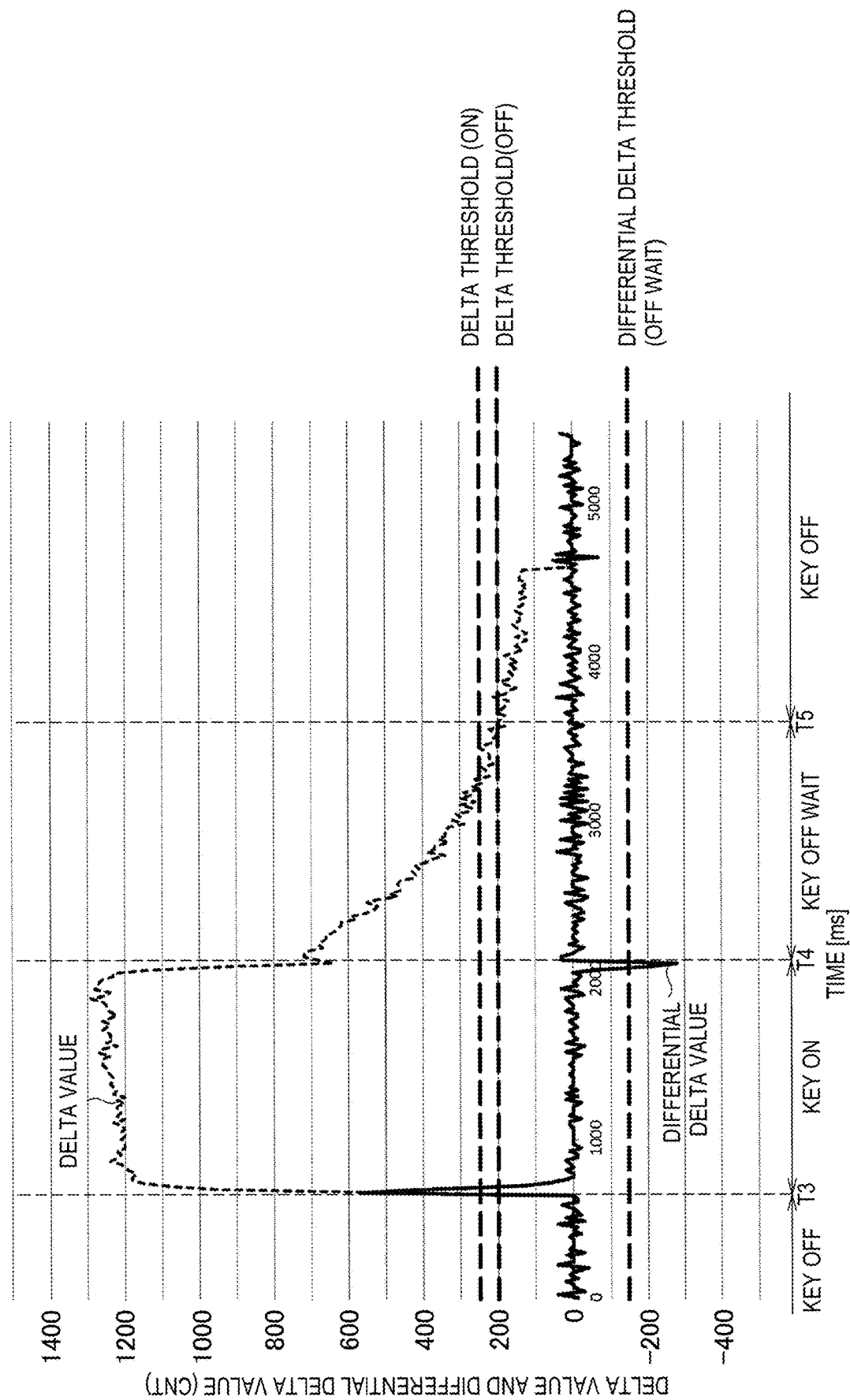
FIG. 14 is a graph showing an example of a delta value and a differential delta value detected at a node of the input device.
Figure 15:
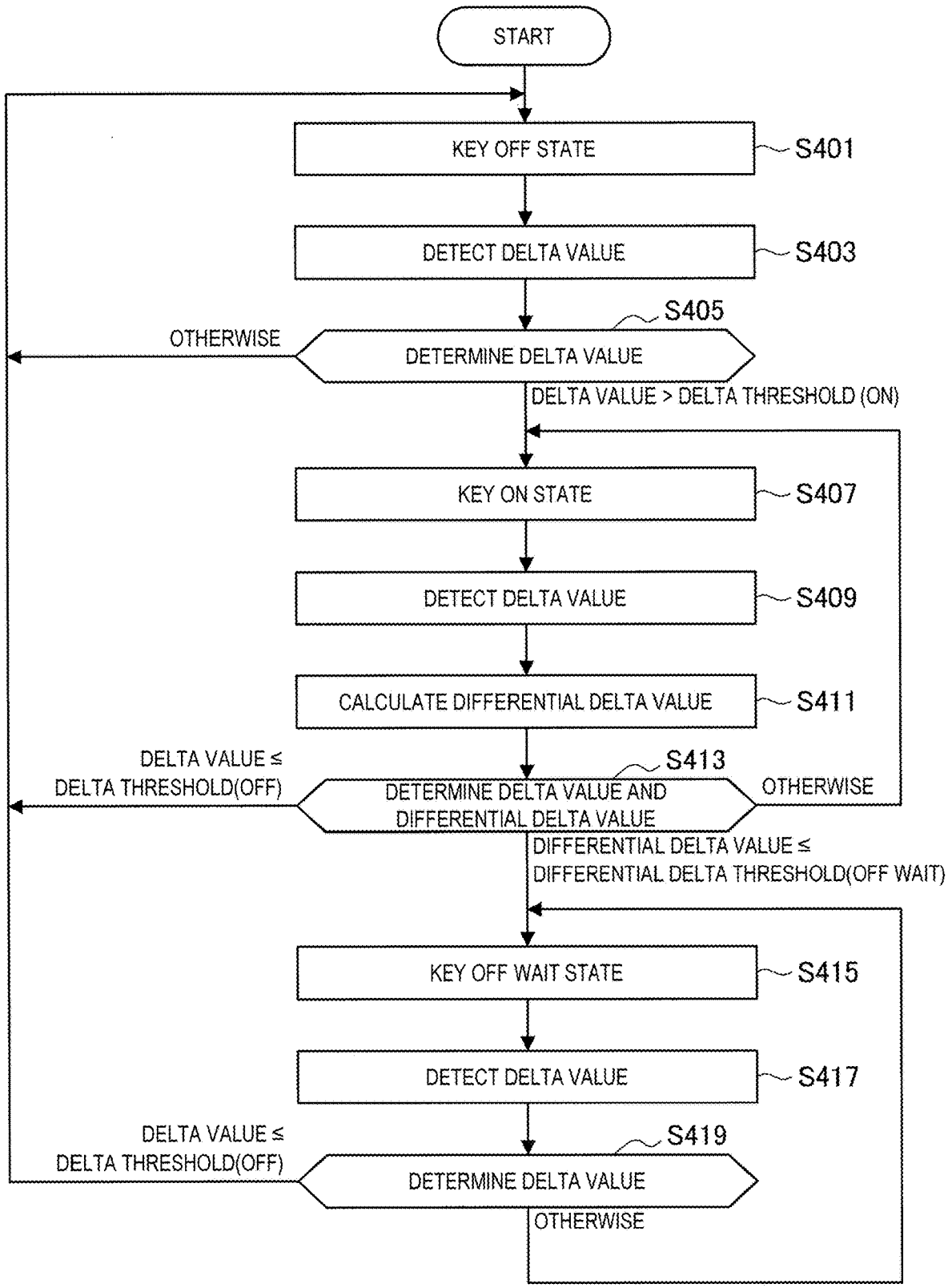
FIG. 15 is a flowchart illustrating the processing steps in a KEY OFF detection process according to a first embodiment.

The KEY OFF detection process according to the first embodiment will be described with reference to FIGS. 14 and 15. FIG. 14 is a graph showing an example of a delta value and a differential delta value detected at a node of the input device 1. FIG. 15 is a flowchart illustrating the processing steps in the KEY OFF detection process according to the first embodiment.

In FIG. 14, the horizontal axis represents time [ms], the vertical axis represents a delta value and a differential delta value at a node in the input device 1, and the relationship between the two is plotted. In FIG. 14, as an example, the delta value and the differential delta value at one node included in the key "K" are plotted. As shown in FIG. 14, time T3 corresponds to the time at which a keystroke is started with the finger, and time T4 corresponds to the time at which the finger is removed from the key.

In the first embodiment, two different thresholds are set as a delta threshold. In other words, a delta threshold (ON) for determination of the KEY ON state and a delta threshold (OFF) for determination of the KEY OFF state are set. A differential delta threshold (OFF WAIT) for determination of the KEY OFF WAIT state, which will be described later, is set as a differential delta value. In the example shown in FIG. 14, the delta threshold (ON), the delta threshold (OFF), and the differential delta threshold (OFF WAIT) are 250 (CNT), 200 (CNT), and −150 (CNT), respectively. In this way, in the first embodiment, the determination of the KEY ON state and the KEY OFF state is performed based on the delta value determination process, and the determination of the KEY OFF WAIT state is performed based on the differential delta value determination process. However, the delta threshold (ON), the delta threshold (OFF), and the differential delta threshold (OFF WAIT) shown in FIG. 14 are merely illustrative, and in the first embodiment, these thresholds may be set as appropriate in consideration of the configuration of the input device 1 and the usability.

The KEY OFF WAIT state is a state in which a delta value is less than or equal to the delta threshold (OFF), and a delta value is greater than the delta threshold (ON) but not equal to the KEY ON state as long as the key is not in the KEY OFF state. In brief, the KEY OFF WAIT state may be a state of waiting to be the KEY OFF state. The KEY OFF WAIT state is treated in the same way as the KEY OFF state in terms of an input of information regarding a key to a host device, but information regarding a key in the KEY OFF WAIT state is not inputted to a host device. In the first embodiment, the introduction of the concept of the KEY OFF WAIT state allows an erroneous detection against the user's intention based on the repeat key function to be prevented even when it takes a time for the operation member 10 to return to its original shape after it is pressed in the input device 1.

The KEY OFF detection process according to the first embodiment will be described in detail with reference to FIG. 14. There is no operation input to a target key before time T3, and thus the key is in the KEY OFF state. At time T3, both of the delta value and the differential delta value rise sharply when the key is pressed. If the delta value is greater than the delta threshold (ON), the input state of the key is determined to be the KEY ON state, and the input state of the key is shifted from the KEY OFF state to the KEY ON state.

At time T4, the finger is removed from the key. When the finger is removed from the key, the load imposed to the key is released and both of a delta value and a differential delta value decrease sharply. However, the delta value does not return to a steady-state value immediately and it takes some time to gradually return to a steady-state value as described above with reference to FIG. 13. On the other hand, if the finger is removed from the key and the differential delta value becomes less than the differential delta threshold (OFF WAIT), the input state of the key is determined to be in the KEY OFF WAIT state and the input state of the key is shifted from the KEY ON state to the KEY OFF WAIT state. In this way, in the first embodiment, it is determined that, by the differential delta value determination process, the KEY ON state is ended.

Then, if the delta value becomes less than or equal to the delta threshold (OFF) (at time T5), the input state of the key is determined to be in the KEY OFF state and is shifted from the KEY OFF WAIT state to the KEY OFF state.

The delta value is a value that is detected depending on the deformation amount of the operation member 10, and thus it may be difficult to recognize the moment that the finger is removed from the key with higher accuracy using the delta value. On the other hand, the differential delta value is a temporal variation in the deformation amount of the operation member 10, and thus it is possible to recognize the moment that the finger is removed from the key with higher accuracy using the differential delta value. In the first embodiment, with this characteristics, the moment that the finger is removed from the key is detected by a change in the differential delta value, and the input state of the key is shifted from the KEY ON state to the KEY OFF WAIT state using a change in the differential delta value as a trigger. In the first embodiment, the process described above allows the period of time during which the KEY ON state to be substantially equal to the period of time during which the finger is in contact with the key region 10*a*. Thus, it is possible to prevent an erroneous input of a key caused due to the repeat key function even after the user removes the finger from the key.

The processing steps of the KEY OFF detection process according to the first embodiment described above will be described with reference to FIG. 15. Referring to FIG. 15, in the KEY OFF detection process according to the first embodiment, the input state of a target key is in the KEY OFF state (step S401).

A delta value is detected at a predetermined sampling rate (step S403), and then the delta value determination process is performed based on the detected delta value (step S405). If the detected delta value is less than or equal to the delta threshold (ON) as a result of performing the delta value determination process, the input state of the key is determined to be in the KEY OFF state, then the process returns to step S401. In other words, the input state of the key remains in the KEY OFF state (step S401), and the delta value determination process is repeated based on the delta value detected at the subsequent sampling timing (steps S403 and S405). On the other hand, if the detected delta value is greater than the delta threshold (ON) as a result of performing the delta value determination process in step S405, then the input state of the key is determined to be the KEY ON state, and the input state of the key is shifted from the KEY OFF state to the KEY ON state (step S407). Information regarding to the key in the KEY ON state is supplied to a host device.

Next, in the KEY ON state, a differential delta value is calculated based on the delta value detected at the subsequent sampling timing, and the delta value determination process and the differential delta value determination process are performed based on the delta value and the differential delta value, respectively (steps S409, S411, and S413). In the delta value determination process in step S413, the delta value is compared with the delta threshold (OFF). If the delta value is less than or equal to the delta threshold (OFF), then the input state of the key is determined to be in the KEY OFF state, and the process returns to step S401. In other words, the input state of the key is shifted to the KEY OFF state (step S401), and the process of step S403 and the subsequent steps is repeated.

In the differential delta value determination process in step S413, the differential delta value is compared with the differential delta threshold (OFF WAIT). If the differential delta value is less than or equal to the differential delta threshold (OFF WAIT), then the input state of the key is determined to be in the KEY OFF WAIT state, and the input state of the key is shifted from the KEY ON state to the KEY OFF WAIT state (step s415).

On the other hand, in step S413, if the delta value is greater than the delta threshold (OFF) and the differential delta value is greater than the differential delta value (OFF WAIT), then the input state of the key is determined to be the KEY ON state, and the process returns to step S407. In other words, the input state of the key remains as the KEY ON state (step S407), and the differential delta value calculation process, the delta value determination process, and the differential delta value determination process are repeated based on the delta value detected at the subsequent sampling timing (steps S409, S411, and S413).

In the delta value determination process and the differential delta value determination process in step S413, the result obtained by performing the delta value determination process is set to have a priority over the result obtained by performing the differential delta value determination process. For example, if the delta value is less than or equal to the delta threshold (OFF) and the differential delta value is greater than the differential delta threshold (OFF WAIT), then the input state of the key is determined to be in the KEY OFF state, and the process returns to step S401. The case in which the delta value is less than or equal to the delta threshold (OFF) and the differential delta value is greater than the differential delta threshold (OFF WAIT) indicates a situation where the delta value becomes less than or equal to the delta threshold (OFF) before the differential delta value becomes less than or equal to the differential delta threshold (OFF WAIT). This means that, at the time of removing the finger from the key region 10*a*, the delta value decreases sharply and then becomes less than or equal to the delta threshold (OFF). It can be considered that such resilience of the key region 10*a* in the input device 1 allows an erroneous detection based on the repeat key function to be prevented even when the input state of the key is shifted from the KEY ON state to the KEY OFF state directly by skipping the KEY OFF WAIT state (in other words, without introducing the KEY OFF WAIT state).

When the input state of the key is shifted to the KEY OFF WAIT state in step S415, the delta value determination process is performed based on the delta value detected at the subsequent sampling timing (steps S417 and S419). In the delta value determination process in step S419, the delta value is compared with the delta threshold (OFF). If the delta value is less than or equal to the delta threshold (OFF), the input state of the key is determined to be in the KEY OFF state and the process returns to step S401. In other words, the input state of the key is shifted to the KEY OFF state (step S401), and the process in step S403 and the subsequent steps is repeated. On the other hand, if the delta value is greater than the delta threshold (OFF), the input state of the key is determined to be in the KEY OFF WAIT state and the process returns to step S415. In other words, the input state of the key remains in the KEY OFF WAIT state (step S415), and the delta value determination process is repeated based on the delta value detected at the subsequent sampling timing (steps S417 and S419).

The processing steps of the KEY OFF detection process according to the first embodiment have been described with reference to FIG. 15. As described above, according to the first embodiment, the moment when the finger is removed from the key region 10a is detected using the differential delta value, and the input state of the key is shifted from the KEY ON state to the KEY OFF WAIT state. The KEY OFF WAIT state is maintained until the delta value becomes less than or equal to the delta threshold (OFF) and the input state of the key becomes in the KEY OFF state. Thus, the period of time during which the KEY ON state is allowed to be substantially equal to the period of time during which the finger is in contact with the key region 10a. Accordingly, it is possible to prevent an erroneous input of a key caused due to the repeat key function even after the user removes the finger from the key, resulting in the improvement of the usability.

4-3. Reduction in Chattering

Figure 16:
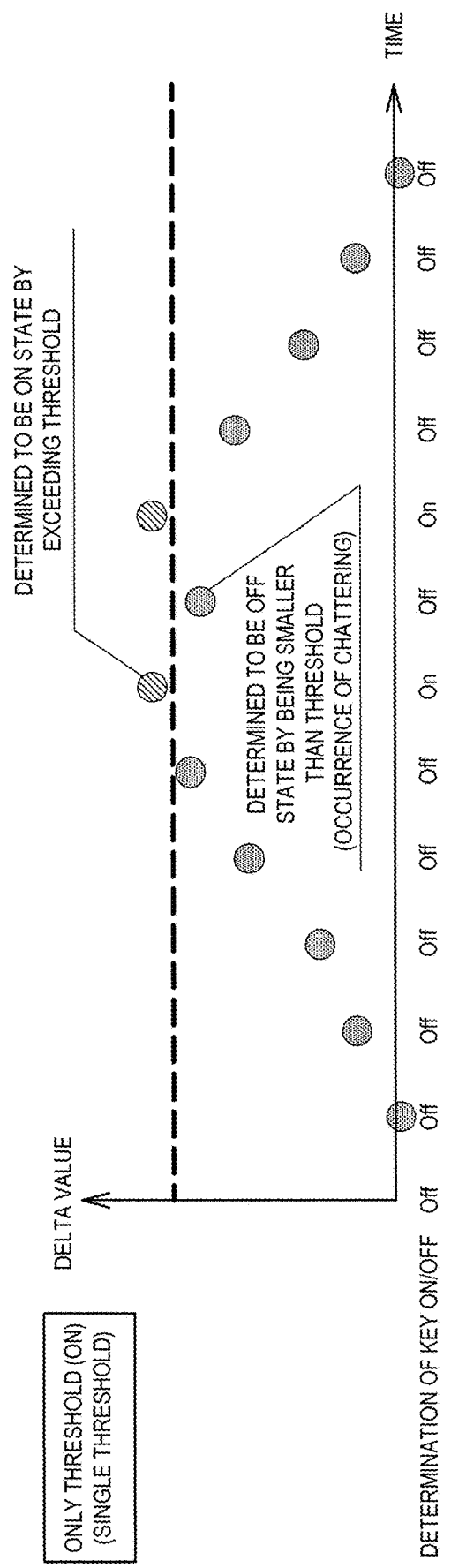
FIG. 16 is an explanatory diagram illustrated to describe advantages of a reduction in chattering by setting a dual threshold in an input state determination process.
Figure 17:
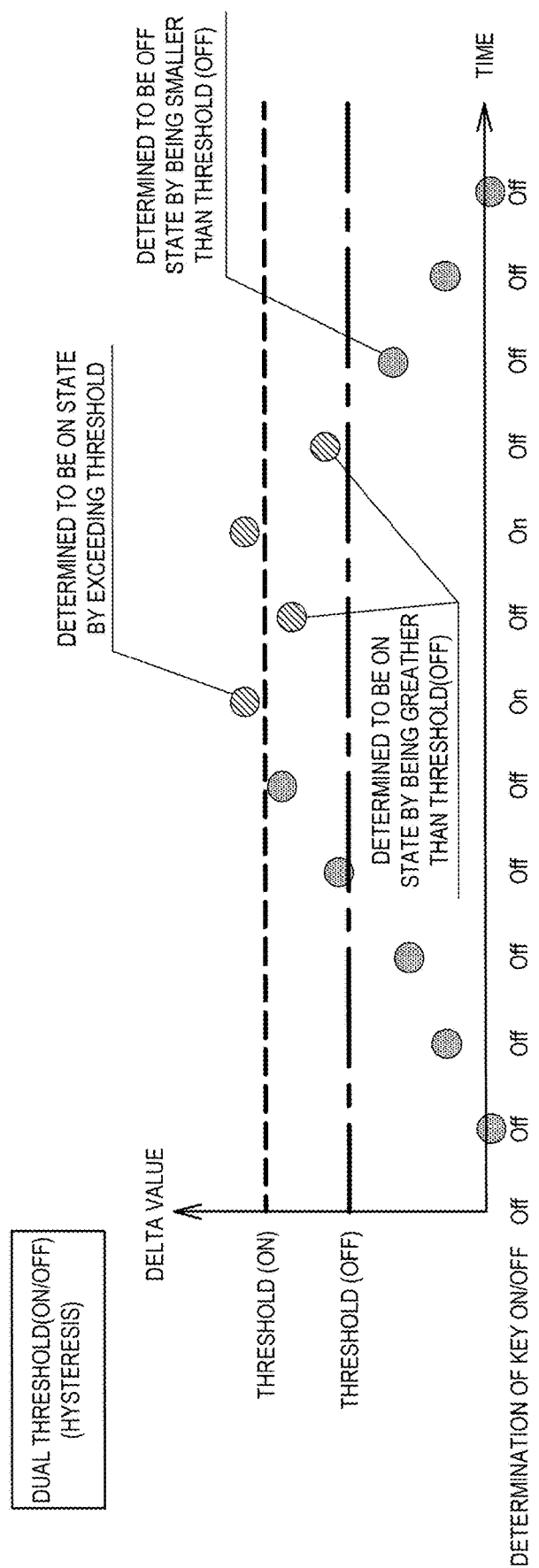
FIG. 17 is an explanatory diagram illustrated to describe advantages of a reduction in chattering by setting a dual threshold in an input state determination process.

The effect obtained by reducing chattering will be described with reference to FIGS. 16 and 17. The reduction in chattering is achieved by setting a dual threshold (for example, the delta threshold (ON) and the delta threshold (OFF) shown in FIG. 14) as a delta value, which is employed in the first embodiment. FIGS. 16 and 17 are explanatory diagrams illustrated to describe advantages of a reduction in chattering by setting a dual threshold in an input state determination process. The term "chattering" as used herein indicates that there are a plurality of keystrokes against the user's intention due to a minute change in the pressing force in the middle of pressing a key.

In FIGS. 16 and 17, the horizontal axis represents time and the vertical axis represents a delta value at a given node in the input device 1. The FIGS. 16 and 17 schematically illustrate how the delta value changes with time when the user presses a key corresponding to the node once. In the figures, the circle schematically indicates a delta value detected at each time.

FIG. 16 illustrates the delta value determination process in a case in which only one threshold is set. In this case, if the delta value is greater than the threshold, the input state of the key corresponding to the node is determined to be the KEY ON state. If the delta value is less than or equal to the threshold, the input state of the key corresponding to the node is determined to be in the KEY OFF state. Thus, even during a single keystroke, a case where the delta value varies across the threshold as shown in FIG. 16 may be occurred. More specifically, if the delta value becomes greater than the threshold, the input state of the key is determined to be the KEY ON state, then the delta value decreases slightly, and if the delta value becomes less than the threshold, the input state of the key is determined to be in the KEY OFF state, and then if the delta value becomes greater than the threshold, the input state of the key is determined to be the KEY ON state. In such a case, even though the user is intended to perform a single keystroke, the same key will be inputted twice (that is, occurrence of chattering).

On the other hand, FIG. 17 illustrates the delta value determination process in a case in which two thresholds are set. In this case, if the delta value is greater than the threshold (ON), the input state of the key corresponding to the node is determined to be the KEY ON state, and if the delta value is less than or equal to the threshold (OFF), the input state of the key corresponding to the node is determined to be in the KEY OFF state. Thus, even when the delta value varies across the threshold (ON) during the keystroke, the input state of the key is not determined to be in the KEY OFF state as long as the delta value is not less than equal to the threshold (OFF), and thus occurrence of chattering is reduced.

The chattering reduction effect obtained by setting a dual threshold in the input state determination process has been described with reference to FIGS. 16 and 17. As described above, the use of a dual threshold as a delta threshold allows occurrence of chattering to be prevented, and thus a key input having higher degree of usability can be achieved. The dual threshold described above may be preferably applied to not only the KEY OFF detection process according to the first embodiment but also a delta value determination process according to second to fourth embodiments, which will be described later.

5. Second Embodiment (KEY ON Detection Process)

A preferred embodiment of the KEY ON detection process at the time of detecting the KEY ON state in the input state determination process will be described as a second embodiment of the present disclosure.

5-1. Background Leading to Second Embodiment

Prior to a detailed description of the second embodiment, a background that leads to the input state determination process according to the second embodiment made by the inventors of the present disclosure is described. In the second embodiment, the input state determination process is performed for the input device 1 described in the above item 1 "Configuration of Input Device", which is similar to the first embodiment. In the input device 1, when the pressing amount of the operation member 10 to the key region 10a is detected as the capacitance variation amount of the capacitive element C1, the input device 1 has a thickness of approximately several millimeters, and thus a small amount of change in the key region 10a may be detected as a capacitance variation amount. If the user places his hand in the home position of the input device 1 or the user searches a key with the hand placed on the input device 1, an input of a key may be detected against the user's intention depending on input state determination conditions. To prevent such erroneous detection of a key, it can be considered that the user raises the hand away from the input device 1 while not performing a key input, but this forces the user to take an action and thus the user feels inconvenience.

On the other hand, for a keyboard such as the input device 1, the users have a desire to press a key "with smaller force".

The compact input device 1 and the small-sized key region 10*a* necessitate a use of fingertips (nails) to press a key with small force.

In this way, in the input device 1, there is a demand to prevent an input of a key from being detected (that is, it is determined to be in the KEY OFF state) for the above-mentioned operation of placing the hand on the input device and searching a key with fingers (hereinafter, also referred to as "searching operation"), and there is a demand to allow an input of a key to be detected (that is, it is intended to be determined to be in the KEY ON state) for the above-mentioned operation of stroking a key with fingertips (hereinafter, also referred to as "fingertip keystroke operation"). The inventors of the present disclosure have conducted the experiment to investigate whether such demand may be achieved when a simple delta value detection process (for example, processing illustrated in FIG. 10) is applied to the input state determination process in the input device 1.

Figure 18:
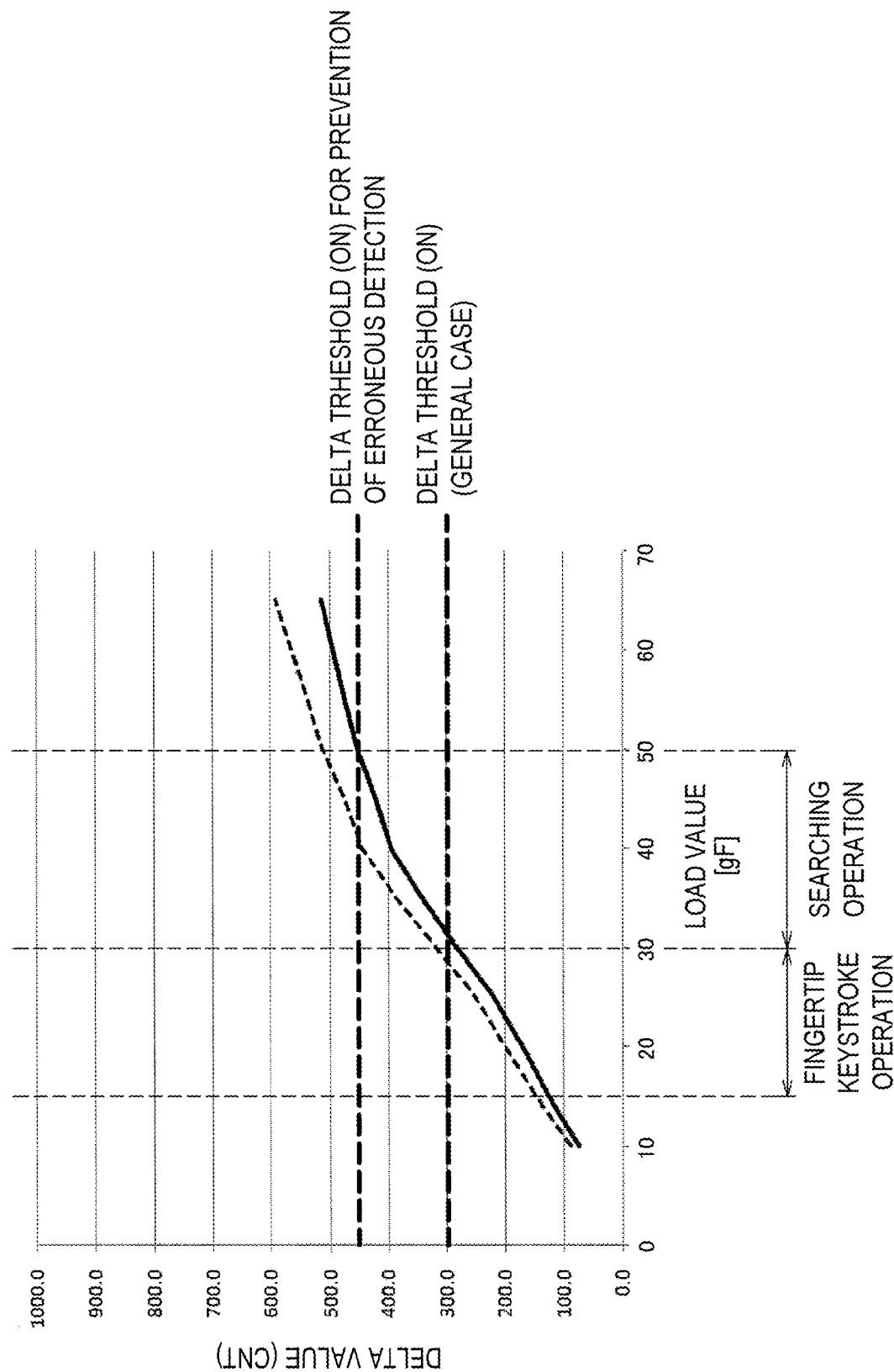
FIG. 18 is a graph showing a relationship between the pressing force applied to a key in the input device and a delta value at a node included in the key.

FIG. 18 shows the experimental results. FIG. 18 is a graph showing a relationship between the pressing force applied to a key in the input device 1 and a delta value at a node included in the key. In FIG. 18, the horizontal axis represents a load value [gF] imposed to a key, and the vertical axis represents a delta value at a node corresponding to the key. The graph of FIG. 18 is obtained by plotting the relationship between the two. In FIG. 18, as an example, delta values at two nodes included in the key "K" are plotted.

In this experiment, the above-mentioned searching and fingertip keystroke operations were performed for the key from which delta values shown in FIG. 18 are obtained, and load values that may be applied to the key at that time were obtained. The searching and fingertip keystroke operations were performed repeatedly by a plurality of different users and statistics were obtained. From the obtained statistics, it was found that the load value assumed to be imposed by the fingertip keystroke operation is approximately 15 to 30 [gF], and the load value assumed to be imposed by the searching operation is approximately 30 to 50 [gF].

Referring to FIG. 18, the relationship between the pressing force to a key and the delta value at a node corresponding to the key is monotonically increasing. It is found that if a load value corresponding to the fingertip keystroke operation (approximately 15 to 30 [gF]) is imposed on a key, the delta value at a node corresponding to the key is in the range of approximately 120 to 300 (CNT). It is found that if a load value corresponding to the searching operation (approximately 30 to 50 [gF]) is imposed on a key, the delta value of a node corresponding to the key is in the range of approximately 300 to 500 (CNT).

For the delta value determination process in the input device 1 used in the experiment, the threshold (delta threshold (ON)) that can be typically used to determine the KEY ON state may be approximately 300 (CNT). As shown in FIG. 18, if the delta value determination process is performed, for example, by setting the delta threshold to 300 (CNT), the input state of the key during the searching operation will be determined to be the KEY ON state. In the example shown in FIG. 18, to prevent an erroneous detection of a key when the searching operation is performed, it is found that the delta threshold is necessary to be set to a value greater than 500 (CNT), for example, to approximately 550 (CNT). On the other hand, if the delta threshold is set to 550 (CNT), the fingertip keystroke operation is unable to be detected.

In this way, from the results shown in FIG. 18, it is found that there is a difficulty in achievement of the demand to prevent an input of a key from being detected during the searching operation and to allow an input of a key to be detected when the input state determination process is performed by a simple delta value determination process in the input device 1 used in the experiment.

In view of the above experimental results, in the input device 1, there is a demand that preferably detects only a key input using an operation intended to be inputted by the user by allowing operations having different properties, such as the searching operation corresponding to the operation when the finger is placed on a home position and the fingertip keystroke operation corresponding to the operation when the key is pressed actually, to be distinguished from each other and by allowing only a key input using a particular operation to be detected. The inventors of the present disclosure have studied the configuration capable of achieving the demand for the KEY ON detection process in the input device 1 and improving the usability, and then the second embodiment described below was developed. The second embodiment will be described in detail.

5-2. Detailed Description of KEY ON Detection Process

If an actual situation of performing the searching process (for example, a case where the finger is placed on a home position and a key is searched with the finger on the input device 1) is assumed, it can be said that the searching operation has a relatively large pressing force but a relatively low pressing speed to a key. If an actual situation of performing the fingertip keystroke operation (for example, a case where a key of the input device 1 is continuously stroked to input texts or the like) is assumed, it can be said that the fingertip keystroke operation has a relatively small pressing force but a relatively high pressing speed to a key. In the second embodiment, the differential delta value determination process is used based on the properties of the searching and fingertip keystroke operations, and thus the input state determination process is implemented in which the input of a key is prevented from being detected for the searching operation and the input of a key is allowed to be detected for the fingertip keystroke operation.

On the other hand, there is an operation of pressing and holding a key (hereinafter, also referred to as "press and hold operation") which is similar to the searching operation, as an operation input to a key. In the press and hold operation, the same key is pressed continuously, and thus it is assumed that the delta value is relatively large and the differential delta value is approximately zero. In view of the usability of the input device 1, it is preferable that the input of a key is prevented from being detected during the searching operation, but the input of a key is allowed to be detected during the press and hold operation. Thus, in the second embodiment, use of the delta value determination process implements the input state determination process by preventing the input of a key from being detected during the searching operation and by allowing the input of a key to be detected during the press and hold operation.

In this way, according to the second embodiment, the input state determination process is performed by combining the delta value determination process and the differential delta value determination process, and thus the input of a key is prevented from being detected during the searching operation, and the input of a key is allowed to be detected during the fingertip keystroke operation and the press and hold operation.

Figure 19:
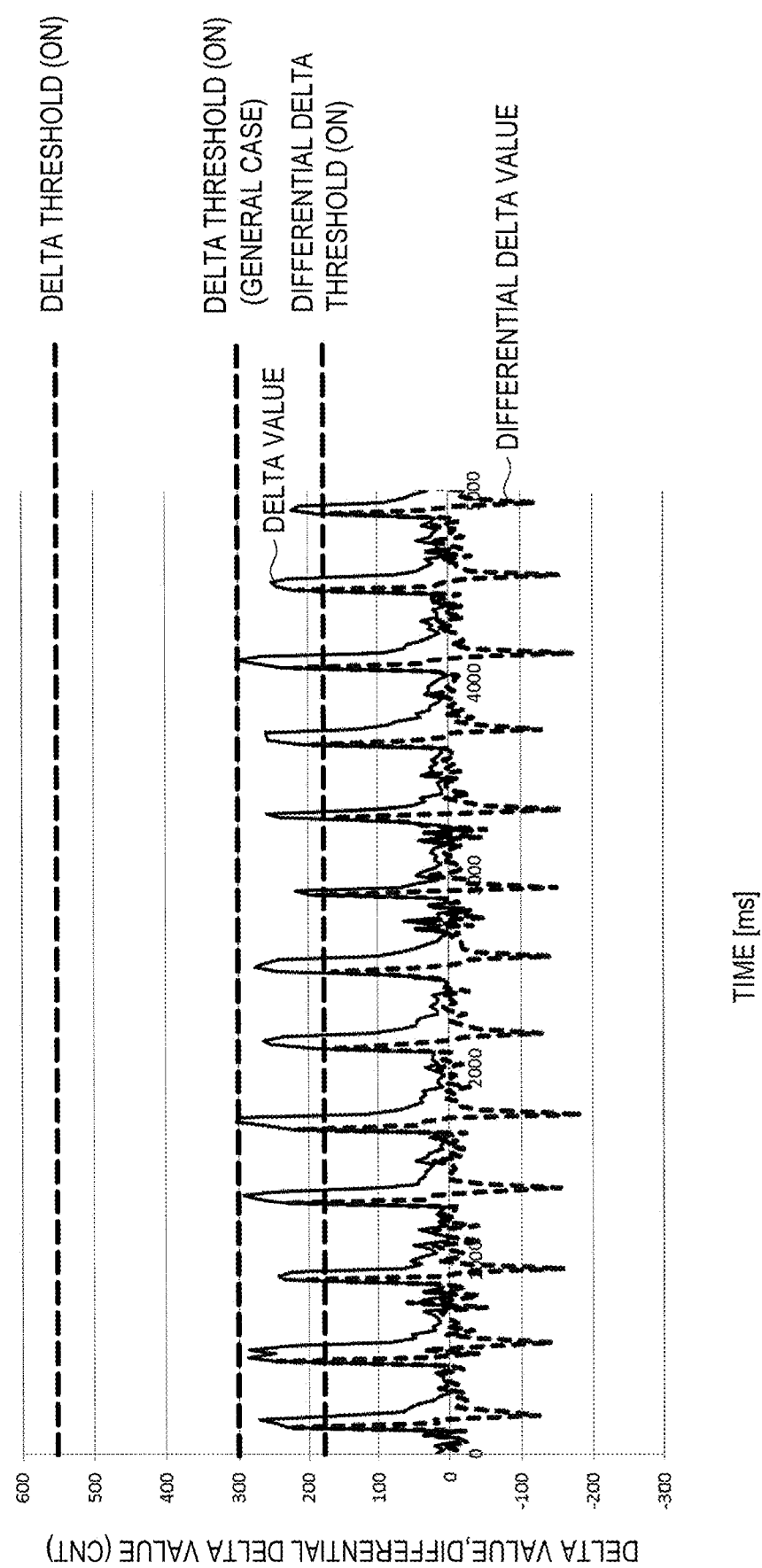
FIG. 19 is a graph showing an example of a delta value and a differential delta value detected at a node of the input device during a fingertip keystroke operation.
Figure 20:
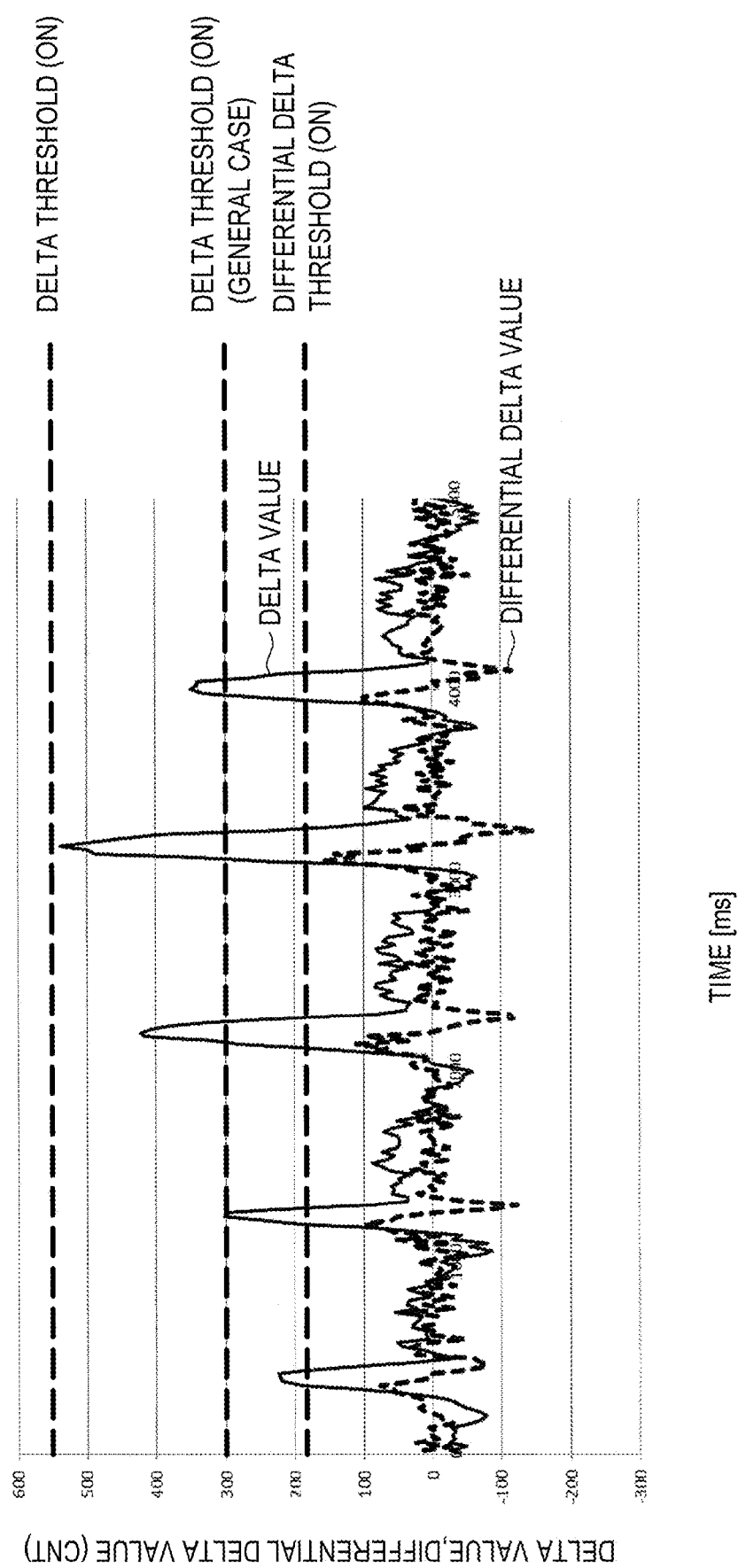
FIG. 20 is a graph showing an example of a delta value and a differential delta value detected at a node of the input device during a searching operation.
Figure 21:
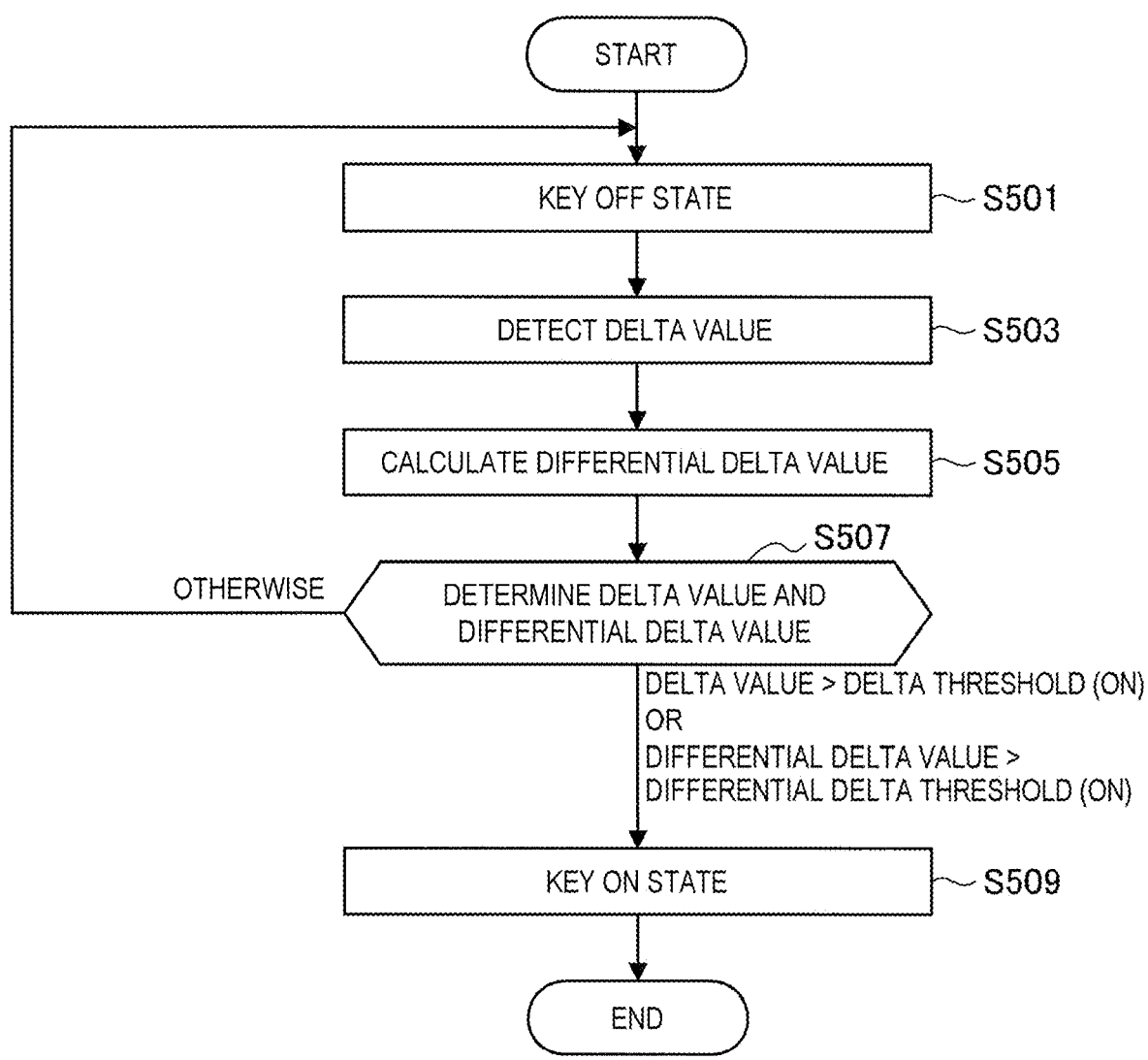
FIG. 21 is a flowchart illustrating the processing steps in a KEY ON detection process according to a second embodiment.

The KEY ON detection process according to the second embodiment will be described in detail with reference to FIGS. 19 to 21. FIG. 19 is a graph showing an example of a delta value and a differential delta value detected at a given node of the input device during the fingertip keystroke operation. FIG. 20 is a graph showing an example of a delta value and a differential delta value detected at a given node of the input device during the searching operation. FIG. 21 is a flowchart illustrating the processing steps in the KEY ON detection process according to the second embodiment.

In FIGS. 19 and 20, the horizontal axis represents time [ms], the vertical axis represents a delta value and a differential delta value at a given node in the input device 1, and the relationship between the two is plotted. In FIGS. 19 and 20, as an example, the delta value and the differential delta value of one node included in the key "K" are plotted.

In the second embodiment, two different thresholds are set as a threshold to detect the KEY ON state. In other words, a delta threshold (ON) that is a threshold to be compared with a delta value and a differential delta threshold (ON) that is a threshold to be compared with a differential delta value are set. In the example shown in FIGS. 19 and 20, the delta threshold (ON) and the differential delta threshold (ON) are set to 550 (CNT) and 180 (CNT), respectively. In the second embodiment, if the delta value is greater than the delta threshold (ON) in the delta value determination process or if the differential delta value is greater than the differential delta threshold (ON) in the differential delta value determination process, the input state of the key is determined to be the KEY ON state. In FIGS. 19 and 20, for a reference, it has been shown the lines indicating a threshold (300 (CNT)) that may be typically used to determine the KEY ON state in the delta value determination process.

For example, referring to FIG. 19, the delta value at a node corresponding to the key does not exceed the delta threshold (ON), but the differential delta value exceeds the differential delta threshold (ON) during the fingertip keystroke operation. Thus, the input state of the key may be determined to be the KEY ON state. On the other hand, referring to FIG. 20, the delta value at a node corresponding to the key does not exceed the delta threshold (ON), but the differential delta value does not exceed the differential delta threshold (ON) during the searching operation. Thus, the input state of the key may be determined to be in the KEY OFF state. In this way, according to the second embodiment, a situation is achieved in which the input of a key is prevented from being detected during the searching operation and the input of a key is allowed to be detected during the fingertip keystroke operation. When the delta value determination process is performed using a threshold (300 (CNT)) that may be typically used, the key input will be detected during the searching operation, and thus it is found that the above-mentioned desired situation does not be achieved.

As described above, the searching operation may have a relatively large pressing force but a relatively low pressing speed to a key. The fingertip keystroke operation may have a relatively small pressing force but a relatively high pressing speed to a key. Thus, in the second embodiment, the differential delta threshold (ON) is set as appropriate to be a value in which the differential delta value is allowed to be detected during the fingertip keystroke operation, but is prevented from being detected during the searching operation. The determination of the KEY ON state using the differential delta value determination process prevents the key input from being detected during the searching operation and allows the key input to be detected during the fingertip keystroke operation.

On the other hand, the press and hold operation is a state in which a key intended to be inputted by the user is pressed and the searching operation is a state in which the finger is placed on a key that is not intended to be inputted by the user, and thus the delta value during the press and hold operation is expected to be greater than the delta value during the searching operation. Thus, in the second embodiment, the delta threshold (ON) is set as appropriate to be a relatively large value in which the delta value is allowed to be detected during the press and hold operation, but is prevented from being detected during the searching operation. The determination of the KEY ON state using the delta value determination process prevents the key input from being detected during the searching operation and allows the key input to be detected during the press and hold operation.

In this way, in the second embodiment, the delta threshold (ON) and the differential delta threshold (ON) are set as appropriate, and the determination of the KEY ON state is performed using a combination of the delta value determination process and the differential delta value determination process. Thus, operations having different properties, such as the fingertip keystroke operation, the searching operation, and the press and hold operation, can be distinguished from each other, and it is possible to detect only the key input using a particular operation. For example, the differential delta threshold (ON) may be set based on the differential delta value detected when the user actually presses a key, and the delta threshold (ON) may be set based on the delta value detected when the user actually presses and holds a key. Thus, it is possible to perform a process of improving the usability, for example, in a way so that the input of a key is allowed to be detected only when an operation on a key intended to be inputted by the user, such as the fingertip keystroke operation and the press and hold operation, is performed and the input of a key is prevented from being detected when an operation on a key that is not intended to be inputted by the user, such as the searching operation, is performed. The delta threshold (ON) and the differential delta threshold (ON) shown in FIG. 20 are merely illustrative, and may be set as appropriate in consideration of the configuration of the input device 1 and the property of the operation intended for differentiation as described above.

Although not shown in FIGS. 19 and 20, even in the KEY ON detection process according to the second embodiment, the dual threshold described in the above item 4-3 "Reduction in Chattering" may be applied as a delta threshold in a similar way to the first embodiment. Use of the dual threshold as a delta threshold allows the occurrence of chattering to be prevented, thereby achieving a higher convenience of use.

The processing steps of the KEY ON detection process according to the second embodiment will be described with reference to FIG. 21. Referring to FIG. 21, in the KEY ON detection process according to the second embodiment, the input state of a target key is in the KEY OFF state (step S501).

A delta value is detected at a predetermined sampling rate (step S503), and then a differential delta value is calculated based on the detected delta value (step S505). The delta value determination process and the differential delta value determination process are performed based on the delta value and the differential delta value (step S507). In the process performed in step S507, the delta value is compared with the delta threshold (ON), and the differential delta value is compared with the differential delta threshold (ON). If the delta value is greater than the delta threshold (ON) or the differential delta value is greater than the differential delta threshold (ON), the input state of the key is determined to be the KEY ON state; otherwise, the input state of the key is determined to be in the KEY OFF state.

In the second embodiment, the differential delta threshold (ON) is set as appropriate to be a value in which the differential delta value is allowed to be detected during the fingertip keystroke operation, but is prevented from being detected during the searching operation. The delta threshold (ON) is set as appropriate to be a value in which the delta value is allowed to be detected during the press and hold operation, but is prevented from being detected during the searching operation. Thus, in the process performed in step S507, the key input is prevented from being detected during the operation that is not intended to be inputted by the user such as the searching operation, and the key input is preferably allowed to be detected during the operation that is intended to be inputted by the user such as the fingertip keystroke operation and the press and hold operation.

If the input state is determined to be the KEY ON state in step S507, the input state of the key is shifted from the KEY OFF state to the KEY ON state (step S509), and then a series of steps in the KEY ON detection process according to the second embodiment are ended. Information regarding the key in which an input is detected is supplied to a host device.

On the other hands, if the input state is determined to be in the KEY OFF state in step S507, the process returns to step S501. In other words, the KEY OFF state is maintained as the input state of the key (step S501), and the differential delta value calculation process, the delta value determination process, and the differential delta value determination process are repeated based on the delta value detected at the subsequent sampling timing (steps S503, S505, and S507).

The processing steps of the KEY ON detection process according to the second embodiment have been described with reference to FIG. 21. As described above, according to the second embodiment, the delta threshold (ON) and the differential delta threshold (ON) are set as appropriate, and the determination of the KEY ON state is performed using a combination of the delta value determination process and the differential delta value determination process. Thus, operations having different properties, such as the fingertip keystroke operation, the searching operation, and the press and hold operation, can be distinguished from each other, and it is possible to detect only the key input using a particular operation. Accordingly, it is possible to preferably detect only the key input using the operation on a key intended to be inputted by the user, thereby improving the usability.

In the description of the second embodiment, the terms "fingertip keystroke operation", "searching operation", and "press and hold operation" as used herein are intended to be used for convenience to indicate input operations having different properties. These terms do not necessarily mean an operation of pressing a key with a fingernail, an operation of searching a key with a finger, or an operation of pressing a key for a long time. The "fingertip keystroke operation" is an example that represents an operation having a property in which the pressing force to a key is relatively small and the pressing speed to a key is relatively fast. The "searching operation" is an example that represents an operation having a property in which the pressing force to a key is relatively large and the pressing speed to a key is relatively slow. The "press and hold operation" is an example that represents an operation having a property in which the pressing speed to a key is extremely slow (approximately zero) and the pressing force to a key is even greater than that of the searching operation. In the description above and below, "fingertip keystroke operation", "searching operation", and "press and hold operation" may be interchangeable with other operations having a similar property.

5-3. Combination of KEY ON Detection Process and KEY OFF Detection Process

The input state determination process in which the KEY OFF detection process according to the first embodiment and the KEY ON detection process according to the second embodiment are combined will be described. In the input state determination process, the KEY OFF detection process and the KEY ON detection process are both performed, and thus the effect obtainable from the first embodiment and the effect obtainable from the second embodiment can be achieved together, resulting in further improvement in the usability.

Figure 22:
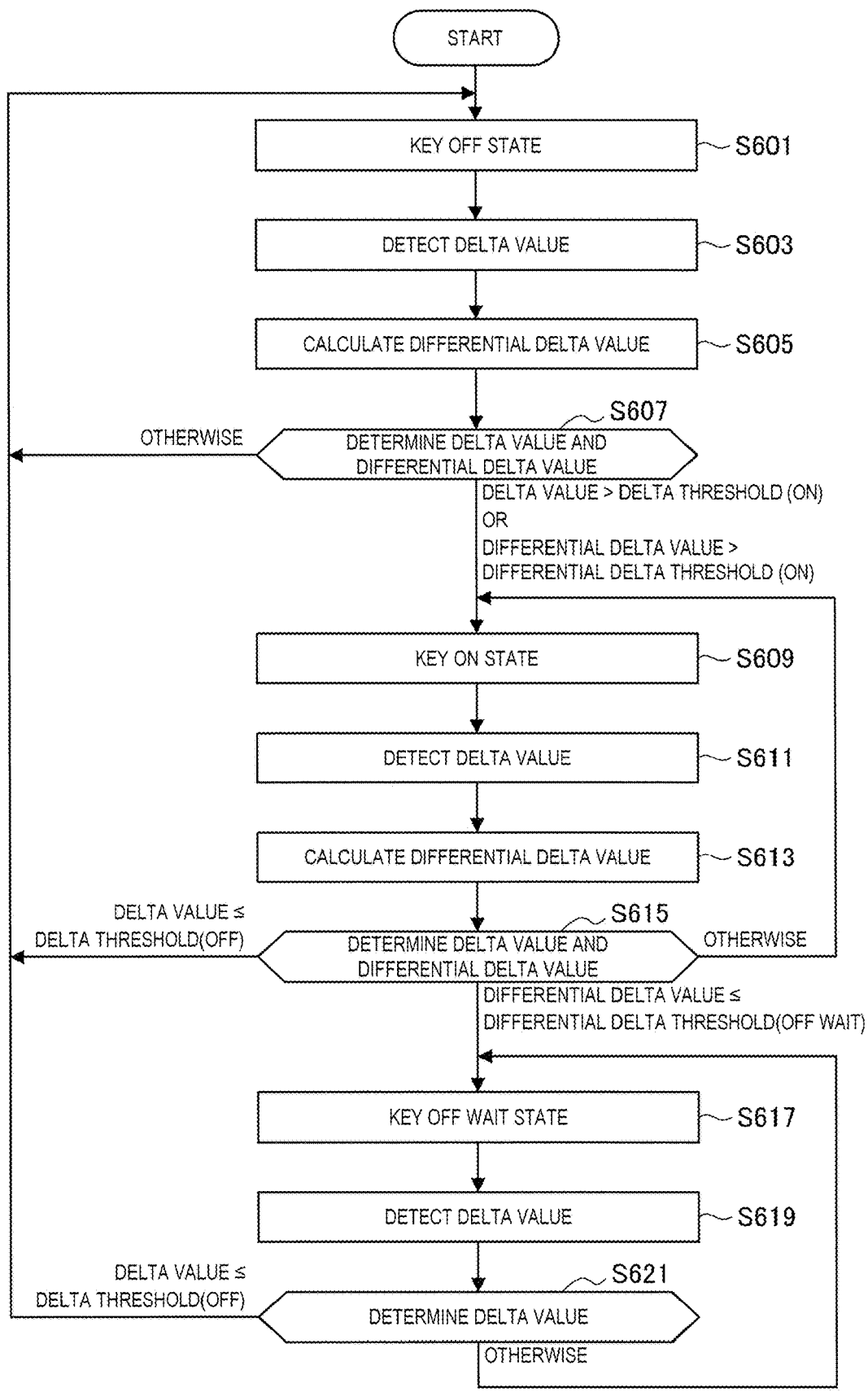
FIG. 22 is a flowchart illustrating an example of the processing steps in an input state determination process that is a combination of the KEY OFF detection process according to the first embodiment and the KEY ON detection process according to the second embodiment.

The processing steps of the input state detection process that is a combination of the KEY OFF detection process according to the first embodiment and the KEY ON detection process according to the second embodiment will be described with reference to FIG. 22. FIG. 22 is a flowchart illustrating an example of the steps in an input state determination process that is a combination of the KEY OFF detection process according to the first embodiment and the KEY ON detection process according to the second embodiment. The steps shown in FIG. 21 (steps S601 to S621) are corresponded to a combination of the steps in the KEY ON detection process according to the second embodiment shown in FIG. 21 and the steps in the KEY OFF detection process according to the first embodiment shown in FIG. 15, and thus repeated detailed description will be omitted.

Referring to FIG. 22, in steps S601 to 607, the process similar to the steps S501 to S507 in the KEY ON detection process according to the second embodiment described with reference to FIG. 21 is performed. In other words, in the KEY OFF state (step S601), a delta value is detected at a predetermined sampling rate (step S603), and a differential delta value is calculated based on the detected delta value (step S605). Then, the delta value determination process and the differential delta value determination process are performed based on the delta value and the differential delta value (step S607).

In the process performed in step S607, similarly to the process performed in step S507 shown in FIG. 21, if the delta value is greater than the delta threshold (ON) or the differential delta value is greater than the differential delta threshold (ON), the input state of the key is determined to be the KEY ON state; otherwise, the input state of the key is determined to be in the KEY OFF state. In step S607, the differential delta threshold (ON) is set to be a value in which the differential delta value is allowed to be detected during the fingertip keystroke operation, but is prevented from being detected during the searching operation, and the differential delta threshold (ON) is set to be a value in which the delta value is allowed to be detected during the press and hold operation, but is prevented from being detected during the searching operation. Thus, in the processing performed in step S607, the key input is prevent from being detected during the operation that is not intended to be inputted by the user such as the searching operation, and the key input is preferably allowed to be detected during the operation that is intended to be inputted by the user such as the fingertip keystroke operation and the press and hold operation. In this way, it is possible to preferably detect only the key input using the operation on a key intended to be inputted by the user, thereby improving the usability.

If the input state is determined to be in the KEY OFF state in step S607, the process returns to step S601. In other words, the KEY OFF state is maintained as the input state of the key (step S601), and the differential delta value calculation process, the delta value determination process, and the differential delta value determination process are repeated based on the delta value detected at the subsequent sampling timing (steps S603, S605, and S607).

On the other hand, if the input state is determined to be the KEY ON state in step S607, the input state of the key is shifted from the KEY OFF state to the KEY ON state (step S609). Information regarding the key in the KEY ON state is supplied to a host device.

The process performed in the next steps S611 to S621 corresponds to the process performed in steps S409 to S419 in the KEY ON detection process according to the first embodiment shown in FIG. 15, and thus detailed description thereof will be omitted. In the process performed in steps S611 to S621, the delta value determination process using the delta threshold (OFF) and the differential delta value determination process using the differential delta threshold (OFF WAIT) are performed, and if the differential delta value becomes less than or equal to the differential delta threshold (OFF WAIT), then the input state of the key is shifted to the KEY OFF WAIT state, and if the delta value becomes less than or equal to the delta threshold (OFF), then the input state of the key is shifted to the KEY OFF state. As described in the item 4 "First Embodiment" (KEY OFF detection process), the introduction of the KEY OFF WAIT state allows the period of time during the KEY ON state to be substantially equal to the period of time during which the finger is in contact with the key region 10a, and thus it is possible to determine the input state of a key to comply with the user's actual operation. As a result, it is possible to prevent an erroneous detection of a key such as a case where a key will be inputted by the repeat key function, for example, even after the finger is removed from the key.

The input state detection process that is a combination of the KEY OFF detection process according to the first embodiment and the KEY ON detection process according to the second embodiment has been described with reference to FIG. 22. As described above, the both effects can be achieved together by combining the first and second embodiments, and the usability can be further improved.

6. Third Embodiment (Normalized Delta Value Determination Process)

A preferred embodiment in the case where a process of determining the input state of a key (normalized delta value determination process) using a normalized delta value obtained by normalizing a delta value in the input state determination process will be described as a third embodiment of the present disclosure. In the normalized delta value determination process, the comparison of a normalized delta value with a predetermined threshold (normalized delta threshold) allows the input state of the key to be determined.

6-1. Background leading to Third Embodiment

Prior to a detailed description of the third embodiment, a background that leads to the input state determination process according to the third embodiment made by the inventors of the present disclosure is described. In the third embodiment, similarly to the first and second embodiments, the input state determination process on the input device 1 described in the above item 1 "Configuration of Input Device" is performed. As described above with reference to FIGS. 1 to 5, the appropriate adjustment of the arrangement of the electrode wires 210 and 220 allows the number of the capacitive elements C1 (that is, the number of nodes) disposed at each node to be adjusted.

A case in which a plurality of nodes are provided in a single key will be described. In this case, as described above with reference to FIGS. 9 and 10, when the delta value determination process using the OR operation is performed, if a delta value of any one node in the key exceeds the threshold, the input state of the key may be determined to be the KEY ON state, and thus it is possible to improve the accuracy of key input detection.

On the other hand, a delta value at a node is an amount of variation in capacitance at the node, and inconsistency may be occurred at each node due to manufacturing inconsistency in forming the capacitive element C1 even when a substantial similar pressing force is applied. Thus, in the delta value determination process shown in FIGS. 9 and 10 described above, an input of a key may be detected with higher accuracy when a given region in the key is pressed, but if another region in the key is pressed, an input of the key may be difficult to be detected. In other words, when a plurality of nodes are provided in a key, the sensitivity distribution characteristics in a key is likely to be deteriorated due to the inconsistency of a delta value at each node. The sensitivity distribution characteristics in a key may be likely to be deteriorated due to the arrangement position of nodes in the key.

Figure 23:
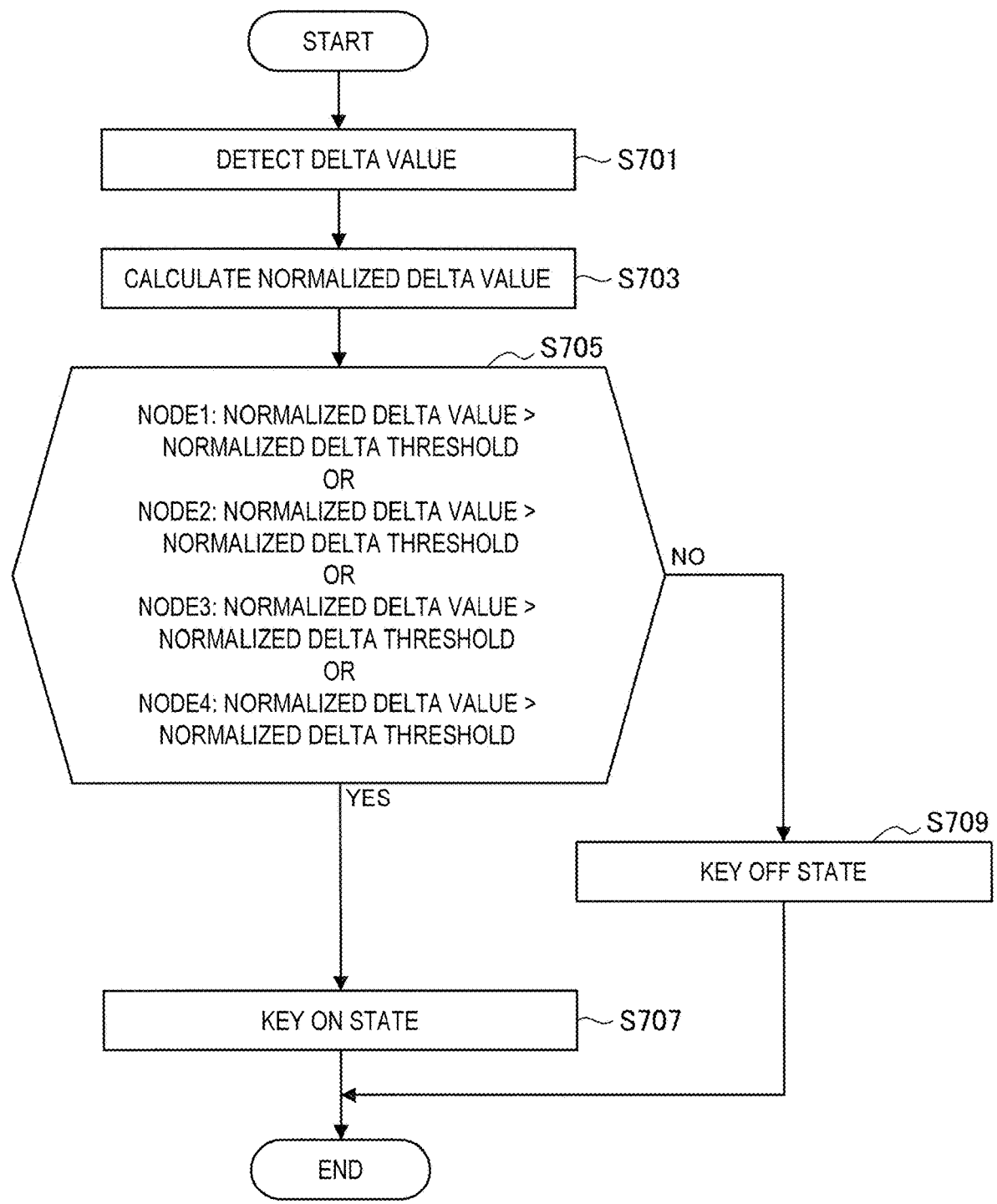
FIG. 23 is a flowchart illustrating an example of the processing steps in a normalized delta value determination process (NOM-OR determination process)
Figure 25:
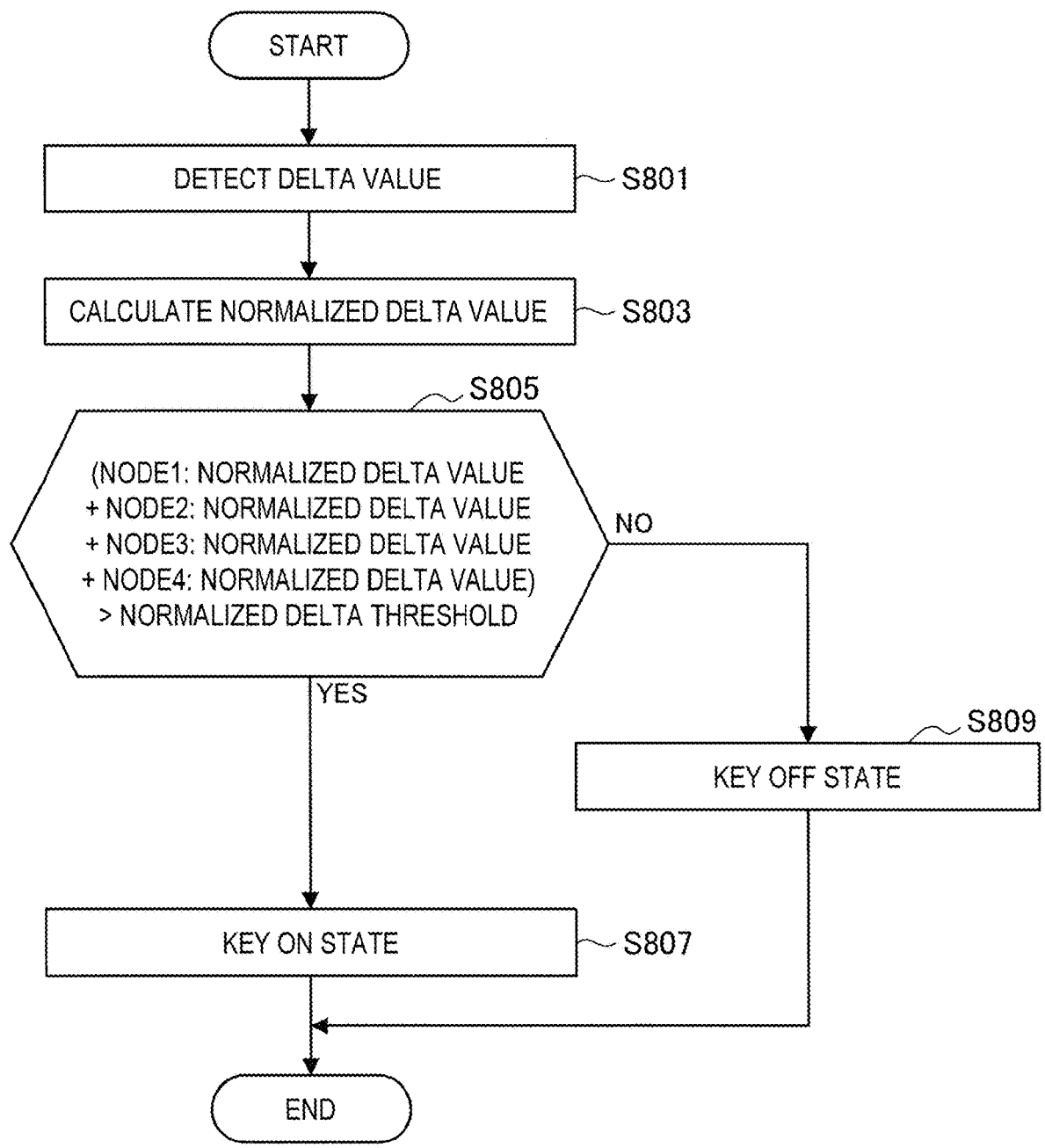
FIG. 25 is a flowchart illustrating an example of the processing steps in a normalized delta value determination process (NOM-SUM determination process) according to a third embodiment.

In the delta value determination process shown in FIGS. 9 and 10, the comparison of the detected delta value with a threshold (this delta value determination process is also referred to as "RAW-OR determination process" to distinguish it from the normalized delta value determination process shown in FIGS. 23 and 25). In this case, the detected delta value is used without any change (in other words, using raw data of a delta value). On the other hand, as a method for improving the sensitivity distribution characteristics in a key as described above, it may be conceivable to perform a normalized delta value determination process using a normalized delta value.

The processing steps of the normalized delta value determination process will be described with reference to FIG. 23. FIG. 23 is a flowchart illustrating an example of the steps in a normalized delta value determination process (NOM-OR determination process). The normalized delta value determination process shown in FIG. 23 is also referred to as "NOM-OR determination process" to distinguish it from the delta value determination process (RAW-OR determination process) shown in FIG. 10 and the normalized delta value determination process shown in FIG. 25.

In FIG. 23, as an example, steps of performing the NOM-OR determination process on a key provided with four nodes are illustrated. Referring to FIG. 23, in the NOM-OR determination process, a delta value at each node included in a key is detected (step S701), and a normalized delta value is calculated based on the detected delta value (step S703). A method for normalizing a delta value is not particularly limited, and a reference value used upon normalization or a method for normalization may be set as appropriate.

The normalized delta value is compared with a normalized delta threshold for each node included in a key (step S705). In the example shown in FIG. 23, if a normalized delta value for any one of nodes 1 to 4 is greater than the normalized delta threshold, an input state of the key is determined to be the KEY ON state, and the input state of the key is set to the KEY ON state (step S707). On the other hand, if none of normalized delta values of nodes 1 to 4 exceeds the normalized delta threshold, an input state of the key is determined to be in the KEY OFF state, and the input state of the key is set to the KEY OFF state (step S709).

With the normalization of a delta value, even at a node having low detection sensitivity of the delta value, for example, due to inconsistency of the capacitive element C1, the delta value at the node can be changed to a value greater than, for example, raw data, and thus it is likely to prevent the deterioration in the sensitivity distribution characteristics in a key due to the inconsistency of the delta value for each node by appropriately setting a reference value used at the time of normalization or a normalized delta threshold. In this regard, the inventors of the present disclosure have conducted the experiment to investigate sensitivity distribution characteristics in a case where the NOM-OR determination process shown in FIG. 23 is applied to the input state determination process in the input device 1.

Figure 24:
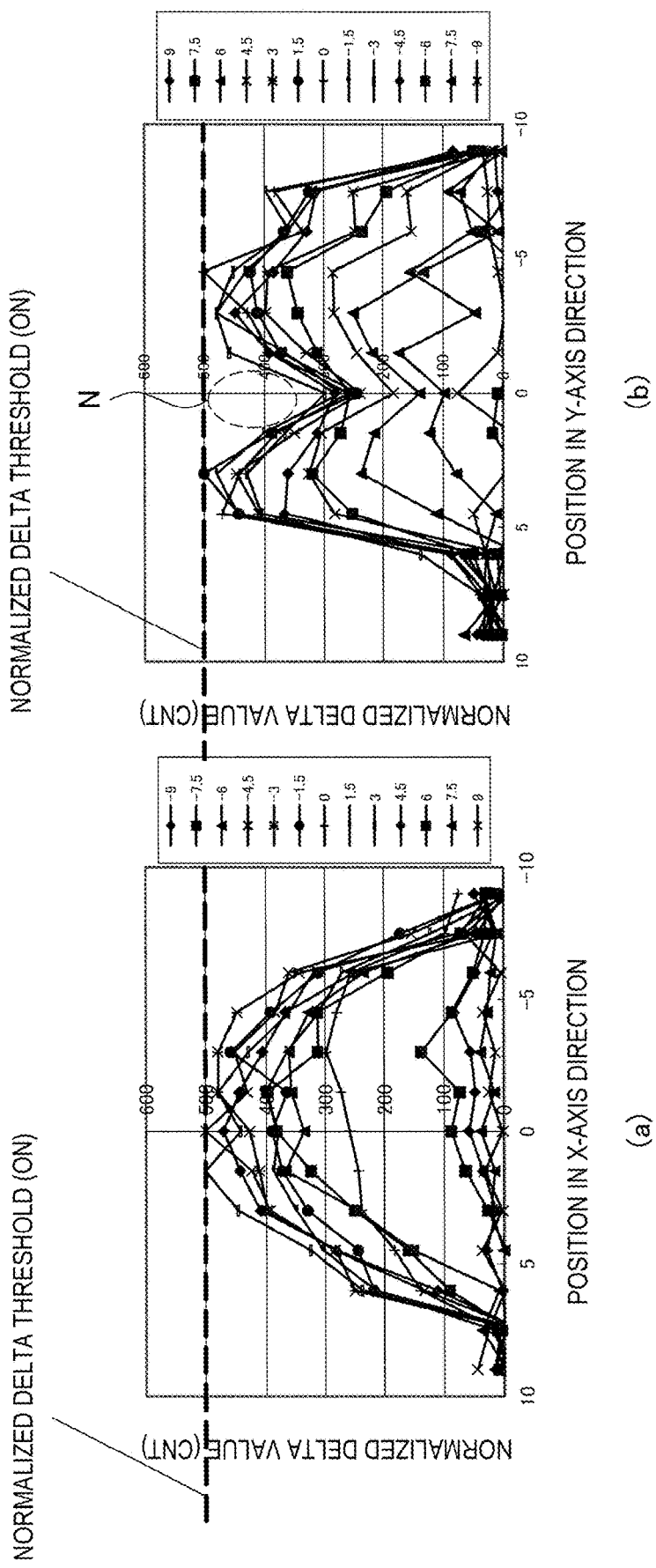
FIG. 24 is a graph showing the sensitivity distribution characteristics in a key of the input device in the case where the NOM-OR determination process is applied to the input state determination process.

FIG. 24 shows the experimental results. FIG. 24 is a graph showing the sensitivity distribution characteristics in a key of the input device 1 in the case where the NOM-OR determination process is applied to the input state determination process. In the experiment, in the input device 1, a key (specifically, key "K") was pressed using a tool (stylus) with a narrow distal end having a curvature of approximately 1.5 [mm]. The pressing position in the key was changed while the pressing force is kept constant (for example, 30 [gF]), and a delta value for each pressing position was detected. In the input device 1 used in the experiment, two nodes are arranged side by side in the Y-axis direction (see FIGS. 1 and 5) in the key "K" across nearly the center of the key region 10a. The graph of FIG. 24 is obtained by normalizing a delta value at these two nodes and by plotting a normalized delta value having a larger value.

In FIG. 24(a), the horizontal axis represents a position in a straight line parallel to X-axis direction passing through a key (hereinafter, referred simply to as "position in X-axis direction"), the vertical axis represents a normalized delta value, and the relationship between the two is plotted. In FIG. 24(b), the horizontal axis represents a position in a straight line parallel to Y-axis direction passing through a key (hereinafter, referred simply to as "position in Y-axis direction"), the vertical axis represents a normalized delta value, and the relationship between the two is plotted. In the positions in the X-axis and Y-axis directions, the center of the key is zero. In FIG. 24(a), the position in the Y-axis direction is set as a parameter, and normalized delta values at different positions in the Y-axis direction are plotted. In FIG. 24(b), the position in the X-axis direction is set as a parameter, and normalized delta values at different positions in the X-axis direction are plotted.

Referring to FIG. 24(a) and FIG. 24(b), it can be found that, near the center of the key, a normalized delta value is smaller than that of other positions and there is a region having low sensitivity (region N in FIG. 24(b)). The region N corresponds to the middle region of two nodes provided in the key. In this way, from the results shown in FIG. 24, it was found that the deterioration in the sensitivity distribution characteristics in a key due to the arrangement position of nodes in the key may not be substantially prevented in the input device 1 used in the experiment when the NOM-OR determination process is applied as the input state determination process. Thus, when inconsistency of the sensitivity distribution in the key is relatively large, if an operation input having a relatively small contact region with the key, such as a fingertip keystroke, is performed, then the operation input may not be detected with higher accuracy, and for example, a key intended to be inputted by the user may not be entered.

In view of the experimental results, in the input device 1, there is a demand for a technology that further improves the sensitivity distribution characteristics in a key, thereby improving the usability. The inventors of the present disclosure have studied the configuration capable of improving the sensitivity distribution characteristics in a key in the input device 1, and then a third embodiment described below was developed. The third embodiment will be described in detail.

6-2. Detailed Description of Normalized Delta Value Determination Process (NOM-SUM Determination Process)

In the third embodiment, the normalized delta value determination process is performed using the sum of normalized delta values at a node included in a key. The normalized delta value determination process according to the third embodiment is also referred to as "NOM-SUM determination process" to distinguish from the delta value determination process (RAW-OR determination process) shown in FIG. 10 and the NOM-OR determination process shown in FIG. 24.

The processing steps of the NOM-SUM determination process that is the normalized delta value determination process according to the third embodiment will be described with reference to FIG. 25. FIG. 25 is a flowchart illustrating an example of processing steps in a normalized delta value determination process (NOM-SUM determination process) according to the third embodiment.

In FIG. 25, as an example, the processing steps of performing the NOM-SUM determination process on a key provided with four nodes are illustrated. Referring to FIG. 25, in the NOM-SUM determination process, a delta value at each node included in a key is detected (step S801), and a normalized delta value is calculated based on the detected delta value (step S803). A method for normalizing a delta value is not particularly limited, and a reference value used upon normalization or a method for normalization may be set as appropriate.

The normalized delta value is compared with the sum of a normalized delta value at each node included in a key (step S805). The normalized delta threshold used in step S805 is different from the normalized delta threshold shown in FIG. 23. The normalized delta threshold is appropriately selected as a value that can be preferably used to determine the KEY ON state or the KEY OFF state when compared with the sum of a normalized delta value for each node. If the sum of normalized delta values at nodes 1 to 4 is greater than the normalized delta threshold, the input state of the key is determined to be the KEY ON state, and thus the input state of the key is set to the KEY ON state (step S807). On the other hand, if the sum of normalized delta values at nodes 1 to 4 does not exceed the normalized delta threshold, the input state of the key is determined to be in the KEY OFF state, and the input state of the key is set to the KEY OFF state (step S809). In the example shown in FIG. 25, in the process performed in step S805, the sum of a normalized delta value at each node included in the key is compared with the normalized threshold, but an average value of a normalized delta value at each node included in a key may be compared with the normalized delta threshold. An average value is a value calculated by dividing the sum by the number of nodes, and thus even when an average is used, a similar result can be obtained by appropriately changing the normalized delta threshold.

Figure 26:
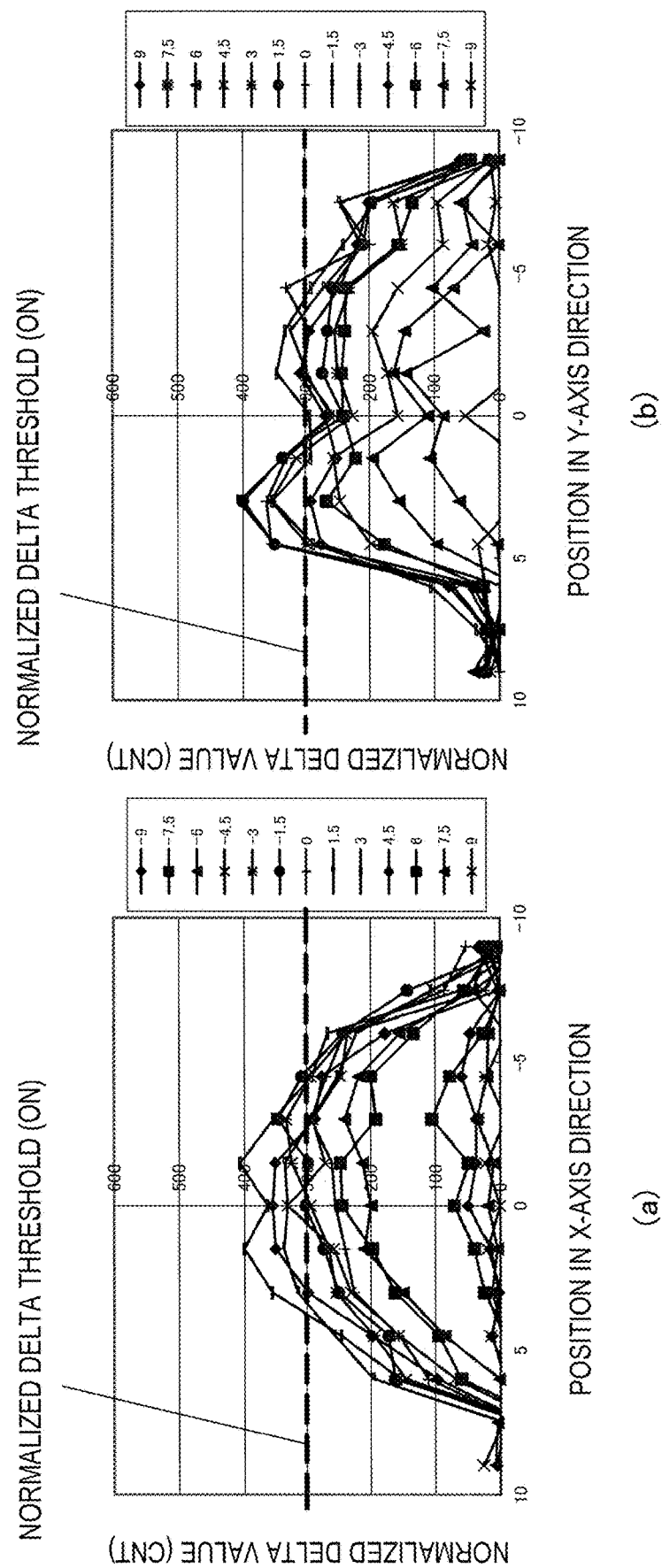
FIG. 26 is a graph showing the sensitivity distribution characteristics in a key of the input device in the case where the NOM-SUM determination process is applied to the input state determination process.

To check the effect of the NOM-SUM determination process according to the third embodiment, the sensitivity distribution characteristics in a key was investigated when the NOM-SUM determination process is applied to the input state determination process in the input device 1 in a similar way to the NOM-OR determination process. FIG. 25 shows the result of the investigation. FIG. 26 is a graph showing the sensitivity distribution characteristics in a key of the input device 1 in the case where the NOM-SUM determination process is applied to the input state determination process. In the graph shown in FIG. 26, the processing steps are similar to those of the graph shown in FIG. 24, but the input state determination process are different from each other, and thus description of the repeated processing steps will be omitted.

In FIG. 26(a), the horizontal axis represents a position in X-axis direction in a key, the vertical axis represents an average value of normalized delta values, and the relationship between the two is plotted. In FIG. 26(b), the horizontal axis represents a position in Y-axis direction in a key, the vertical axis represents an average value of normalized delta values, and the relationship between the two is plotted. In the positions in the X-axis and Y-axis directions, the center of the key is zero. In FIG. 26(a), the position in the Y-axis direction is set as a parameter, and an average value of normalized delta values at different positions in the Y-axis direction is plotted. In FIG. 26(b), the position in the X-axis direction is set as a parameter, and an average value of normalized delta values at different positions in the X-axis direction is plotted.

Referring to FIG. 26(a) and FIG. 26(b), it can be found that the deterioration of the sensitivity in the region N of the center of the key is reduced in FIG. 26(a), as compared to the case in which the NOM-OR determination process shown in FIG. 24(b) is applied. In this way, it can be found that, by applying the NOM-SUM determination process to the input state determination process, the sensitivity distribution characteristics in the key can be improved. Thus, according to the third embodiment, it is possible for the user to detect an operation input to a key with high accuracy. According to the third embodiment, when an operation input having a relatively small contact region with a key such as a fingertip keystroke is performed or when an operation input of pressing a region that is not disposed directly above a node in the key (for example, the region N) is performed, the operation input can be detected in a more reliable way, thereby improving the usability.

The NOM-SUM determination process according to the third embodiment may be preferably applied as a process in place of the delta value determination process in the KEY OFF detection process according to the first embodiment and the KEY ON detection process according to the second embodiment. In the case in which the KEY OFF detection process and the KEY ON detection process are performed, if the accuracy of delta value detection for an operation input by the user is small or if the inconsistency of delta value distribution in a key is large, the KEY OFF detection process and the KEY ON detection process may be difficult to be performed with high accuracy. The NOM-SUM determination process according to the third embodiment is used in place of the delta value determination process in the KEY OFF detection process according to the first embodiment and the KEY ON detection process according to the second embodiment, and thus it is possible to improve the accuracy of the input state determination process in the KEY OFF detection process and the KEY ON detection process. As a result, the KEY OFF detection process and the KEY ON detection process can be achieved in an appropriate manner to satisfy a demand for the usability.

7. Fourth Embodiment (Erroneous Detection Prevention Process)

A fourth embodiment of the present disclosure is intended to prevent an erroneous detection of a key input in the input device 1 using a method different from the first to third embodiments. In the fourth embodiment, various situations that may be occurred when a user performs an operation input to the input device 1 are assumed, and the input state determination process is changed as appropriate depending on such situations.

For example, as described above, in the KEY ON detection process according to the second embodiment, the delta threshold (ON) that is a threshold to be compared with a delta value and the differential threshold (ON) that is a threshold to be compared with a differential delta value are appropriately set. Thus, the key input using the searching operation is prevented, and the key input using the fingertip keystroke operation and the press and hold operation is allowed to be detected. In the second embodiment, it is assumed that the fingertip keystroke operation is an operation having a property in which the pressing force to a key is relatively small and the pressing speed to a key is relatively fast, the searching operation is an example that represents an operation having a property in which the pressing force to a key is relatively large and the pressing speed to a key is relatively slow, and the press and hold operation is an operation having a property in which the pressing speed to a key is extremely slow (approximately zero) and the pressing force to a key is even greater than that of the searching operation. Thus, in the second embodiment, for example, when an operation input such as "searching operation with larger pressing force" or "searching operation with higher speed" is performed, an erroneous detection of a key input may not be substantially reduced.

On the other hand, an operation input such as "searching operation with larger pressing force" or "searching operation with higher speed" is difficult to be assumed that this operation input is performed in the middle of a continuous keystroke such as a case in which texts are entered, but it is considered that this operation input can be mainly performed in a particular situation. In the fourth embodiment, even when such a particular operation input is performed, an erroneous detection of a key input is intended to be prevented as appropriate.

7-1. First Push Protect

It is considered a case in which the above-mentioned "searching operation with larger pressing force" can be performed. For example, when the user completely removes the hand from the input device 1 and then places the hand on the input device 1 to start a key input, it is assumed that the "searching operation with larger pressing force" can be performed.

Figure 27:
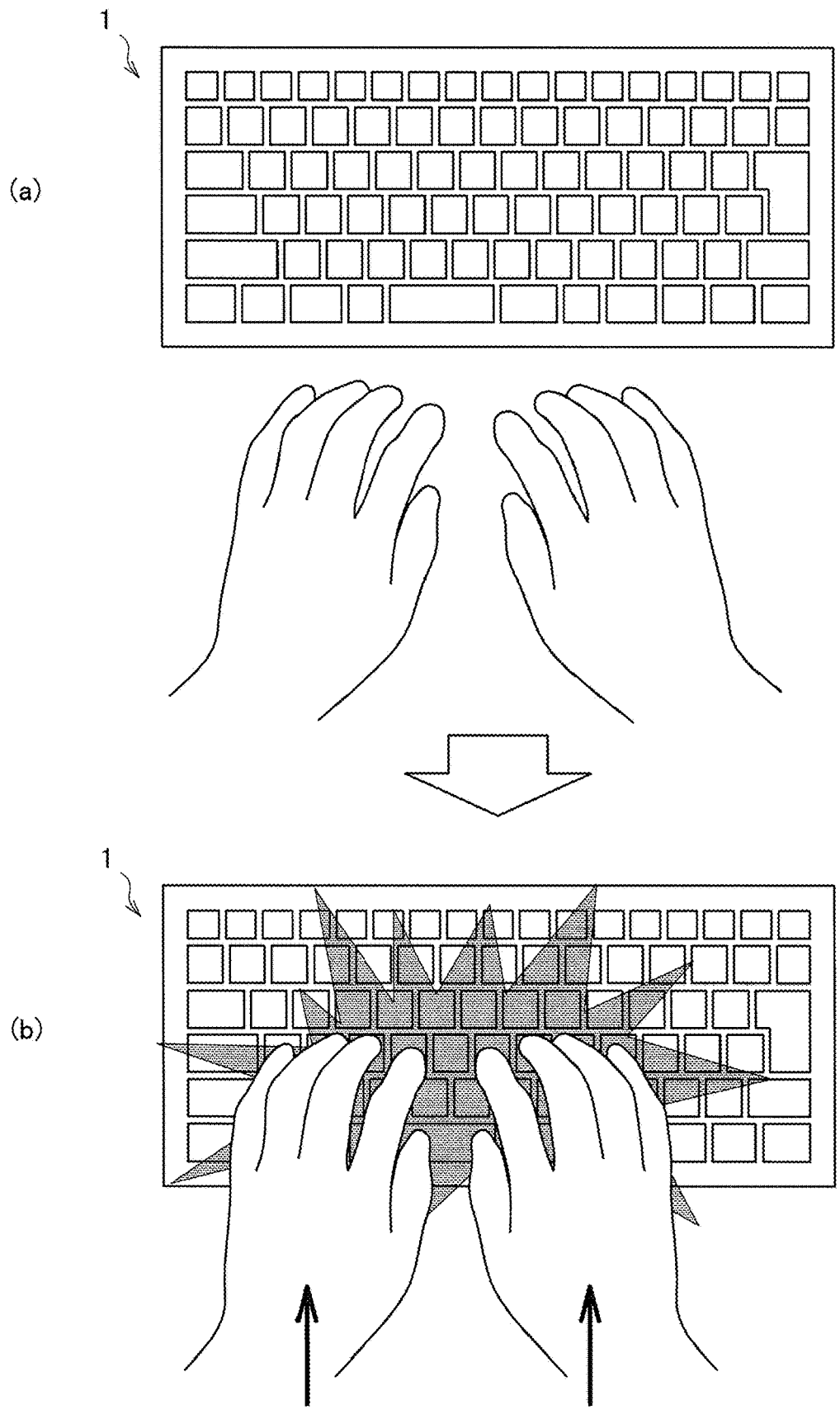
FIG. 27 is a schematic diagram illustrating the case where the user completely removes the hand from the input device and then places the hand on the input device.

FIG. 27 is a schematic diagram illustrating the case in which the user completely removes the hand from the input device 1 and then places the hand on the input device 1. For example, even in the middle of performing a key input by the user using the input device 1, when the user thinks a text to be inputted next, it is assumed that the hand of the user is removed from the input device 1 for a moment ((a) of FIG. 27). From this state, when the user resumes a key input, the user places the hand on the input device 1. In this case, a pressing force that is greater than when performing a continuous keystroke may be applied to the key ((b) of FIG. 27).

In the fourth embodiment, the input state determination condition is changed to a condition under which the detection of a key input is difficult only at the time of an initial keystroke that is performed from the state in which the user's hand is being removed from the input device 1. This prevents a key input from being detected during the act of placing the hand on the input device 1 prior to an initial keystroke, and allows only an initial key input entered by the intention of the user to be detected. For example, the state in which the user's hand is being removed from the input device 1 may be determined by the fact that a predetermined period of time (for example, two seconds) has elapsed in a state with no key input. The input state determination condition of difficulty in the detection of a key input may be a condition under which a threshold (delta threshold (ON)) for detecting the KEY ON state in the delta value determination process is greater than a case in which a normal continuous keystroke or a condition under which the differential delta value determination process is not performed.

Figure 28:
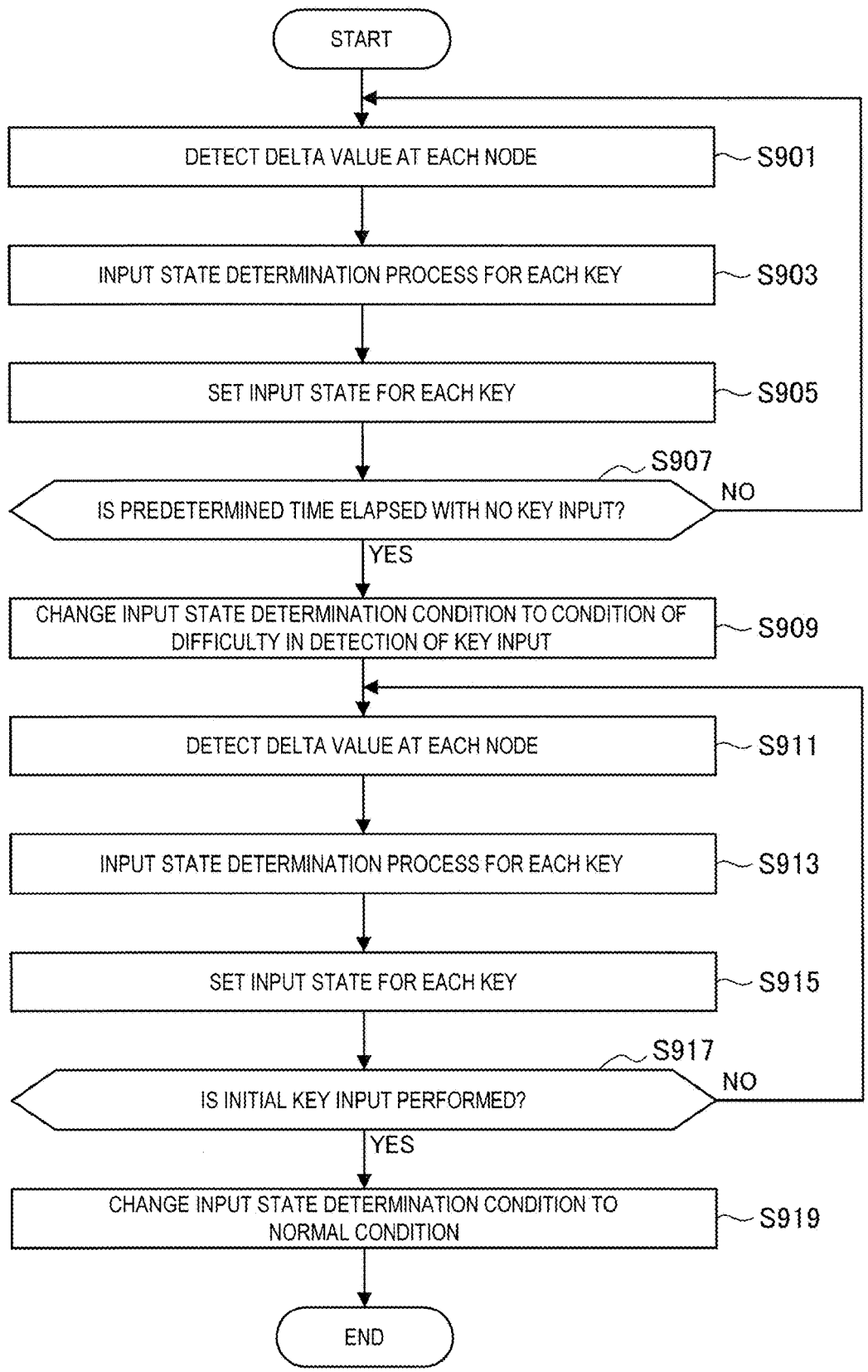
FIG. 28 is a flowchart illustrating an example of the processing steps in an erroneous detection prevention process corresponding to a "searching operation with larger pressing force" in a fourth embodiment.

The processing steps of the erroneous detection prevention process corresponding to the "searching operation with larger pressing force" according to the fourth embodiment will be described with reference to FIG. 28. FIG. 28 is a flowchart illustrating an example of the steps in an erroneous detection prevention process corresponding to a "searching operation with larger pressing force" in a fourth embodiment.

Referring to FIG. 28, in the erroneous detection prevention process, detection of a delta value for each key of the input device 1, the input state determination process of each key based on the delta value, and setting an input state for each key based on the determination results are performed at a predetermined sampling rate (steps S901, S903, and S905). When the process in step S903 is performed, as the input state determination condition for each key, the input state determination condition of difficulty in the detection of a key input is not set, but a normal input state determination condition may be set. It is determined whether a predetermined period of time has elapsed in a state with no key input based on the input state that is set in step S905 (step S907). This determination may be performed by, for example, the input state determination unit 114 shown in FIG. 7, based on the fact that the input state is not determined to be the KEY ON state for a predetermined period of time. The determination may be performed by, for example, the input state determination unit 114, based on the fact that a delta value is not detected in the delta value detection unit 111 for a predetermined period of time. The predetermined period of time may be set as appropriate, for example it is set to two seconds.

In step S907, if it is not determined that a predetermined period of time has elapsed in a state with no key input, it can be considered that it is in a state in which a continuous keystroke is performed by the user or it is in a state right after the user's hand is removed from the input device 1. Thus, the erroneous detection prevention process according to the fourth embodiment is not performed, and the process returns to step S901. Then, the input state determination process is performed based on a normal input state determination condition.

On the other hand, in step S907, if it is determined that a predetermined period of time has elapsed in a state with no key input, it is considered that the state is a state in which the user's hand is completely removed from the input device 1. In this case, the process proceeds to step S909, and the input state determination condition is changed to a condition under which a key input is difficult to be detected.

In the state in which the input state determination condition is changed to a condition under which a key input is difficult to be detected, the input state determination process is performed based on the delta value detected at the subsequent sampling timing (steps S911 and S913). The input state determination process in steps S903 and S913 may be a simple delta value determination process or differential delta value determination process, or it may be the KEY ON detection process, the KEY OFF detection process, and/or the normalized delta value determination process according to the first to third embodiments. In this way, the erroneous detection prevention process according to the fourth embodiment may be combined with the input state detection process according the first to third embodiment in an appropriate way.

The input state of the key corresponding to the node is set based on the results of the input state determination process (step S915). It is determined whether the input state of the key is the in the KEY OF state, that is, an initial key input is performed (step S917).

If it is determined that an initial key input is not performed in step S917, the process returns to step S911, and the input state determination process and the input state setting process are performed repeatedly based on the delta value detected at the subsequent sampling timing (steps S911, S913, and S915). On the other hand, if it is determined that an initial key input is performed in step S917, the process proceeds to step S919, and the input state determination condition is changed to a normal condition. This allows a smooth key input to be achieved in the subsequent keystrokes (that is the second and subsequent keystrokes).

The processing steps of the erroneous detection prevention process corresponding to the "searching operation with larger pressing force" according to the fourth embodiment have been described with reference to FIG. 28. As described above, according to the fourth embodiment, the input state determination condition is performed by the input state determination condition under which the detection of a key input is difficult only at the time of an initial keystroke that is performed from the state in which the user's hand is being removed from the input device 1. Thus, the action that the user places his hand on the input device 1 is less likely to be detected erroneously as the operation of performing a key input, and thus an erroneous detection of a key input may be prevented. As a result, a more comfortable usability is achieved for the user.

In the above, as a situation in which the "searching operation with larger pressing force" can be performed, there has been described the example in which the user completely removes the hand from the input device 1 and then places the hand on the input device 1 to start a key input. The fourth embodiment is not limited to this example. As a situation in which the "searching operation with larger pressing force" can be performed, other situations may be assumed. As a process of determining such situations, in the above, the process of determining whether a predetermined period of time has elapsed in a state with no key input, but this determination process may be changed as appropriate depending on a specific situation assumed as a situation in which the "searching operation with larger pressing force" can be performed.

7-2. Pre Sense Protect

A situation in which the "searching operation with higher speed" can be performed is considered. For example, when the user's hand is placed in a home position of the input device 1 and then slides to another key, the "searching operation with higher speed" is assumed to be performed.

Figure 29:
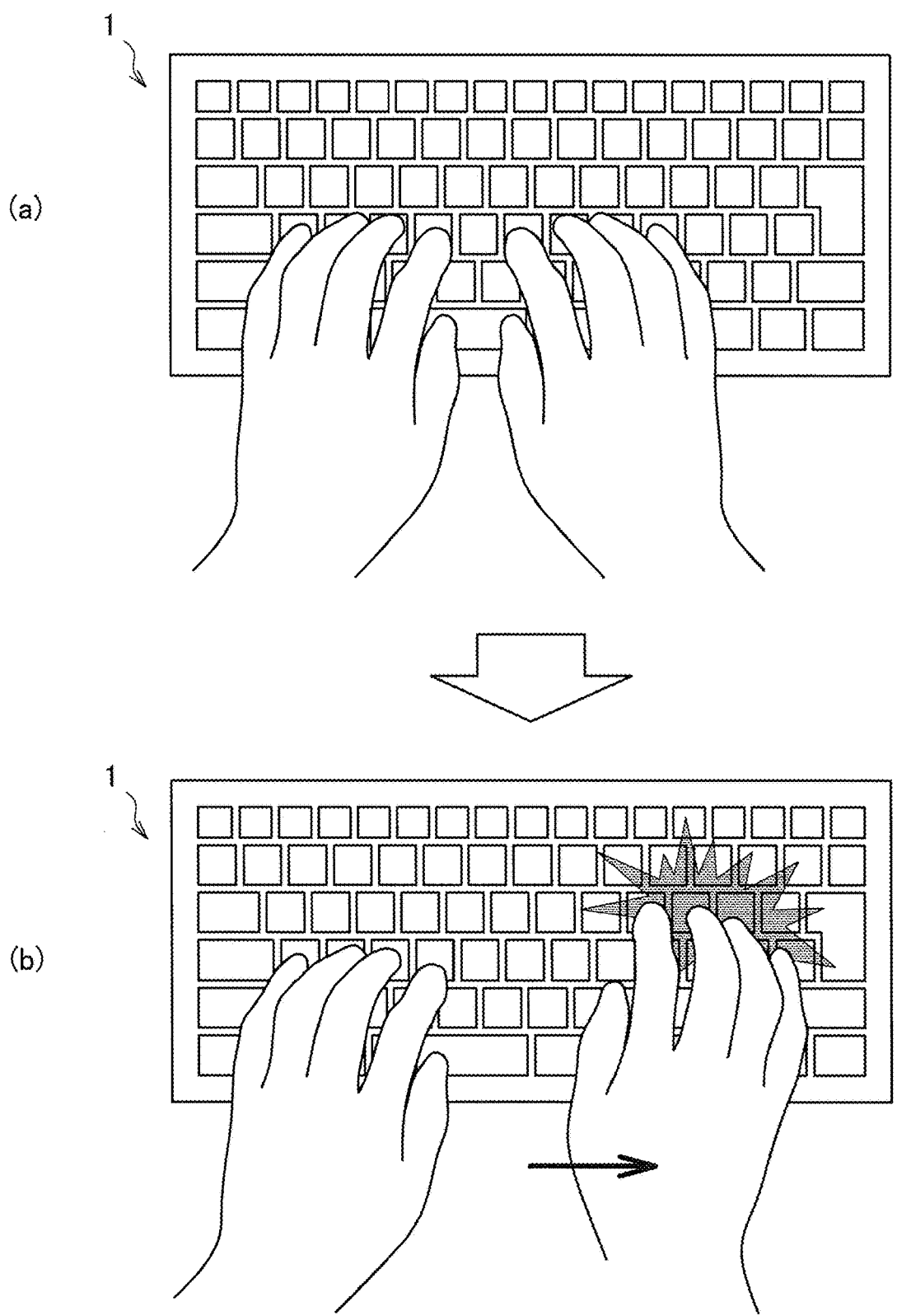
FIG. 29 is a schematic diagram illustrating the case in which a user's hand is placed in a home position and then slides to another key.

FIG. 29 is a schematic diagram illustrating the case in which a user's hand is placed in a home position of the input device 1 and then slides to another key. For example, when the key disposed at a position relatively far from the home position ((a) of FIG. 29) is pressed, it is assumed that the hand is quickly moved such as a tap on the surface of the input device 1 with the hand ((a) of FIG. 29). The example shown in FIG. 29 illustrates the case in which the user's hand is placed in a home position and then the user strokes the enter key located at the right end of the input device 1 with the little finger of the right hand.

In the fourth embodiment, the input state determination condition is changed to a condition under which a key input is difficult to be detected only when there are a predetermined number of fingers or more that do not press a key but in contact with a key. This prevents a key input from being detected during an action in which the hand quickly slides from the home position, and allows only a key input entered by the intention of the user to be detected. For example, the state in which there are a predetermined number of fingers or more that do not press a key but in contact with a key may be determined by the fact whether a delta value within a predetermined range (less than or equal to the threshold (ON) greater than zero) is detected in a predetermined number of nodes or more. The input state determination condition under which a key input is difficult to be detected may be a condition under which a threshold (delta threshold (ON)) for detecting the KEY ON state in the delta value determination process is greater than when a normal continuous keystroke or a condition under which the differential delta value determination process is not performed.

Figure 30:
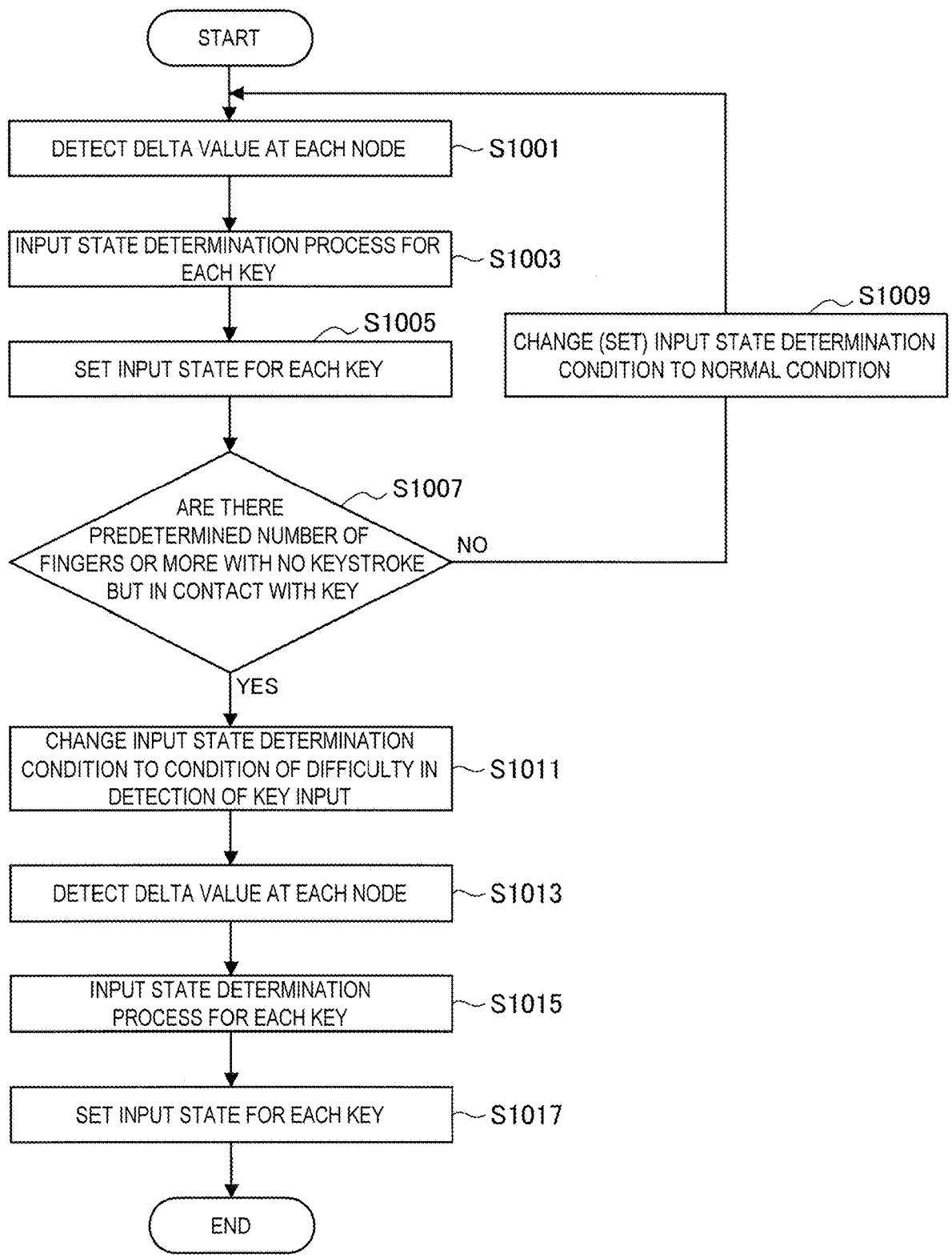
FIG. 30 is a flowchart illustrating an example of the processing steps in an erroneous detection prevention process corresponding to a "searching operation with higher speed" in a fourth embodiment.

The processing steps of the erroneous detection prevention process corresponding to the "searching operation with higher speed" according to the fourth embodiment will be described with reference to FIG. 30. FIG. 30 is a flowchart illustrating an example of the steps in the erroneous detection prevention process corresponding to a "searching operation with higher speed" in the fourth embodiment.

Referring to FIG. 30, in the erroneous detection prevention process, detection of a delta value for each key of the input device 1, the input state determination process for each key based on the delta value, and setting an input state for each key based on the determination results are performed at a predetermined sampling rate (steps S1001, S1003, and S1005). When the process of step S1003 is performed, as the input state determination condition for each key, a normal input state determination condition may be set, but for example, a series of processes shown in FIG. 30 are previously performed, and when the input state determination condition under which a key input is difficult to be detected is set as the input state determination condition, the input state determination process based on the input state determination condition under which a key input is difficult to be detected may be performed. It is determined whether there are a predetermined number of fingers or more that do not press a key, but in contact with a key, based on the input state that is set in step S1005 (step S1007). In step S1007, more specifically, for example, this determination may be performed based on the fact whether a delta value within a predetermined range (less than or equal to the threshold (ON) greater than zero) is detected in a predetermined number of nodes or more. This determination may be performed, for example, by the input state determination unit 114 shown in FIG. 7. The number of fingers as a criterion for the determination may be set as appropriate, for example, based on the property of the input device 1 (arrangement of nodes in a key or detection sensitivity of a delta value at each node) and the number of keys detected as being in contact with the finger when the hand is actually placed in the home position.

In step S1007, if it is not determined that there are a predetermined number of fingers or more that do not press a key, but in contact with a key, it can be considered to be a state in which the user's hand is not placed in a home position, and thus the input state determination condition is changed to a normal condition (step S1009). Then, the process returns to step S1001, the process of steps S1001 to S1007 is repeated based on the normal input state determination condition. In the process at step S1003 in the previous time, when the input state determination process is performed based on the normal input state determination condition (that is, when a normal condition is previously set as the input state determination condition), the process at step S1009 may be omitted. If the input state determination condition under which a key input is difficult to be detected is set as an input state determination condition, the process at step S1009 may be a process of changing the input state determination condition to a normal condition.

On the other hand, if it is determined that there are a predetermined number of fingers or more that do not press a key, but in contact with a key in step S1007, it can be considered to be a state in which the user's hand is placed in a home position. In this case, in step S1011, the input state determination condition is changed to a condition under which a key input is difficult to be detected.

In the state in which the input state determination condition is changed to a condition under which a key input is difficult to be detected, the input state determination process is performed based on the delta value detected at the subsequent sampling timing (steps S1013 and S1015). The input state of a key corresponding to the node based on the results of the input state determination process (step S1017). In the erroneous detection prevention process, the process in steps S1001 to S1017 described above is repeated. The input state determination process in steps S1003 and S1015 may be a simple delta value determination process or differential delta value determination process, or it may be the KEY ON detection process, the KEY OFF detection process, and/or the normalized delta value determination process according to the first to third embodiments. In this way, the erroneous detection prevention process according to the fourth embodiment may be combined with the input state detection process according the first to third embodiment in an appropriate way.

Even when the input state determination condition is changed to the condition under which a key input is difficult to be detected, an operation entered by the user's intention is more likely to be an operation having larger pressing force (that is, operation with a greater delta value) or an operation having higher pressing speed (that is, operation with a greater differential delta value), and thus the input state of a key may be determined to be the KEY ON state for an operation to be performed according to the user's intention. In this way, according to the erroneous detection prevention process, the "searching operation with higher speed" such as a case in which the finger slides from a home position is prevented, and an operation input intended by the user to input a key is allowed to be detected.

The processing steps of the erroneous detection prevention process corresponding to the "searching operation with higher speed" in the fourth embodiment have been described with reference to FIG. 30. As described above, according to the fourth embodiment, the input state determination process is performed by the input state determination condition under which a key input is difficult to be detected only when there are a predetermined number of fingers that do not press a key but in contact with a key. Thus, the action that the user's hand quickly slides from the home position is less likely to be detected erroneously as the operation of performing a key input, and thus an erroneous detection of a key input may be prevented. As a result, a more comfortable usability is achieved for the user.

In the above, as a situation in which the "searching operation with higher speed" can be performed, there has been described the example in which the user's hand quickly slides from the home position. The fourth embodiment is not limited to this example. As a situation in which the "searching operation with higher speed" can be performed, other situations may be assumed. As a process of determining such situations, in the above, the process of determining whether there are a predetermined number of fingers that do not press a key but in contact with a key, however this determination process may be changed as appropriate depending on a specific situation assumed as a situation in which the "searching operation with higher speed" can be performed.

The series of processing steps shown in FIG. 30 may be performed for purposes other than the prevention of erroneous detection described above. For example, the number of fingers as a criterion for the determination in the process performed in step S1007 may be set to "one". In this case, if a single finger is in contact with the input device 1, "heavy" keystroke feeling is given to the user. If a key is pressed while the hand is floating from the input device 1, "light" keystroke feeling is given to the user. In this way, the number of fingers as a criterion for the determination in the process performed in step S1007 may be adjusted as appropriate, and thus it is possible to adjust the keystroke feeling given to the user, thereby providing a keyboard having various aspects of usability.

8. Supplement

It should be understood by those skilled in the art that various modifications, combinations, sub-combinations and alterations may occur depending on design requirements and other factors insofar as they are within the scope of the appended claims or the equivalents thereof.

In addition, the effects described in the present specification are merely illustrative and demonstrative, and not limitative. In other words, the technology according to the present disclosure can exhibit other effects that are evident to those skilled in the art along with or instead of the effects based on the present specification.

Additionally, the present technology may also be configured as below.

(1) An Information Processing Device Including:
a capacitance variation detection unit configured to detect an operation input to each of a plurality of key regions as a capacitance variation amount of a capacitive element, the key region being provided on a sheet-like operation member, the capacitive element being provided in association with each of the key regions, the capacitance variation amount being dependent on a change in a distance between the key region and the capacitive element; and
an input state determination unit configured to determine whether an input state of the key region is an ON state based on the detected capacitance variation amount, the ON state being a state in which the operation input to the key region is decided to be valid,
wherein the input state determination unit determines an end of the ON state based on a differential value of the capacitance variation amount.

(2) The Information Processing Device According to (1),
wherein the input state determination unit determines the end of the ON state when the differential value of the capacitance variation amount is less than or equal to a first threshold or when the differential value is smaller than the first threshold, the first threshold having a sign indicating that a distance between the key region and the capacitive element becomes large.

(3) The Information Processing Device According to (1) or (2),
wherein the input state determination unit prevents the input state of the key region determined to be the end of the ON state from being determined to be the ON state again until the capacitance variation amount becomes less than or equal to a second threshold or until the capacitance variation amount becomes smaller than the second threshold after the end of the ON state is determined.

(4) The Information Processing Device According to (3),
wherein the input state determination unit determines that the input state of the key region is the ON state when the capacitance variation amount is more than or equal to a third threshold or when the capacitance variation amount is greater than the third threshold.

(5) The Information Processing Device According to (4),
wherein the second threshold is smaller than the third threshold.

(6) The Information Processing Device According to Any One of (1) to (3),
wherein the input state determination unit determines that an input state of the key region is the ON state when the differential value of the capacitance variation amount is more than or equal to a fourth threshold or when the differential value is greater than the fourth threshold regardless of a magnitude of the capacitance variation amount.

(7) An Information Processing Device Including:
a capacitance variation detection unit configured to detect an operation input to each of a plurality of key regions as a capacitance variation amount of a capacitive element, the key region being provided on a sheet-like operation member, the capacitive element being provided in association with each of the key regions, the capacitance variation amount being dependent on a change in a distance between the key region and the capacitive element; and
an input state determination unit configured to determine whether an input state of the key region is an ON state based on the detected capacitance variation amount, the ON state being a state in which the operation input to the key region is decided to be valid,
wherein the input state determination unit determines that the input state of the key region is the ON state when a differential value of the capacitance variation amount is more than or equal to a first threshold or when the differential value is greater than the first threshold regardless of a magnitude of the capacitance variation amount.

(8) The Information Processing Device According to (7),
wherein the input state determination unit determines that the input state of the key region is the ON state when the differential value of the capacitance variation amount is more than or equal to the first threshold or when the differential value is greater than the first threshold, or when the capacitance variation amount is more than or equal to a second threshold or when the capacitance variation amount is greater than the second threshold, and
wherein the first threshold and the second threshold are set in a manner that different types of operation input performed on the key region by a user are distinguishable from each other.

(9) The Information Processing Device According to (8),
wherein the first threshold is set depending on a rate of change in the distance between the key region and the capacitive element when a user presses the key region, and wherein the second threshold is set depending on an amount of change in the distance between the key region and the capacitive element when a user presses and holds the key region.

(10) The Information Processing Device According to Any One of (7) to (9), wherein the input state determination unit, when one of the key regions is provided with a plurality of the capacitive elements, compares the differential value of the capacitance variation amount of each of the capacitive elements with the first threshold, and determines that the input state of the key region is the ON state when any one of the differential values of the capacitance variation amount is more than or equal to the first threshold or when any one of the differential values is greater than the first threshold.

(11) An Information Processing Device Including:

a capacitance variation detection unit configured to detect an operation input to each of a plurality of key regions as a capacitance variation amount of a capacitive element, the key region being provided on a sheet-like operation member, the capacitive element being provided in association with each of the key regions, the capacitance variation amount being dependent on a change in a distance between the key region and the capacitive element; and an input state determination unit configured to determine whether an input state of the key region is an ON state based on the detected capacitance variation amount, the ON state being a state in which the operation input to the key region is decided to be valid, wherein the input state determination unit determines the input state of the key region provided with a plurality of the capacitive elements by comparing a normalized capacitance variation amount obtained by normalizing the capacitance variation amount of each of the plurality of capacitive elements provided in the key region with a first threshold.

(12) The Information Processing Device According to (11), wherein the input state determination unit determines the input state of the key region provided with the plurality of capacitive elements by comparing a sum or an average value of the normalized capacitance variation amounts of the plurality of capacitive elements with a second threshold.

(13) An Information Processing Device Including:

a capacitance variation detection unit configured to detect an operation input to each of a plurality of key regions as a capacitance variation amount of a capacitive element, the key region being provided on a sheet-like operation member, the capacitive element being provided in association with each of the key regions, the capacitance variation amount being dependent on a change in a distance between the key region and the capacitive element; and an input state determination unit configured to determine whether an input state of the key region is an ON state based on the detected capacitance variation amount, the ON state being a state in which the operation input to the key region is decided to be valid, wherein the input state determination unit changes a condition for determining the input state depending on the operation input to the key region.

(14) The Information Processing Device According to (13), wherein the input state determination unit changes the condition for determining the input state to a condition under which the ON state is more difficult to be determined when operation inputs to all of the key regions provided on the operation member are not performed for a predetermined period of time.

(15) The Information Processing Device According to (14), wherein the input state determination unit changes again the condition for determining the input state to a condition under which the ON state is easier to be determined when the input state of any one of the key regions is decided to be the ON state after the condition for determining the input state is changed to the condition under which the ON state is more difficult to be determined.

(16) The Information Processing Device According to (14), wherein the input state determination unit changes the condition for determining the input state to a condition under which the ON state is more difficult to be determined when an operation input in which the input state of the key region is not the ON state is performed in a predetermined number of the key regions or more on the operation member.

(17) The Information Processing Device According to Any One of (14) to (16), wherein the input state determination unit determines that the input state of the key region is the ON state when the capacitance variation amount is more than or equal to a first threshold or when the capacitance variation amount is greater than the first threshold, and wherein the input state determination unit changes the first threshold to a larger value when operation inputs to all of the key regions provided on the operation member are not performed for a predetermined period of time or when an operation input in which the input state of the key region is not the ON state is performed in a predetermined number of the key regions or more provided on the operation member.

(18) An Input Device Including:

a sheet-like operation member that includes a plurality of key regions and is deformable depending on an operation input to the key region;

an electrode board that includes at least one capacitive element at a position corresponding to each of the key regions and is capable of detecting an amount of change in a distance between the key region and the capacitive element as a capacitance variance amount of the capacitive element, the amount of change being dependent on the operation input; and a controller configured to determine whether an input state of the key region is an ON state based on the detected capacitance variation amount, the ON state being a state in which the operation input to the key region is decided to be valid, wherein the controller determines an end of the ON state based on a differential value of the capacitance variation amount.

(19) An Information Processing Method Including:

detecting, by a processor, an operation input to each of a plurality of key regions as a capacitance variation amount of a capacitive element, the key region being provided on a sheet-like operation member, the capacitive element being provided in association with each of the key regions, the capacitance variation amount being dependent on a change in a distance between the key region and the capacitive element; and determining, by a processor, whether an input state of the key region is an ON state based on the detected capacitance variation amount, the ON state being a state in which the operation input to the key region is decided to be valid, wherein an end of the ON state is determined based on a differential value of the capacitance variation amount.

(20) A Program for Causing a Processor of a Computer to Execute the Functions of:

detecting an operation input to each of a plurality of key regions as a capacitance variation amount of a capacitive element, the key region being provided on a sheet-like operation member, the capacitive element being provided in association with each of the key regions, the capacitance variation amount being dependent on a change in a distance between the key region and the capacitive element; and determining whether an input state of the key region is an ON state based on the detected capacitance variation amount, the ON state being a state in which the operation input to the key region is decided to be valid, wherein an end of the ON state is determined based on a differential value of the capacitance variation amount.

What is claimed is:

1. An information processing device comprising: a capacitance variation detection unit configured to detect an operation input to each of a plurality of key regions as a capacitance variation amount of a capacitive element, the key region being provided on a sheet-like operation member, the capacitive element being provided in association with each of the key regions, the capacitance variation amount being dependent on a change in a distance between the key region and the capacitive element; and an input state determination unit configured to:
determine whether an input state of the key region is an ON state based on the detected capacitance variation amount, the ON state being a state in which the operation input to the key region is decided to be valid,
determine an end of the ON state based on a differential delta value of the capacitance variation amount;
prevent the input state of the key region determined to be the end of the ON state from being determined to be the ON state again until the capacitance variation amount becomes less than or equal to a first threshold after the end of the ON state is determined;
wherein the input state of the key region is determined to be the ON state when the capacitance variation amount is more than or equal to a second threshold, wherein the first threshold is smaller than the second threshold;
wherein the end of the ON state is determined at a time when a magnitude of the differential delta value of the capacitance variation amount is more than or equal to a magnitude of a first differential threshold; and
wherein the first differential threshold has a sign indicating that a distance between the key region and the capacitive element becomes large.

2. The information processing device according to claim 1, wherein the input state determination unit further determines that an input state of the key region is the ON state when the differential delta value of the capacitance variation amount is more than or equal to a second differential threshold regardless of a magnitude of the capacitance variation amount.

3. An information processing device comprising: a capacitance variation detection unit configured to detect an operation input to each of a plurality of key regions as a capacitance variation amount of a capacitive element, the key region being provided on a sheet-like operation member, the capacitive element being provided in association with each of the key regions, the capacitance variation amount being dependent on a change in a distance between the key region and the capacitive element; and an input state determination unit configured to:
determine whether an input state of the key region is an ON state based on the detected capacitance variation amount, the ON state being a state in which the operation input to the key region is decided to be valid;
wherein the input state of the key region is the ON state when a differential delta value of the capacitance variation amount is more than or equal to a first differential threshold regardless of a magnitude of the capacitance variation amount, or when the capacitance variation amount is more than or equal to a first threshold,
wherein the first differential threshold and the first threshold are set in a manner that different types of operation input performed on the key region by a user are distinguishable from each other,
wherein the first differential threshold is set depending on a rate of change in the distance between the key region and the capacitive element when a user presses the key region, and
wherein the first threshold is set depending on an amount of change in the distance between the key region and the capacitive element when a user presses and holds the key region;
determine a time at which a magnitude of the differential delta value of the capacitance variation amount is more than or equal to a magnitude of a second differential threshold; and
determine that the time at which the magnitude of the differential delta value of the capacitance variation amount is more than or equal to the magnitude of the second differential threshold corresponds to a time at which the ON state has ended,
prevent the input state of the key region determined to be the end of the ON state from being determined to be the ON state again until the capacitance variation amount becomes less than or equal to the first threshold after the end of the ON state is determined
wherein the second differential threshold has a sign indicating that a distance between the key region and the capacitive element becomes large.

4. The information processing device according to claim 3, wherein the input state determination unit, when one of the key regions is provided with a plurality of the capacitive elements, compares the differential delta value of the capacitance variation amount of each of the capacitive elements with the first differential threshold, and determines that the input state of the key region is the ON state when any one of the differential delta values of the capacitance variation amount is more than or equal to the first differential threshold.

5. A non-transitory computer readable storage medium having computer readable instructions stored thereon that, when executed, cause a processor of a computer to execute the functions of:
detecting an operation input to each of a plurality of key regions as a capacitance variation amount of a capacitive element, the key region being provided on a sheet-like operation member, the capacitive element being provided in association with each of the key regions, the capacitance variation amount being dependent on a change in a distance between the key region and the capacitive element;
determining whether an input state of the key region is an ON state based on the detected capacitance variation amount, the ON state being a state in which the operation input to the key region is decided to be valid;
determining an end of the ON state based on a differential delta value of the capacitance variation amount;
preventing the input state of the key region determined to be the end of the ON state from being determined to be the ON state again until the capacitance variation amount becomes less than or equal to a first threshold after the end of the ON state is determined;

wherein the input state of the key region is determined to be the ON state when the capacitance variation amount is more than or equal to a second threshold; wherein the first threshold is smaller than the second threshold;

wherein the end of the ON state is determined at a time when a magnitude of the differential delta value of the capacitance variation amount is more than or equal to a magnitude of a first differential threshold; and wherein the first differential threshold has a sign indicating that a distance between the key region and the capacitive element becomes large.

* * * * *